United States Patent
Li et al.

(10) Patent No.: US 12,170,868 B2
(45) Date of Patent: Dec. 17, 2024

(54) WIRELESS HEADSET

(71) Applicant: Huawei Technologies Co., Ltd., Shenzhen (CN)

(72) Inventors: Deliang Li, Shanghai (CN); Shaojian Chen, Shenzhen (CN); Xueping Guo, Shenzhen (CN); Dongyi Zhu, Dongguan (CN); Fuqiang Ma, Dongguan (CN); Hongbing Shi, Xi'an (CN); Runqing Ye, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 213 days.

(21) Appl. No.: 17/773,710

(22) PCT Filed: Oct. 14, 2020

(86) PCT No.: PCT/CN2020/120754
§ 371 (c)(1),
(2) Date: May 2, 2022

(87) PCT Pub. No.: WO2021/082910
PCT Pub. Date: May 6, 2021

(65) Prior Publication Data
US 2022/0386015 A1     Dec. 1, 2022

(30) Foreign Application Priority Data
Oct. 31, 2019   (CN) .......................... 201911056406.0

(51) Int. Cl.
*H04R 1/10*       (2006.01)

(52) U.S. Cl.
CPC ......... *H04R 1/1075* (2013.01); *H04R 1/1016* (2013.01); *H04R 2420/07* (2013.01)

(58) Field of Classification Search
None
See application file for complete search history.

(56) References Cited

U.S. PATENT DOCUMENTS

| 2015/0071470 A1 | 3/2015 | Link et al. |
| 2016/0035711 A1 | 2/2016 | Hu |
| 2017/0093079 A1 | 3/2017 | Wagman et al. |

(Continued)

FOREIGN PATENT DOCUMENTS

| CN | 107185259 A | 9/2017 |
| CN | 208675488 U | 3/2019 |

(Continued)

*Primary Examiner* — Paul W Huber
(74) *Attorney, Agent, or Firm* — Conley Rose, P.C.

(57) ABSTRACT

The wireless headset includes a main control module. The main control module includes a rigid-flexible circuit board, a first substrate, a first support member, and a plurality of chips. The rigid-flexible circuit board includes a rigid board portion and a first flexible board portion and a second flexible board portion that are connected to the rigid board portion. The rigid board portion is located in the earbud portion. The first flexible board portion is located in the earbud portion and has one end connected to the rigid board portion. One end of the second flexible board portion is connected to the rigid board portion and the other end thereof extends to the ear handle portion. A plurality of layers of components are stacked on the rigid board portion of the wireless headset, so that component integration degree is high.

20 Claims, 19 Drawing Sheets

(56) References Cited

U.S. PATENT DOCUMENTS

| | | |
|---|---|---|
| 2017/0148724 A1 | 5/2017 | Yu et al. |
| 2019/0042530 A1 | 2/2019 | Wang et al. |
| 2019/0289383 A1 | 9/2019 | Chawan et al. |
| 2020/0275553 A1 | 8/2020 | Wang et al. |
| 2022/0210535 A1 | 6/2022 | Liu et al. |
| 2022/0386015 A1 | 12/2022 | Li et al. |

FOREIGN PATENT DOCUMENTS

| | | |
|---|---|---|
| CN | 110166866 A | 8/2019 |
| CN | 110213688 A | 9/2019 |
| CN | 209419799 U | 9/2019 |
| CN | 110798768 A | 2/2020 |
| JP | 2006310544 A | 11/2006 |
| JP | 2008135781 A | 6/2008 |
| JP | 2017099259 A | 6/2017 |
| KR | 20180093371 A | 8/2018 |
| WO | 2017156260 A1 | 9/2017 |
| WO | 2018161450 A1 | 9/2018 |

# WIRELESS HEADSET

CROSS-REFERENCE TO RELATED APPLICATIONS

This is a U.S. National Stage of International Patent Application No. PCT/CN2020/120754 filed on Oct. 14, 2020, which claims priority to Chinese Patent Application No. 201911056406.0 filed on Oct. 31, 2019. Both of the aforementioned applications are hereby incorporated by reference in their entireties.

TECHNICAL FIELD

Embodiments of this application relate to the field of electronic product technologies, and in particular, to a wireless headset.

BACKGROUND

With advancement of science and technology, a quantity of chips integrated inside a wireless headset is increasing continuously to implement multi-function and intelligence. Limited by a shape of the wireless headset, a rigid circuit board with a relatively large board area cannot be arranged in a space inside the wireless headset. Therefore, a conventional wireless headset is usually provided with a rigid primary circuit board and a plurality of secondary circuit boards. According to board sizes of the circuit boards, a plurality of components in the wireless headset that form a control system are split and arranged on different circuit boards, and then the different circuit boards are connected by using a flexible circuit board to implement connection between the different components. This causes a low component integration degree of the wireless headset.

SUMMARY

An objective of embodiments of this application is to provide a wireless headset with a relatively high component integration degree.

According to a first aspect, an embodiment of this application provides a wireless headset. The wireless headset may be wirelessly connected (for example, Bluetooth-connected) to an electronic device such as a mobile phone, a notebook computer, a tablet, or a smartwatch, so that the wireless headset is used in cooperation with the electronic device. The wireless headset is configured to process audio services of the electronic device, such as media and call services, or process some other data services.

The wireless headset has an ear handle portion and an earbud portion connected to the ear handle portion. The wireless headset includes a main control module. The main control module includes a rigid-flexible circuit board, a first substrate, a first support member, and a plurality of chips. The rigid-flexible circuit board includes a rigid board portion and a first flexible board portion and a second flexible board portion that are connected to the rigid board portion. The rigid board portion is located in the earbud portion, the first flexible board portion is located in the earbud portion and has one end connected to the rigid board portion, and one end of the second flexible board portion is connected to the rigid board portion and the other end thereof extends to the ear handle portion. For example, the wireless headset includes a plurality of functional modules. The first flexible board portion is configured to connect to some functional modules located in the earbud portion. The second flexible board portion is configured to connect to sonic functional modules located in the earbud portion and a functional module located in the ear handle portion.

The first substrate and the rigid board portion are stacked at a space from each other. For example, a projection of the first substrate on the rigid board portion falls within a range of the rigid board portion. The first support member is located between the first substrate and the rigid board portion, and abuts against each of the first substrate and the rigid board portion. At least one of the plurality of chips is fastened to the rigid board portion. At least one of the plurality of chips is fastened to the first substrate. The chip fastened to the first substrate is electrically connected to the rigid board portion by using the first support member. Parts of the main control module that are fastened to, above, and below the rigid board portion form a stack assembly. That is, the main control module includes the rigid-flexible circuit board and the stack assembly. The stack assembly is fastened to the rigid board portion, and the stack assembly includes the first substrate, the first support member, and the plurality of chips.

In this embodiment, the main control module includes the first substrate and the rigid board portion that are stacked. At least one chip is fastened to the first substrate and at least one chip is fastened to the rigid board portion. Therefore, the stack assembly of the main control module can form a stack structure with a plurality of layers of components. All or most of the chips of the wireless headset may be integrated in the stack assembly, and the components in the stack assembly can be connected to the plurality of functional modules of the wireless headset by using the plurality of flexible board portions of the rigid-flexible circuit board, so that a control system of the wireless headset is fully integrated in the stack assembly. In this way, a plurality of secondary circuit boards responsible for bearing control system components in a conventional wireless headset can be omitted, thereby increasing a component integration degree of the main control module and the headset body.

In addition, the stack assembly in which the plurality of layers of components are stacked has a relatively large thickness in a direction perpendicular to the rigid board portion. Because the stack assembly is fastened to the rigid board portion, and the rigid board portion is located in the earbud portion, the stack assembly is located in the earbud portion. Therefore, mounting difficulty of the stack assembly is relatively small, and the stack assembly can fully utilize an inner cavity space of the earbud portion, thereby improving space utilization of the wireless headset. In some embodiments, shapes of outer contours of the rigid board portion and the stack assembly may be adapted to a shape of the inner cavity space of the earbud portion. For example, a circular or approximately circular outer contour is used, to further improve the space utilization of wireless headset.

In this embodiment, because the chip fastened to the first substrate can be electrically connected to the rigid board portion by using the first support member, a flexible circuit board for transmitting signals does not need to be disposed between the first substrate and the rigid board portion. A signal transmission path between the chip on the first substrate and the rigid board portion is implemented by the first support member, and the signal transmission path is short. This makes signal transmission quality better. For example, a risk of distorting audio signals in transmission is relatively small. In addition, the main control module in this embodiment is not provided with a flexible circuit board connected between the first substrate and the rigid board portion. This can prevent a problem of a product failure or a low yield that is caused by the following case: the flexible circuit board is bent and a bending angle is relatively large, and a fracture and an open circuit are caused in a bending region.

In an optional embodiment, the main control module further includes a plurality of chip-matching components. At least one of the plurality of chip-matching components is fastened to the first substrate, and at least one of the plurality of chip-matching components is fastened to the rigid board portion. The chip-matching component fastened to the first substrate is electrically connected to the rigid board portion by using the first support member. Arrangement locations of the plurality of chip-matching components may be arranged along with the corresponding chips.

In an optional embodiment, the first support member includes a plurality of first elevating pillars, and the plurality of first elevating pillars are located between the rigid board portion and the first substrate and are fastened to the rigid board portion. The main control module further includes a first package layer. The first package layer is located between the rigid board portion and the first substrate. The first package layer packages the plurality of first elevating pillars and at least one chip on the rigid board portion. In this case, an end face of one end that is of each of the plurality of first elevating pillars and that is away from the rigid board portion protrudes relative to the first package layer. The first substrate may be connected to the end faces of the first elevating pillars. The first package layer further packages the plurality of chip-matching components on the rigid board portion. The first package layer can protect components packaged by the first package layer, so that the main control module has relatively high reliability and a relatively long service life.

In this embodiment, the first package layer directly packages a plurality of components on the rigid board portion. In this way, the plurality of components can be directly connected to the functional modules of the wireless headset by using the rigid board portion and the first flexible board portion or the second flexible board portion. Compared with a manner in which in a conventional package layer, components need to be first packaged on a substrate and then the substrate is welded to a circuit board before being connected to an external module, the connection manner in this embodiment is more direct and has a simpler structure.

In an optional embodiment, the rigid board portion includes a first surface facing the first substrate. The first surface includes a first package region and a first non-package region, the first package layer is located in the first package region, and the first non-package region is located around the first package region. In other words, there is a specific spacing between an edge of the first package region and an edge of the rigid board portion. In this embodiment, the first non-package region can provide a support space for a mold in a molding operation of the first package layer, to avoid damage of the rigid-flexible circuit board caused by the mold by abutting against the first flexible board portion or the second flexible board portion, thereby ensuring a production yield of the main control module.

In an optional embodiment, the main control module further includes at least one first component, and the at least one first component is fastened to the first non-package region. For example, the first component is a component not suitable for plastic package, and includes but is not limited to a surface acoustic wave filter with a cavity, a crystal oscillator with a cavity, a pressure-sensitive component, and the like.

In this embodiment, the first non-package region of the rigid board portion not only provides an abutting space for the mold in a molding process of the first package layer, but also is configured to arrange the first component not suitable for package, so that the main control module reuses a space of the first non-package region, thereby improving space utilization.

In an optional embodiment, the first substrate is welded to the plurality of first elevating pillars. The main control module further includes a second package layer. The second package layer is located on a side that is of the first substrate and that is away from the rigid board portion. The second package layer packages at least one chip on the first substrate. The second package layer may further package at least one chip-matching component on the first substrate. The second package layer can protect components packaged by the second package layer, so that the main control module has relatively high reliability and a relatively long service life.

In an optional embodiment, the first support member further includes a plurality of second elevating pillars, the plurality of second elevating pillars are fastened to a side that is of the first substrate and that faces the rigid board portion, and the plurality of second elevating pillars are welded to the plurality of first elevating pillars in one-to-one correspondences. The main control module further includes a second package layer and a third package layer, the second package layer is located on a side that is of the first substrate and that is away from the rigid board portion, the second package layer packages at least one chip on the first substrate, the third package layer is located on the side that is of the first substrate and that faces the rigid board portion, and the third package layer packages the plurality of second elevating pillars and at least one chip on the first substrate.

In this embodiment, because the first support member includes the first elevating pillars and the second elevating pillars, and the first elevating pillars and the second elevating pillars are stacked, the first support member has a sufficient height, so that a spacing between the first substrate and the rigid board portion is relatively large. Two layers of components can be arranged between the first substrate and the rigid board portion. In this way, the main control module integrates three layers of components in a direction perpendicular to the rigid board portion, and the main control module and the wireless headset have a higher component arrangement density and a higher component integration degree. In addition, arrangement solutions of the plurality of chips and the three layers of components of the main control module are also more flexible and diversified.

In an optional embodiment, the main control module further includes at least one second component. The at least one second component is fastened to a side that is of the first substrate and that is away from the rigid board portion, and is located on an outer side of the second package layer. The second component is a component not suitable for plastic package, and includes but is not limited to a surface acoustic wave filter with a cavity, a crystal oscillator with a cavity, a pressure-sensitive component, and the like.

In this embodiment, components in the main control module at are not suitable for plastic package may be flexibly arranged on the rigid board portion and/or the first substrate based on function selections and arrangement locations of the chips, thereby improving flexibility and diversity of arrangement of the components in the main control module.

In an optional embodiment, the main control module further includes a second substrate, a second package layer, a third package layer, and a plurality of third elevating pillars. The first substrate is welded to the plurality of first elevating pillars. The chip fastened to the first substrate is located on a side that is of the first substrate and that is away from the rigid board portion. The second substrate is located on the side that is of the first substrate and that is away from the rigid hoard portion. The second substrate and the first substrate are stacked at a space from each other. The plurality of third elevating pillars are located between the second substrate and the first substrate, and abut against each of the second substrate and the first substrate. The second package layer is located between the second substrate and the first substrate. The plurality of third elevating pillars and the chip fastened to the first substrate are packaged in the second package layer. At least one of the plurality of chips is packaged in the second package layer and is fastened to the second substrate. The third package layer is located on a side that is of the second substrate and that is away from the first substrate. At least one of the plurality of chips is packaged in the third package layer, and is fastened to the second substrate. The chip fastened to the second substrate is electrically connected to the rigid board portion by using the plurality of third elevating pillars, the first substrate, and the plurality of first elevating pillars.

In this embodiment, the main control module has components arranged on all of a side that is ofthe rigid board portion and that faces the first substrate, the side that is of the first substrate and that is away from the rigid board portion, a side that is of the second substrate and that faces the first substrate, and the side that is of the second substrate and that is away from the first substrate. In this way, four layers of components are stacked in a direction perpendicular to the rigid board portion, thereby increasing a component arrangement density and a component integration degree.

In an optional embodiment, the first package layer is in contact with the first substrate. The main control module further includes a second package layer. The second package layer is fastened to a side that is of the first substrate and that is away from the rigid board portion. Some of the chips fastened to the first substrate are packaged in the first package layer, and some are packaged in the second package layer. In this embodiment, the main control module has components arranged on all of a side that is of the rigid board portion and that faces the first substrate, the side that is of the first substrate and that faces the rigid board portion, and the side that is of the first substrate and that is away from the rigid board portion. In this way, three layers of components are stacked in a direction perpendicular to the rigid board portion. Therefore, the main control module and the wireless headset have a relatively high component arrangement density and a relatively high component integration degree.

In an optional embodiment, the main control module further includes a fourth package layer. The fourth package layer is fastened to a side that is of the rigid board portion and that is away from the first substrate. At least one of the chip fastened to the rigid board portion is packaged in the fourth package layer.

In this embodiment, the main control module has components arranged on all of the side that is of the rigid board portion and that is away from the first substrate, the side that is of the rigid board portion and that faces the first substrate, and the side that is of the first substrate and that is away from the rigid hoard portion. In this way, three layers of components are stacked in a direction perpendicular to the rigid board portion. Therefore, the main control module and the wireless headset have a relatively high component arrangement density and a relatively high component integration degree.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The main control module further includes a first package layer, a second package layer, a third package layer, and a fourth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on a side that is of the rigid board portion and that is away from the first substrate. The fourth package layer packages at least one chip on the rigid board portion.

In this embodiment, the main control module has components arranged on all of both sides of the rigid board portion and both sides of the first substrate. In this way, four layers of components are stacked in a direction perpendicular to the rigid board portion. Therefore, the main control module and the wireless headset have a relatively high component arrangement density and a relatively high component integration degree.

In an optional embodiment, the main control module further includes a third substrate and a second support member. The third substrate is located on a side that is of the rigid board portion and that is away from the first substrate. The third substrate and the rigid board portion are stacked at a space from each other. The second support member is located between the third substrate and the rigid board portion, and abuts against each of the third substrate and the rigid board portion. At least one of the plurality of chips is fastened to the third substrate. The chip fastened to the third substrate is electrically connected to the rigid board portion by using the second support member. In this embodiment, one or more layers of components can be stacked on both sides of the rigid board portion, thereby further increasing a component integration degree of the main control module and the wireless headset.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The second support member includes a plurality of fourth elevating pillars, and the plurality of fourth elevating pillars are fastened to the rigid board portion. The third substrate is welded to the plurality of fourth elevating pillars, and the chip fastened to the third substrate is located on a side that is of the third substrate and that is away from the rigid board portion.

The main control module further includes a first package layer, a second package layer, a third package layer, a fourth package layer, and a fifth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on the side that is of the rigid board portion and that is away from the first substrate. The fourth package layer packages the plurality of fourth elevating pillars and at least one chip on the rigid board portion. The fifth package layer is located on the side that is of the third substrate and that is away from the rigid board portion. The fifth package layer packages at least one chip on the third substrate.

In this embodiment, the main control module has components arranged on all of both sides of the rigid board portion, both sides of the first substrate, and the side that is of the third substrate and that is away from the rigid board portion. In this way, five layers of components are stacked in a direction perpendicular to the rigid board portion. Therefore, the main control module and the wireless headset have a relatively high component arrangement density and a relatively high component integration degree.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The second support member includes a plurality of fourth elevating pillars and a plurality of fifth elevating pillars. The fourth elevating pillars and the fifth elevating pillars are stacked. The plurality of fourth elevating pillars are fastened to the rigid board portion. The plurality of fifth elevating pillars are fastened to the third substrate. The plurality of fifth elevating pillars are welded to the plurality of fourth elevating pillars in one-to-one correspondences.

The main control module further includes a first package layer, a second package layer, a third package layer, a fourth package layer, a fifth package layer, and a sixth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on the side that is of the rigid board portion and that is away from the first substrate. The fourth package layer packages the plurality of fourth elevating pillars and at least one chip on the rigid board portion. The fifth package layer is located on a side that is of the third substrate and that faces the rigid board portion. The fifth package layer packages the plurality of fifth elevating pillars and at least one chip on the third substrate. The sixth package layer is located on the side that is of the third substrate and that is away from the rigid board portion. The sixth package layer packages at least one chip on the third substrate.

In this embodiment, the main control module has components arranged on all of both sides of the rigid board portion, both sides of the first substrate, and both sides of the third substrate. In this way, six layers of components are stacked in a direction perpendicular to the rigid board portion. Therefore, the main control module and the wireless headset have a relatively high component arrangement density and a relatively high component integration degree.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The second support member includes a plurality of fourth elevating pillars that are stacked, and the plurality of fourth elevating pillars are fastened to the rigid board portion. The third substrate is welded to the plurality of fourth elevating pillars.

The main control module further includes a fourth substrate and a plurality of sixth elevating pillars. The fourth substrate is located on a side that is of the third substrate and that is away from the rigid board portion. The fourth substrate and the third substrate are stacked at a space from each other. The plurality of sixth elevating pillars are located between the fourth substrate and the third substrate, and support the fourth substrate and the third substrate. At least one of the plurality of chips is fastened to the fourth substrate. The chip fastened to the fourth substrate is electrically connected to the rigid board portion by using the sixth elevating pillars, the third substrate, and the second support member.

The main control module further includes a first package layer, a second package layer, a third package layer, a fourth package layer, a fifth package layer, and a sixth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on the side that is of the rigid board portion and that is away from the first substrate. The fourth package layer packages the plurality of fourth elevating pillars and at least one chip on the rigid board portion. The fifth package layer is located between the third substrate and the fourth substrate. The fifth package layer packages the plurality of sixth elevating pillars and at least one chip on the third substrate, and packages at least one chip on the fourth substrate. The sixth package layer is located on a side that is of the fourth substrate and that is away from the third substrate. The sixth package layer packages at least one chip on the fourth substrate.

In this embodiment, the main control module has components arranged on all of both sides of the rigid board portion, both sides of the first substrate, the side that is of the third substrate and that is away from the rigid board portion, and both sides of the fourth substrate. In this way, seven layers of components are stacked in a direction perpendicular to the rigid board portion. Therefore, the main control module and the wireless headset have a relatively high component arrangement density and a relatively high component integration degree.

In an optional embodiment, the first support member includes a plurality of first elevating pillars, and the second support member includes a plurality of fourth elevating pillars. The main control module further includes a first package layer, a second package layer, a fourth package layer, and a fifth package layer. The first package layer is located between the rigid board portion and the first substrate. The first package layer packages the plurality of first elevating pillars and at least one chip on the rigid board portion, and packages at least one chip on the first substrate. In this case, the first package layer packages components located between the rigid board portion and the first substrate. The fourth package layer is located between the rigid board portion and the third substrate. The fourth package layer packages the plurality of fourth elevating pillars and at least one chip on the rigid board portion, and packages at least one chip on the third substrate. The fifth package layer is fastened to a side that is of the third substrate and that is away from the rigid board portion. The fifth package layer packages at least one chip on the third substrate.

In this embodiment, the main control module has components arranged on all of both sides of the rigid board portion, both sides of the first substrate, and both sides of the third substrate. In this way, six layers of components are stacked in a direction perpendicular to the rigid board portion. Therefore, the main control module and the wireless headset have a relatively high component arrangement density and a relatively high component integration degree.

In an optional embodiment, the first support member is a first elevating plate, the first elevating plate is a hollow structure, and at least one chip is located on an inner side of the first elevating plate. The first elevating plate is a circuit board structure, and the first elevating plate may be fastened to the rigid board portion by assembly, or may be integrally molded with the rigid board portion. In this embodiment, the main control module supports a component arrangement space between the first substrate and the rigid board portion by using the first elevating plate, so that the main control module can integrate at least two layers of components. In this way, a component arrangement density is increased, and the main control module and the wireless headset have a relatively high component integration degree.

In some embodiments, components fastened to the rigid board portion are all located on a side that is of the rigid board portion and that faces the first substrate. Some of the components are located on an inner side of the first elevating plate, and some of the components are located on an outer side of the first elevating plate. In some other embodiments, some of components fastened to the rigid board portion are located on a side that is of the rigid board portion and that faces the first substrate, and some are located on a side that is of the rigid board portion and that is away from the first substrate.

The main control module further includes a plurality of chip-matching components. At least one of the plurality of chip-matching components is fastened to the rigid board portion, and at least one of the plurality of chip-matching components is fastened to the first substrate.

In an optional embodiment, at least one of the plurality of chips is fastened to the side that is of the rigid board portion and that is away from the first substrate, at least one of the plurality of chips is fastened to a side that is of the rigid board portion and that faces the first substrate, at least one of the plurality of chips is fastened to a side that is of the first substrate and that faces the rigid board portion, and at least one of the plurality of chips is fastened to a side that is of the first substrate and that is away from the rigid board portion. That is, components are arranged on both sides of the rigid board portion and both sides of the first substrate. Therefore, the main control module integrates four layers of components. A component arrangement density is high, and the main control module and the wireless headset have a high component integration degree.

The main control module further includes a first package layer. The first package layer is located on the side that is of the first substrate and that is away from the rigid board portion, and packages at least one chip. The first package layer may further package at least one chip-matching component. The first package layer may perform full-size package or partial package on components fastened to the side that is of the first substrate and that is away from the rigid board portion.

In an optional embodiment, the main control module further includes a second substrate and a plurality of third elevating pillars. The second substrate is located on a side that is of the first substrate and that is away from the rigid board portion. The second substrate and the first substrate are stacked at a space from each other. The plurality of third elevating pillars are located between the second substrate and the first substrate, and abut against each of the second substrate and the first substrate. At least one of the plurality of chips is fastened to the second substrate. The chip fastened to the second substrate is electrically connected to the rigid board portion by using the plurality of third elevating pillars, the first substrate, and the first support member.

The main control module further includes a first package layer and a second package layer. The first package layer is located between the first substrate and the second substrate, and is configured to package components between the first substrate and the second substrate. The second package layer is located on a side that is of the second substrate and that is away from the first substrate. The second package layer may perform partial package or full-size package on components fastened to the side that is of the second substrate and that is away from the first substrate.

In this embodiment, components are arranged on all of both sides of the rigid board portion, both sides of the first substrate, and both sides of the second substrate. The main control module integrates six layers of components. A component arrangement density is high, and the main control module and the wireless headset have a high component integration degree. In another embodiment, components may be arranged on a single side of one or more of the rigid board portion, the first substrate, or the second substrate.

In an optional embodiment, the main control module further includes a second substrate and a second elevating plate. The second substrate is located on a side that is of the rigid board portion and that is away from the first substrate, and the second substrate and the rigid hoard portion are stacked at a space from each other. The second elevating plate is located between the second substrate and the rigid board portion, and abuts against each of the second substrate and the rigid board portion. At least one of the plurality of chips is fastened to the second substrate. The chip fastened to the second substrate is electrically connected to the rigid board portion by using the second elevating plate. The second elevating plate is a hollow structure, and at least one chip is located on an inner side of the second elevating plate.

In this embodiment, the main control module has the first substrate fastened to one side of the rigid board portion by using the first elevating plate, and has the second substrate fastened to the other side of the rigid board portion by using the second elevating plate. In this way, a stack structure with three layers of circuit boards is formed, and components may be flexibly arranged on one side or both sides of each of the three layers of circuit boards to form a stack structure with at least three layers of components. Therefore, the main control module and the wireless headset have a high component arrangement density and a high component integration degree.

In an optional embodiment, the main control module further includes a first package layer. The first package layer is located on a side that is of the second substrate and that is away from the rigid board portion. The first package layer may perform partial package or full-size package on components fastened to the side that is of the second substrate and that is away from the rigid board portion. The first package layer can protect components packaged by the first package layer, and can also provide a support surface or a fastening surface when other parts in the main control module and the wireless headset are assembled, so as to protect components in the main control module.

In an optional embodiment, the earbud portion is provided with a receiver module, and, the first flexible board portion is connected to the receiver module. The ear handle portion is provided with a battery, and the second flexible board portion is connected to the battery. The plurality of chips include a micro control unit chip, a power management chip, and an audio chip. The power management chip and the audio chip both are electrically connected to the micro control unit chip. The micro control unit chip is a processing and control center of the wireless headset and the main control module.

The receiver module is electrically connected to the audio chip by using the first flexible board portion and the rigid board portion. The audio chip is configured to encode audio data to form an electrical signal. The receiver module is configured to convert the electrical signal into a sound signal. The battery is electrically connected to the power management chip by using the second flexible board portion and the rigid board portion. The battery is configured to supply power to the wireless headset. The power management chip is configured to manage electric power input and electric power output of the battery.

In an optional embodiment, the plurality of functional modules of the wireless headset further include a positive electrode charging terminal and a negative electrode charging terminal. The positive electrode charging terminal is located in the earbud portion. The rigid-flexible circuit board of the main control module further includes a third flexible board portion connected to the rigid board portion, and the third flexible board portion is located in the earbud portion. The positive electrode charging terminal is connected to the third flexible board portion, and is connected to the power management chip by using the third flexible board portion and the rigid board portion. The negative electrode charging terminal is located in a bottom section of the ear handle portion. The negative electrode charging terminal is connected to the second flexible board portion, and is connected to the power management chip by using the second flexible board portion and the rigid board portion.

In an optional embodiment, the plurality of functional modules of the wireless headset further include an optical sensor module. The optical sensor module may be used as a proximity detection module, and is configured to detect whether the wireless headset is mounted to a user's ear. The optical sensor module is located in the earbud portion, for example, may be located in a location that is of the earbud portion and that is away from the ear handle portion. The optical sensor module may transmit a detection signal and receive a feedback signal through a detection hole of a side housing, to implement detection. The optical sensor module is connected to the first flexible board portion, and is electrically connected to the plurality of chips in the stack assembly by using the first flexible board portion and the rigid board portion.

In an optional embodiment, the plurality of functional modules of the wireless headset further include a bone vibration sensor module. The bone vibration sensor module is configured to implement functions such as voiceprint recognition, a speech interpretation and recognition interface, and startup of the wireless headset by two taps. The bone vibration sensor module is located in the earbud portion, for example, may be located in a location that is of the earbud portion and that faces the bottom section of the ear handle portion. A corresponding interaction through hole may be disposed on a main housing portion, and the bone vibration sensor module interacts with the user through the interaction through hole. The bone vibration sensor module is connected to the first flexible board portion, and is connected to the chips in the stack assembly by using the first flexible board portion and the rigid board portion.

In an optional embodiment, the plurality of functional modules of the wireless headset further include an antenna module. The antenna module includes an antenna support, an antenna and a feeding member. The antenna is fastened to the antenna support, and the antenna and the antenna support are located in a top section and a connecting section of the ear handle portion. The feeding member is located in the connecting section of the ear handle portion, and is fastened to the second flexible board portion and configured to feed the antenna. For example, the feeding member may be an elastomer, and be welded to the second flexible board portion. In some embodiments, the plurality of chips further include a radio frequency chip, and the radio frequency chip is configured to modulate a radio frequency signal and demodulate a radio frequency signal. For example, the radio frequency signal operates in a Bluetooth frequency band. The radio frequency chip is electrically connected to the micro control unit chip. The antenna is electrically connected to the radio frequency chip by using the feeding member, the second flexible board portion, and the rigid board portion. In some other embodiments, the radio frequency chip may be further integrated in the micro control unit chip.

In an optional embodiment, the plurality of functional modules of the wireless headset further include a first microphone module, and the first microphone module is configured to convert a sound signal into an electrical signal. The first microphone module is located in the connecting section of the ear handle portion. A sound outside the wireless headset can enter the wireless headset through a first sound inlet, and then be received by the first microphone module. The first microphone module is connected to the second flexible board portion, and is connected to the chips in the stack assembly by using the second flexible board portion and the rigid board portion.

In an optional embodiment, the plurality of functional modules of the wireless headset further include a second microphone module, and the second microphone module is configured to convert a sound signal into an electrical signal. The second microphone module is located in the bottom section of the ear handle portion. A sound outside the wireless headset can enter the wireless headset through a second sound inlet, and then be received by the second microphone module. The second microphone module is connected to the second flexible board portion, and is connected to the chips in the stack assembly by using the second flexible board portion and the rigid board portion.

In an optional embodiment, the rigid-flexible circuit board includes at least one flexible dielectric layer and at least two first conductive layers. The at least one flexible dielectric layer and the at least two first conductive layers are stacked, One flexible dielectric layer is disposed between two adjacent first conductive layers. The at least one flexible dielectric layer and the at least two first conductive layers form the first flexible board portion, an intermediate layer of the rigid board portion, and the second flexible board portion. The first flexible board portion, the intermediate layer of the rigid board portion, and the second flexible board portion are an integral and continuous structure. For example, the flexible dielectric layer may use a material of polyimide, so that the first flexible board portion and the second flexible board portion have relatively good bending resistance.

The rigid-flexible circuit board further includes at least two rigid dielectric layers and at least two second conductive layers. The at least two rigid dielectric layers and the at least two second conductive layers are stacked. Some of the at least two rigid dielectric layers are located on one side of the intermediate layer of the rigid board portion, and the other of the rigid dielectric layers is located on the other side of the intermediate layer of the rigid board portion. Some of the at least two second conductive layers are located on one side of the intermediate layer of the rigid board portion, and the other of the second conductive layers is located on the other side of the intermediate layer of the rigid board portion. One rigid dielectric layer is disposed between two adjacent second conductive layers on a same side of the intermediate layer of the rigid board portion. One rigid dielectric layer is disposed between the second conductive layer adjacent to the intermediate layer of the rigid board portion and the intermediate layer of the rigid board portion. For example, the rigid dielectric layer may use a material of polypropylene, so that the rigid board portion has sufficient structural strength.

According to a second aspect, an embodiment of this application further provides a wireless headset. The wireless headset has an ear handle portion and an earbud portion connected to the ear handle portion. The wireless headset includes a main control module. The main control module includes a first substrate, a second substrate, a rigid-flexible circuit hoard, and a plurality of chips. The rigid-flexible circuit board includes a rigid board portion and a first flexible board portion and a second flexible hoard portion that are connected to the rigid board portion. The first substrate and the second substrate are located in the earbud portion. The first substrate and the second substrate are stacked at a space from each other. The rigid board portion is a hollow structure. The rigid board portion is fastened between the first substrate and the second substrate. The first flexible board portion is located in the earbud portion and has one end connected to the rigid board portion. One end of the second flexible board portion is connected to the rigid board portion and the other end thereof extends to the ear handle portion. At least one of the plurality chips is fastened to the first substrate. At least one of the plurality of chips is fastened to the second substrate. At least one of the plurality of chips is located on an inner side of the rigid hoard portion. The chip fastened to the first substrate and the chip fastened to the second substrate are electrically connected to the rigid board portion.

In this embodiment, the rigid board portion of the rigid-flexible circuit board serves as an elevating structure between the first substrate and the second substrate, so that a spacing is formed between the first substrate and the second substrate. Components may be arranged on one side or both sides of the first substrate and one side or both sides of the second substrate. Therefore, the main control module integrates at least two layers of components that are stacked. In this way, a component arrangement density is relatively high, and the main control module and the wireless headset have a high component integration degree.

In an optional embodiment, the main control module further includes a first package layer, a second package layer, a third package layer, and a fourth package layer. The first package layer is located on a side that is of the first substrate and that faces the second substrate. The first package layer is located on an inner side of the rigid board portion. The first package layer packages at least one chip, and may further package at least one chip-matching component. The second package layer is located on a side that is of the first substrate and that is away from the second substrate. The second package layer packages at least one chip, and may further package at least one chip-matching component. At least one first component may be further fastened to the side that is of the first substrate and that is away from the second substrate. The first component is a component not suitable tar plastic package. The first component is located on an outer side of the second package layer.

The third package layer is located on a side that is of the second substrate and that faces the first substrate. The third package layer is located on the inner side of the rigid board portion. The third package layer packages at least one chip, and may further package at least one chip-matching component. The fourth package layer is located on a side that is of the second substrate and that is away from the first substrate. The fourth package layer packages at least one chip, and may further package at least one chip-matching component. At least one second component may be further fastened to the side that is of the second substrate and that is away from the first substrate. The second component is a component not suitable for plastic package. The second component is located on an outer side of the fourth package layer.

In an optional embodiment, the main control module further includes a third substrate and a plurality of first elevating pillars. The third substrate is located on a side that is of the first substrate and that is away from the second substrate. The third substrate and the first substrate are stacked at a space from each other. The plurality of first elevating pillars are fastened between the third substrate and the first substrate. At least one chip and at least one chip-matching component are distributed on each of both sides of the first substrate, both sides of the second substrate, and both sides of the third substrate. Components fastened to the third substrate are electrically connected to the rigid board portion by using the plurality of first elevating pillars and the first substrate.

The main control module further includes a first package layer, a second package layer, a third package layer, a fourth package layer, and a fifth package layer. The first package layer is located on a side that is of the first substrate and that faces the second substrate. The first package layer is located on an inner side of the rigid board portion. The first package layer packages at least two components. The second package layer is located between the first substrate and the third substrate. The second package layer packages the plurality of first elevating pillars and components located between the first substrate and the third substrate. The third package layer is located on a side that is of the third substrate and that is away from the first substrate. The third package layer packages at least two components. At least one first component may be further fastened to the side that is of the third substrate and that is away from the first substrate. The first component is a component not suitable for plastic package. The first component is located on an outer side of the third package layer.

The fourth package layer is located on a side that is of the second substrate and that faces the first substrate. The fourth package layer is located on an inner side of the rigid board portion. The third package layer packages at least two components. The fifth package layer is located on a side that is of the second substrate and that is away from the first substrate. The fifth package layer packages at least two components. At least one second component may be further fastened to the side that is of the second substrate and that is away from the first substrate. The second component is a component not suitable for plastic package. The second component is located on an outer side of the fifth package layer.

In this embodiment, the main control module includes three layers of circuit boards (the first substrate, the second substrate, and the third substrate) that are stacked. Components can be arranged on both sides of each circuit board, so that six layers of components are integrated. A component arrangement density is high, and the main control module and the wireless headset have a high component integration degree.

In an optional embodiment, the earbud portion is provided with a receiver module, and the first flexible board portion is connected to the receiver module. The ear handle portion is provided with a battery, and the second flexible board portion is connected to the battery. The plurality of chips include a micro control unit chip, a power management chip, and an audio chip. The power management chip and the audio chip both are electrically connected to the micro control unit chip. The micro control unit chip is a processing and control center of the wireless headset and the main control module.

The receiver module is electrically connected to the audio chip by using the first flexible board portion and the rigid board portion. The audio chip is configured to encode audio data to form an electrical signal. The receiver module is configured to convert the electrical signal into a sound signal. The battery is electrically connected to the power management chip by using the second flexible board portion and the rigid board portion. The battery is configured to supply power to the wireless headset. The power management chip is configured to manage electric power input and electric power Output of the battery.

According to a third aspect, an embodiment of this application further provides a main control module. The main control module may be applied to an electronic device. The main control module includes a rigid-flexible circuit board, a first substrate, a first support member, and a plurality of chips. The rigid-flexible circuit board includes a rigid board portion and a first flexible board portion and a second flexible board portion that are connected to the rigid board portion. The first substrate and the rigid board portion are stacked at a space from each other. For example, a projection of the first substrate on the rigid board portion falls within a range of the rigid board portion. The first support member is located between the first substrate and the rigid board portion, and abuts against each of the first substrate and the rigid board portion. At least one of the plurality of chips is fastened to the rigid board portion. At least one of the plurality of chips is fastened to the first substrate. The chip fastened to the first substrate is electrically connected to the rigid board portion by using the first support member, Parts of the main control module that are fastened to, above, and below the rigid board portion form a stack assembly. That is, the main control module includes the rigid-flexible circuit board and the stack assembly. The stack assembly is fastened to the rigid board portion, and the stack assembly includes the first substrate, the first support member, and the plurality of chips.

In this embodiment, the main control module includes the first substrate and the rigid board portion that are stacked. At least one chip is fastened to the first substrate. At least one chip is fastened to the rigid board portion. Therefore, the stack assembly of the main control module can thrill a stack structure with a plurality of layers of components. The main control module has a high component arrangement density and a high component integration degree.

In this embodiment because the chip fastened to the first substrate can be electrically connected to the rigid board portion by using the first support member, a flexible circuit board for transmitting signals does not need to be disposed between the first substrate and the rigid board portion. A signal transmission path between the chip on the first substrate and the rigid board portion is implemented by the first support member, and the signal transmission path is short. This makes signal transmission quality better. In addition, the main control module in this embodiment is not provided with a flexible circuit board connected between the first substrate and the rigid board portion. This can prevent a problem of a product failure or a low yield that is caused by the following case: the flexible circuit board is bent and a bending angle is relatively large, and a fracture and an open circuit are caused in a bending region.

In an optional embodiment, the main control module further includes a plurality of chip-matching components. At least one of the plurality of chip-matching components is fastened to the first substrate, and al least one of the plurality of chip-matching components is fastened to the rigid board portion. The chip-matching component fastened to the first substrate is electrically connected to the rigid board portion by using the first support member. Arrangement locations of the plurality of chip-matching components may be arranged along with the corresponding chips.

In an optional embodiment, the first support member includes a plurality of first elevating pillars, and the plurality of first elevating pillars are located between the rigid board portion and the first substrate and are fastened to the rigid board portion. The main control module further includes a first package layer. The first package layer is located between the rigid board portion and the first substrate. The first package layer packages the plurality of first elevating pillars and at least one chip on the rigid board portion, in this case, an end face of one end that is of each of the plurality of first elevating pillars and that is away from the rigid board portion protrudes relative to the first package layer. The first substrate may be connected to the end faces of the first elevating pillars. The first package layer further packages the plurality of chip-matching components on the rigid board portion. The first package layer can protect components packaged by the first package layer, so that the main control module has relatively high reliability and a relatively long service life.

In this embodiment, the first package layer directly packages a plurality of components on the rigid board portion. In this way, the plurality of components can be directly connected to an external functional module by using the rigid board portion and the first flexible board portion or the second flexible board portion. Compared with a manner in which in a conventional package layer, components need to be first packaged on a substrate and then the substrate is welded to a circuit board before being connected to an external module, the connection manner in this embodiment is more direct and has a simpler structure.

In an optional embodiment, the rigid board portion includes a first surface facing the first substrate. The first surface includes a first package region and a first non-package region, the first package layer is located in the first package region, and the first non-package region is located around the first package region. In other words, there is a specific spacing between an edge of the first package region and an edge of the rigid board portion. In this embodiment, the first non-package region can provide a support space for a mold in a molding operation of the first package layer, to avoid damage of the rigid-flexible circuit board caused by the mold by abutting against the first flexible board portion or the second flexible board portion, thereby ensuring a production yield of the main control module.

In an optional embodiment, the main control module further includes at least one first component, and the at least one first component is fastened to the first non-package region. For example, the first component is a component not suitable for plastic package. In this embodiment, the first non-package region of the rigid board portion not only provides an abutting space for the mold in a molding process of the first package layer, but also is configured to arrange the first component not suitable for package, so that the main control module reuses a space of the first non-package region, thereby improving space utilization.

In an optional embodiment, the first substrate is welded to the plurality of first elevating pillars. The main control module further includes a second package layer. The second package layer is located on a side that is of the first substrate and that is away from the rigid board portion. The second package layer packages at least one chip on the first substrate. The second package layer may further package at least one chip-matching component on the first substrate. The second package layer can protect components packaged by the second package layer, so that the main control module has relatively high reliability and a relatively long service life.

In an optional embodiment, the first support member further includes a plurality of second elevating pillars, the plurality of second elevating pillars are fastened to a side that is of the first substrate and that faces the rigid board portion, and the plurality of second elevating pillars are welded to the plurality of first elevating pillars in one-to-one correspondences. The main control module further includes a second package layer and a third package layer, the second package layer is located on a side that is of the first substrate and that is away from the rigid board portion, the second package layer packages at least one chip on the first substrate, the third package layer is located on the side that is of the first substrate and that faces the rigid board portion, and the third package layer packages the plurality of second elevating pillars and at least one chip on the first substrate.

In this embodiment, because the first support member includes the first elevating pillars and the second elevating pillars, and the first elevating pillars and the second elevating pillars are stacked, the first support member has a sufficient height, so that a spacing between the first substrate and the rigid board portion is relatively large. Two layers of components can be arranged between the first substrate and the rigid board portion. In this way, the main control module integrates three layers of components in a direction perpendicular to the rigid board portion, and the main control module has a higher component arrangement density and a higher component integration degree. In addition, arrangement solutions of the plurality of chips and the three layers of components of the main control module are also more flexible and diversified.

In an optional embodiment, the main control module further includes at least one second component. The at least one second component is fastened to a side that is of the first substrate and that is away from the rigid board portion, and is located on an outer side of the second package layer. The second component is a component not suitable for plastic package, and includes but is not limited to a surface acoustic wave filter with a cavity, a crystal oscillator with a cavity, a pressure-sensitive component, and the like.

In this embodiment, components in the main control module that are not suitable for plastic package may be flexibly arranged on the rigid board portion and/or the first substrate based on function selections and arrangement locations of the chips, thereby improving flexibility and diversity of arrangement of the components in the main control module.

In an optional embodiment, the main control module further includes a second substrate, a second package layer, a third package layer, and a plurality of third elevating pillars. The first substrate is welded to the plurality of first elevating pillars. The chip fastened to the first substrate is located on a side that is of the first substrate and that is away from the rigid board portion. The second substrate is located on the side that is of the first substrate and that is away from the rigid board portion. The second substrate and the first substrate are stacked at a space from each other. The plurality of third elevating pillars are located between the second substrate and the first substrate, and abut against each of the second substrate and the first substrate. The second package layer is located between the second substrate and the first substrate. The plurality of third elevating pillars and the chip fastened to the first substrate are packaged in the second package layer. At least one of the plurality of chips is packaged in the second package layer and is fastened to the second substrate. The third package layer is located on a side that is of the second substrate and that is away from the first substrate. At least one of the plurality of chips is packaged in the third package layer, and is fastened to the second substrate. The chip fastened to the second substrate is electrically connected to the rigid board portion by using the plurality of third elevating pillars, the first substrate, and the plurality of first elevating pillars.

In this embodiment, the main control module has components arranged on all of a side that is of the rigid board portion and that faces the first substrate, the side that is of the first substrate and that is away from the rigid board portion, a side that is of the second substrate and that faces the first substrate, and the side that is of the second substrate and that is away from the first substrate. In this way, four layers of components are stacked in a direction perpendicular to the rigid board portion, thereby increasing a component arrangement density and a component integration degree.

In an optional embodiment, the first package layer is in contact with the first substrate. The main control module further includes a second package layer. The second package layer is fastened to a side that is of the first substrate and that is away from the rigid board portion. Some of the chips fastened to the first substrate are packaged in the first package layer, and some are packaged in the second package layer.

In this embodiment, the main control module has components arranged on all of a side that is of the rigid board portion and that faces the first substrate, a side that is of the first substrate and that faces the rigid board portion, and the side that is of the first substrate and that is away from the rigid board portion. In this way, three layers of components are stacked in a direction perpendicular to the rigid board portion. Therefore, the main control module has a relatively high component arrangement density and a relatively high component integration degree.

In an optional embodiment, the main control module further includes a fourth package layer. The fourth package layer is fastened to a side that is of the rigid board portion and that is away from the first substrate. At least one of the chip fastened to the rigid board portion is packaged in the fourth package layer.

In this embodiment, the main control module has components arranged on all of the side that is of the rigid board portion and that is away from the first substrate, the side that is of the rigid board portion and that faces the first substrate, and the side that is of the first substrate and that is away from the rigid board portion. In this way, three layers of components are stacked in a direction perpendicular to the rigid board portion. Therefore, the main control module has a relatively high component arrangement density and a relatively high component integration degree.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The main control module further includes a first package layer, a second package layer, a third package layer, and a fourth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on a side that is of the rigid board portion and that is away from the first substrate. The fourth package layer packages at least one chip on the rigid board portion.

In this embodiment, the main control module has components arranged on all of both sides of the rigid board portion and both sides of the first substrate. In this way, four layers of components are stacked in a direction perpendicular to the rigid board portion. Therefore, the main control module has a relatively high component arrangement density and a relatively high component integration degree.

In an optional embodiment, the main control module further includes a third substrate and a second support member. The third substrate is located on a side that is of the rigid board portion and that is away from the first substrate. The third substrate and the rigid board portion are stacked at a space from each other. The second support member is located between the third substrate and the rigid board portion, and abuts against each of the third substrate and the rigid board portion. At least one of the plurality of chips is fastened to the third substrate. The chip fastened to the third substrate is electrically connected to the rigid board portion by using the second support member. In this embodiment, one or more layers of components can be stacked on both sides of the rigid board portion, thereby further increasing a component integration degree of the main control module.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The second support member includes a plurality of fourth elevating pillars, and the plurality of fourth elevating pillars are fastened to the rigid board portion. The third substrate is welded to the plurality of fourth elevating pillars, and the chip fastened to the third substrate is located on a side that is of the third substrate and that is away from the rigid board portion.

The main control module further includes a first package layer, a second package layer, a third package layer, a fourth package layer, and a fifth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on the side that is of the rigid board portion and that is away from the first substrate. The fourth package layer packages the plurality of fourth elevating pillars and at least one chip on the rigid board portion. The fifth package layer is located on the side that is of the third substrate and that is away from the rigid board portion. The fifth package layer packages at least one chip on the third substrate.

In this embodiment, the main control module has components arranged on all of both sides of the rigid board portion, both sides of the first substrate, and the side that is of the third substrate and that is away from the rigid board portion. In this way, five layers of components are stacked in a direction perpendicular to the rigid board portion. Therefore, the main control module has a relatively high component arrangement density and a relatively high component integration degree.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The second support member includes a plurality of fourth elevating pillars and a plurality of fifth elevating pillars. The fourth elevating pillars and the fifth elevating pillars are stacked. The plurality of fourth elevating pillars are fastened to the rigid board portion. The plurality of fifth elevating pillars are fastened to the third substrate. The plurality of fifth elevating pillars are welded to the plurality of fourth elevating pillars in one-to-one correspondences.

The main control module further includes a first package layer, a second package layer, a third package layer, a fourth package layer, a fifth package layer, and a sixth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on the side that is of the rigid board portion and that is away from the first substrate. The fourth package layer packages the plurality of fourth elevating pillars and at least one chip on the rigid board portion. The fifth package layer is located on a side that is of the third substrate and that faces the rigid board portion. The fifth package layer packages the plurality of fifth elevating pillars and at least one chip on the third substrate. The sixth package layer is located on the side that is of the third substrate and that is away from the rigid board portion. The sixth package layer packages at least one chip on the third substrate.

In this embodiment, the main control module has components arranged on all of both sides of the rigid board portion, both sides of the first substrate, and both sides of the third substrate. In this way, six layers of components are stacked in a direction perpendicular to the rigid board portion. Therefore, the main control module has a relatively high component arrangement density and a relatively high component integration degree.

In an optional embodiment, the first support member includes a plurality of first elevating pillars and a plurality of second elevating pillars. The first elevating pillars and the second elevating pillars are stacked. The plurality of first elevating pillars are fastened to the rigid board portion. The plurality of second elevating pillars are fastened to the first substrate. The plurality of second elevating pillars are welded to the plurality of first elevating pillars in one-to-one correspondences. The second support member includes a plurality of fourth elevating pillars that are stacked, and the plurality of fourth elevating pillars are fastened to the rigid board portion. The third substrate is welded to the plurality of fourth elevating pillars.

The main control module further includes a fourth substrate and a plurality of sixth elevating pillars. The fourth substrate is located on a side that is of the third substrate and that is away from the rigid board portion. The fourth substrate and the third substrate are stacked at a space from each other. The plurality of sixth elevating pillars are located between the fourth substrate and the third substrate, and support the fourth substrate and the third substrate. At least one of the plurality of chips is fastened to the fourth substrate. The chip fastened to the fourth substrate is electrically connected to the rigid board portion by using the sixth elevating pillars, the third substrate, and the second support member.

The main control module further includes a first package layer, a second package layer, a third package layer, a fourth package layer, a fifth package layer, and a sixth package layer. The first package layer is located between the rigid board portion and the first substrate. The first package layer packages the plurality of first elevating pillars and at least one chip on the rigid board portion. The second package layer is located on a side that is of the first substrate and that faces the rigid board portion. The second package layer packages the plurality of second elevating pillars and at least one chip on the first substrate. The third package layer is located on a side that is of the first substrate and that is away from the rigid board portion. The third package layer packages at least one chip on the first substrate. The fourth package layer is located on the side that is of the rigid board portion and that is away from the first substrate. The fourth package layer packages the plurality of fourth elevating pillars and at least one chip on the rigid board portion. The fifth package layer is located between the third substrate and the fourth substrate. The fifth package layer packages the plurality of sixth elevating pillars and at least one chip on the third substrate, and packages at least one chip on the fourth substrate. The sixth package layer is located on a side that is of the fourth substrate and that is away from the third substrate. The sixth package layer packages at least one chip on the fourth substrate.

In this embodiment, the main control module has components arranged on all of both sides of the rigid board portion, both sides of the first substrate, the side that is of the third substrate and that is away from the rigid board portion, and both sides of the fourth substrate. In this way, seven layers of components are stacked in a direction perpendicular to the rigid board portion. Therefore, the main control module has a relatively high component arrangement density and a relatively high component integration degree.

In an optional embodiment, the first support member includes a plurality of first elevating pillars, and the second support member includes a plurality of fourth elevating pillars. The main control module further includes a first package layer, a second package layer, a fourth package layer, and a fifth package layer. The first package layer is located between the rigid board portion and the first substrate. The first package layer packages the plurality of first elevating pillars and at least one chip on the rigid board portion, and packages at least one chip on the first substrate. In this case, the first package layer packages components located between the rigid board portion and the first substrate. The fourth package layer is located between the rigid board portion and the third substrate. The fourth package layer packages the plurality of fourth elevating pillars and at least one chip on the rigid board portion, and packages at least one chip on the third substrate. The fifth package layer is fastened to a side that is of the third substrate and that is away from the rigid board portion. The fifth package layer packages at least one chip on the third substrate.

In this embodiment, the main control module has components arranged on all of both sides of the rigid board portion, both sides of the first substrate, and both sides of the third substrate. In this way, six layers of components are stacked in a direction perpendicular to the rigid board portion. Therefore, the main control module has a relatively high component arrangement density and a relatively high component integration degree.

In an optional embodiment, the first support member is a first elevating plate, the first elevating plate is a hollow structure, and at least one chip is located on an inner side of the first elevating plate. The first elevating plate is a circuit board structure, and the first elevating plate may be fastened to the rigid board portion by assembly, or may be integrally molded with the rigid board portion. In this embodiment, the main control module supports a component arrangement space between the first substrate and the rigid board portion by using the first elevating plate, so that the main control module can integrate at least two layers of components. In this way, a component arrangement density is increased, and the main control module has a relatively high component integration degree.

In some embodiments, components fastened to the rigid board portion are all located on a side that is of the rigid board portion and that faces the first substrate. Some of the components are located on an inner side of the first elevating plate, and sonic of the components are located on an outer side of the first elevating plate. In some other embodiments, some of components fastened to the rigid board portion are located on a side that is of the rigid board portion and that faces the first substrate, and some are located on a side that is of the rigid board portion and that is away from the first substrate.

The main control module further includes a plurality of chip-matching components. At least one of the plurality of chip-matching components is fastened to the rigid board portion, and at least one of the plurality of chip-matching components is fastened to the first substrate.

In an optional embodiment, at least one of the plurality of chips is fastened to the side that is of the rigid board portion and that is away from the first substrate, at least one of the plurality of chips is fastened to a side that is of the rigid board portion and that faces the first substrate, at least one of the plurality of chips is fastened to a side that is of the first substrate and that faces the rigid board portion, and at least one of the plurality of chips is fastened to a side that is of the first substrate and that is away from the rigid board portion. That is, components are arranged on both sides of the rigid board portion and both sides of the first substrate. Therefore, the main control module integrates four layers of components. A component arrangement density is high, and the main control module has a high component integration degree.

The main control module further includes a first package layer. The first package layer is located on the side that is of the first substrate and that is away from the rigid board portion, and packages at least one chip. The first package layer may further package at least one chip-matching component. The first package layer may perform full-size package or partial package on components fastened to the side that is of the first substrate and that is away from the rigid board portion.

In an optional embodiment, the main control module further includes a second substrate and a plurality of third elevating pillars. The second substrate is located on a side that is of the first substrate and that is away from the rigid board portion. The second substrate and the first substrate are stacked at a space from each other. The plurality of third elevating pillars are located between the second substrate and the first substrate, and abut against each of the second substrate and the first substrate. At least one of the plurality of chips is fastened to the second substrate. The chip fastened to the second substrate is electrically connected to the rigid board portion by using the plurality of third elevating pillars, the first substrate, and the first support member.

The main control module further includes a first package layer and a second package layer. The first package layer is located between the first substrate and the second substrate, and is configured to package components between the first substrate and the second substrate. The second package layer is located on a side that is of the second substrate and that is away from the first substrate. The second package layer may perform partial package or full-size package on components fastened to the side that is of the second substrate and that is away from the first substrate.

In this embodiment, components are arranged on all of both sides of the rigid board portion, both sides of the first substrate, and both sides of the second substrate. The main control module integrates six layers of components. A component arrangement density is high, and the main control module has a high component integration degree. In another embodiment, components may be arranged on a single side of one or more of the rigid board portion, the first substrate, or the second substrate.

In an optional embodiment, the main control module further includes a second substrate and a second elevating plate. The second substrate is located on a side that is of the rigid board portion and that is away from the first substrate, and the second substrate and the rigid board portion are stacked at a space from each other. The second elevating plate is located between the second substrate and the rigid board portion, and abuts against each of the second substrate and the rigid board portion. At least one of the plurality of chips is fastened to the second substrate. The chip fastened to the second substrate is electrically connected to the rigid board portion by using the second elevating plate. The second elevating plate is a hollow structure, and at least one chip is located on an inner side of the second elevating plate.

In this embodiment, the main control module has the first substrate fastened to one side of the rigid board portion by using the first elevating plate, and has the second substrate fastened to the other side of the rigid board portion by using the second elevating plate. In this way, a stack structure with three layers of circuit boards is formed, and components may be flexibly arranged on one side or both sides of each of the three layers of circuit hoards to form a stack structure with at least three layers of components. Therefore, the main control module has a high component arrangement density and a high component integration degree.

In an optional embodiment, the rigid-flexible circuit board includes at least one flexible dielectric layer and at least two first conductive layers. The at least one flexible dielectric layer and the at least two first conductive layers are stacked. One flexible dielectric layer is disposed between two adjacent first conductive layers. The at least one flexible dielectric layer and the at least two first conductive layers limn the first flexible board portion, an intermediate layer of the rigid board portion, and the second flexible board portion. The first flexible board portion, the intermediate layer of the rigid board portion, and the second flexible board portion are an integral and continuous structure. For example, the flexible dielectric layer may use a material of polyimide, so that the first flexible board portion and the second flexible board portion have relatively good bending resistance.

The rigid-flexible circuit board further includes at least two rigid dielectric layers and at least two second conductive layers. The at least two rigid dielectric layers and the at least two second conductive layers are stacked. Some of the at least two rigid dielectric layers are located on one side of the intermediate layer of the rigid board portion, and the other of the rigid dielectric layers is located on the other side of the intermediate layer of the rigid board portion. Some of the at least two second conductive layers are located on one side of the intermediate layer of the rigid board portion, and the other of the second conductive layers is located on the other side of the intermediate layer of the rigid board portion. One rigid dielectric layer is disposed between two adjacent second conductive layers on a same side of the intermediate layer of the rigid board portion. One rigid dielectric layer is disposed between the second conductive layer adjacent to the intermediate layer of the rigid board portion and the intermediate layer of the rigid board portion. For example, the rigid dielectric layer may use a material of polypropylene, so that the rigid board portion has sufficient structural strength.

According to a fourth aspect, an embodiment of this application further provides a main control module. The main control module includes a first substrate, a second substrate, a rigid-flexible circuit board, and a plurality of chips. The rigid-flexible circuit board includes a rigid board portion and a first flexible hoard portion and a second flexible hoard portion that are connected to the rigid board portion. The first substrate and the second substrate are located in the earbud portion. The first substrate and the second substrate are stacked at a space from each other. The rigid board portion is a hollow structure. The rigid board portion is fastened between the first substrate and the second substrate. The first flexible board portion is located in the earbud portion and has one end connected to the rigid board portion. One end of the second flexible board portion is connected to the rigid board portion and the other end thereof extends to the ear handle portion. At least one of the plurality chips is fastened to the first substrate. At least one of the plurality of chips is fastened to the second substrate. At least one of the plurality of chips is located on an inner side of the rigid board portion. The chip fastened to the first substrate and the chip fastened to the second substrate are electrically connected to the rigid board portion.

In this embodiment, the rigid board portion of the rigid-flexible circuit board serves as an elevating structure between the first substrate and the second substrate, so that a spacing is formed between the first substrate and the second substrate. Components may be arranged on one side or both sides of the first substrate and one side or both sides of the second substrate. Therefore, the main control module integrates at least two layers of components that are stacked. In this way, a component arrangement density is relatively high, and the main control module has a high component integration degree.

In an optional embodiment, the main control module further includes a first package layer, a second package layer, a third package layer, and a fourth package layer. The first package layer is located on a side that is of the first substrate and that faces the second substrate. The first package layer is located on an inner side of the rigid board portion. The first package layer packages at least one chip, and may further package at least one chip-matching component. The second package layer is located on a side that is of the first substrate and that is away from the second substrate. The second package layer packages at least one chip, and may further package at least one chip-snatching component. At least one first component may be further fastened to the side that is of the first substrate and that is away from the second substrate. The first component is a component not suitable for plastic package. The first component is located on an outer side of the second package layer.

The third package layer is located on a side that is of the second substrate and that faces the first substrate. The third package layer is located on the inner side of the rigid board portion. The third package layer packages at least one chip, and may further package at least one chip-matching component. The fourth package layer is located on a side that is of the second substrate and that is away from the first substrate. The fourth package layer packages at least one chip, and may further package at least one chip-matching component. At least one second component may be further fastened to the side that is of the second substrate and that is away from the first substrate. The second component is a component not suitable for plastic package. The second component is located on an outer side of the fourth package layer.

In an optional embodiment, the main control module further includes a third substrate and a plurality of first elevating pillars. The third substrate is located on a side that is of the first substrate and that is away from the second substrate. The third substrate and the first substrate are stacked at a space from each other. The plurality of first elevating pillars are fastened between the third substrate and the first substrate. At least one chip and at least one chip-matching component are distributed on each of both sides of the first substrate, both sides of the second substrate, and both sides of the third substrate. Components fastened to the third substrate are electrically connected to the rigid board portion by using the plurality of first elevating pillars and the first substrate.

The main control module further includes a first package layer, a second package layer, a third package layer, a fourth package layer, and a fifth package layer. The first package layer is located on a side that is of the first substrate and that faces the second substrate. The first package layer is located on an inner side of the rigid board portion. The first package layer packages at least two components. The second package layer is located between the first substrate and the third substrate. The second package layer packages the plurality of first elevating pillars and components located between the first substrate and the third substrate. The third package layer is located on a side that is of the third substrate and that is away from the first substrate. The third package layer packages at least two components. At least one first component may be further fastened to the side that is of the third substrate and that is away from the first substrate. The first component is a component not suitable for plastic package. The first component is located on an outer side of the third package layer.

The fourth package layer is located on a side that is of the second substrate and that faces the first substrate. The fourth package layer is located on an inner side of the rigid board portion. The third package layer packages at least two components. The fifth package layer is located on a side that is of the second substrate and that is away from the first substrate. The fifth package layer packages at least two components. At least one second component may be further fastened to the side that is of the second substrate and that is away from the first substrate. The second component is a component not suitable for plastic package. The second component is located on an outer side of the fifth package layer.

In this embodiment, the main control module includes three layers of circuit boards (the first substrate, the second substrate, and the third substrate) that are stacked, Components can be arranged on both sides of each circuit board, so that six layers of components are integrated. A component arrangement density is high, and the main control module has a high component integration degree.

DESCRIPTION OF EMBODIMENTS

The following describes embodiments of this application below with reference to accompanying drawings in the embodiments of this application.

An embodiment of this application provides a wireless headset. The wireless headset may be wirelessly connected (for example, Bluetooth-connected) to an electronic device such as a mobile phone, a notebook computer, a tablet, or a smartwatch, so that the wireless headset is used in cooperation with the electronic device. The wireless headset is configured to process audio services of the electronic device, such as media and call services, or process some other data services. For example, the audio services may include media services such as playing music, recordings, voice in video files, background music in games, and incoming call alert tones for a user. The audio services may further include playing a peer's voice data for a user, collecting voice data of a user and sending the voice data to a peer, or the like in call services scenarios such as a call, a WeChat voice message, an audio call, a video call, a game, and a voice assistant.

Figure 1:
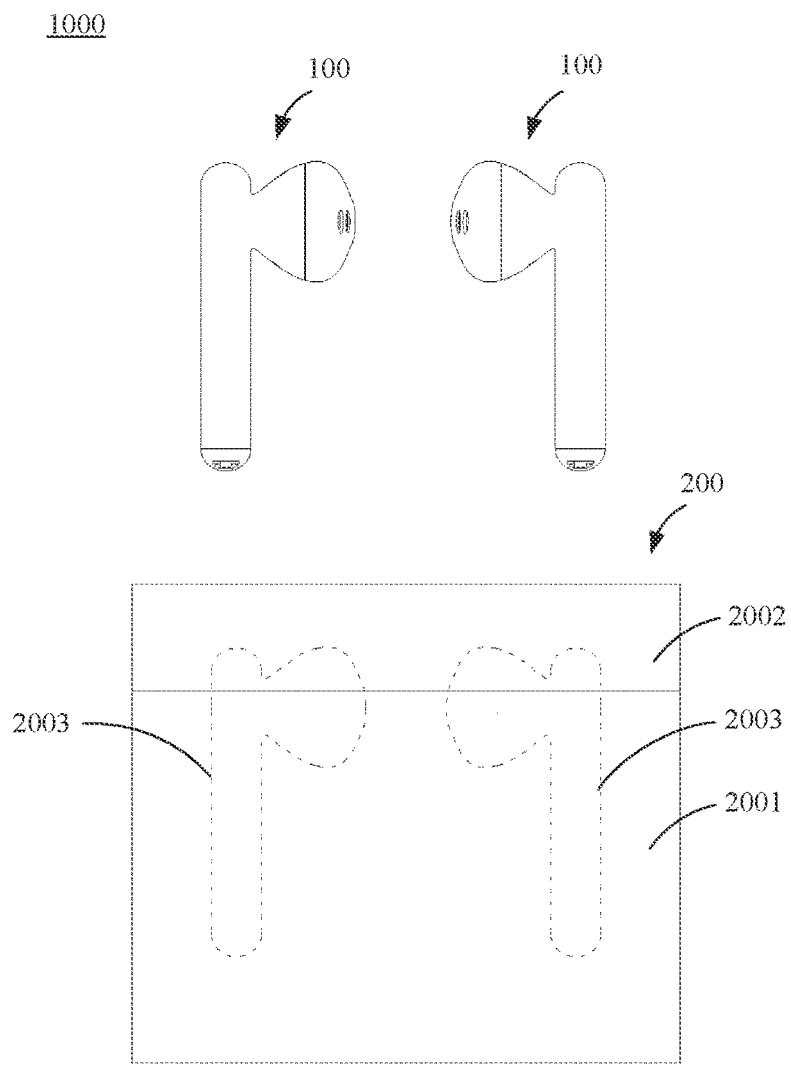
FIG. 1 is a schematic diagram of a structure of a wireless headset according to an embodiment of this application.

FIG. 1 is a schematic diagram of a structure of a wireless headset 1000 according to an embodiment of this application. The wireless headset 1000 may be a true wireless stereo (true wireless stereo, TWS) headset. The wireless headset 1000 may include two headset bodies 100. The two headset bodies 100 can be respectively used as a left headset and a right headset. The left headset can be used in cooperation with a user's left ear, and the right headset can be used in cooperation with the user's right ear. The wireless headset 1000 may be an in-ear headset or a half in-ear headset. In this embodiment, a description is provided by using an example in which the wireless headset 1000 is a half in-ear headset.

It can be understood that, in some other embodiments of this application, the wireless headset 1000 may be another type of wireless headset, for example, a wireless headphone or a necklace headphone. In some other embodiments of this application, the wireless headset 1000 may include only one headset body 100.

In some embodiments, as shown in FIG. 1, the wireless headset 1000 may further include a battery case 200. The battery case 200 includes a case body 2001 and a case cover 2002 movably connected to the case body 2001. For example, the case cover 2002 may be rotatably connected to the case body 2001 or detachably snap-fitted and connected to the case body 2001. An accommodating space 2003 is formed in the battery case 200, and the headset bodies 100 may be accommodated in the accommodating space 2003. Charging terminals (not shown in the figure) are disposed inside the battery case 200. When the charging terminals are in contact with charging terminals (not shown in the figure) of the headset bodies 100, the headset bodies 100 can be charged. The charging terminals in the battery case 200 may be pogo pins (pogo pins), elastomers, conductive blocks, conductive patches, conductive sheets, pins, connectors, contact pads, jacks, sockets, or the like. A specific type of the charging terminals in the battery case 200 is not strictly limited in this embodiment of this application.

Figure 2:
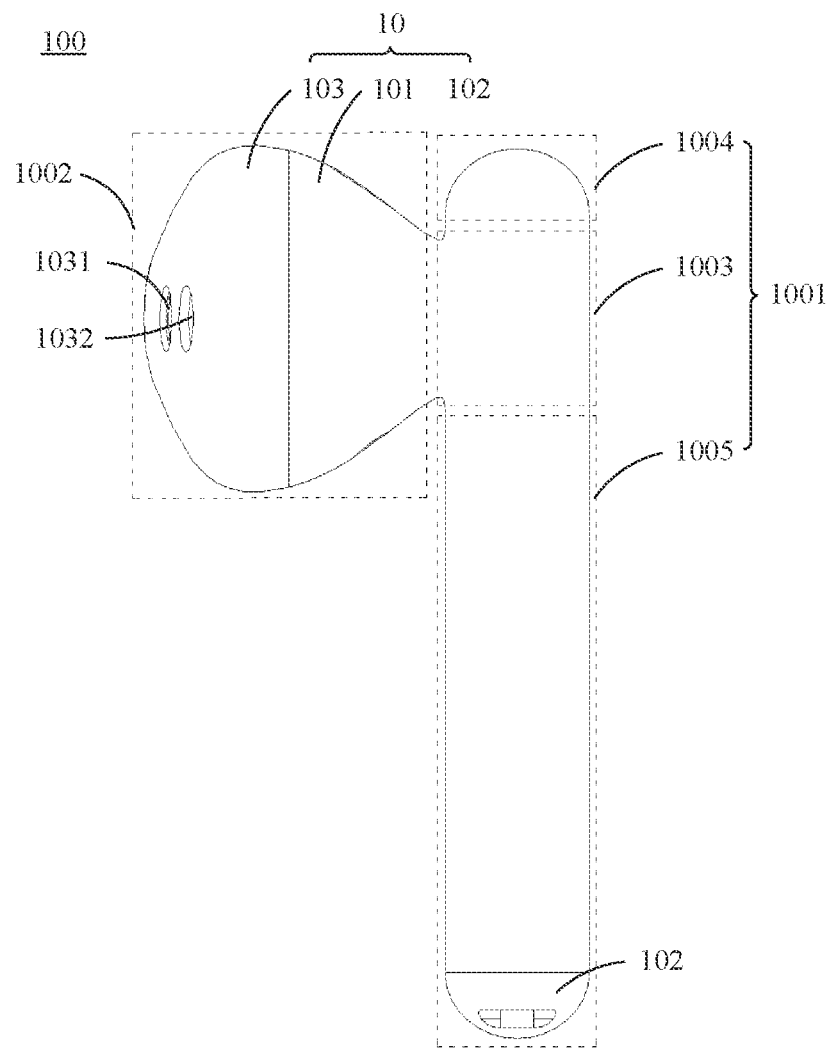
FIG. 2 is a schematic diagram of a structure of a headset body shown in FIG. 1.

FIG. 2 is a schematic diagram of a structure of the headset body 100 shown in FIG. 1. The headset body 100 has an ear handle portion 1001 and an earbud portion 1002 connected to the ear handle portion 1001. The earbud portion 1002 is configured to partially fit into a user's ear. The ear handle portion 1001 is configured to reach contact with the user's ear. When the user wears the headset body 100, the earbud portion 1002 partially fits into the user's ear, and the ear handle portion 1001 is located on an outer side of the user's ear and reaches contact with the user's ear. For example, the ear handle portion 1001 includes a connecting section 1003 connected to the earbud portion 1002 and a top section 1004 and a bottom section 1005 that are respectively located on two sides of the connecting section 1003. In some other embodiments, the ear handle portion 1001 may not include the top section 1004, that is, the ear handle portion 1001 includes the connecting section 1003 and the bottom section 1005.

Figure 3:
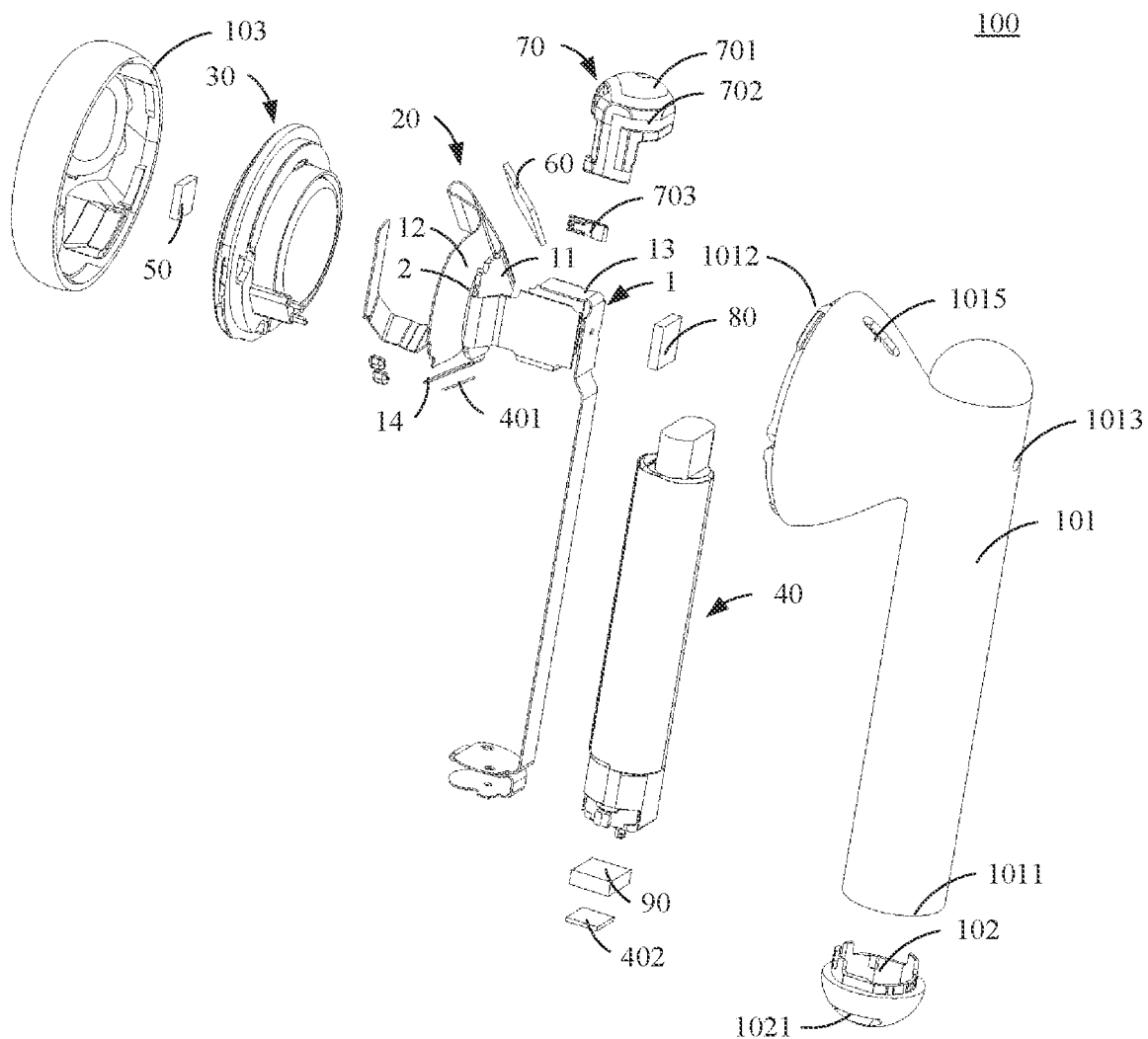
FIG. 3 is a partial schematic exploded view of the headset body shown in FIG. 2.

FIG. 3 is a partial schematic exploded view of the headset body 100 shown in FIG. 2. The headset body 100 includes a housing 10. The housing 10 is configured to accommodate other parts of the headset body 100, so as to fasten and protect the other parts. The housing 10 includes a main housing 101, a bottom housing 102, and a side housing 103. The main housing 101 is partially located in the ear handle portion 1001 of the headset body 100, and is partially located in the earbud portion 1002 of the headset body 100. The main housing 101 forms a first opening 1011 in the bottom section 1005 of the ear handle portion 1001 of the headset body 100, and forms a second opening 1012 in the earbud portion 1002 of the headset body 100. The other parts of the headset body 100 may be assembled into the main housing 101 through the first opening 1011 or the second opening 1012. The bottom housing 102 is located in the bottom section 1005 of the ear handle portion 1001 of the headset body 100 and is fixedly connected to the main housing 101. The bottom housing 102 is mounted to the first opening 1011. The side housing 103 is located in the earbud portion 1002 of the headset body 100 and is fixedly connected to the main housing 101. The side housing 103 is mounted to the second opening 1012.

In some embodiments, a connection between the bottom housing 102 and the main housing 101 is a detachable connection (for example, a snap-fit connection or a threaded connection), so as to facilitate subsequent repair or maintenance of the headset body 100. In some other embodiments, the connection between the bottom housing 102 and the main housing 101 may alternatively be a non-detachable connection (for example, an adhesive-bonded connection), to reduce a risk of accidental fall-off of the bottom housing 102, so that reliability of the headset body 100 is higher.

In some embodiments, a connection between the side housing 103 and the main housing 101 is a detachable connection (for example, a snap-fit connection or a threaded connection), so as to facilitate subsequent repair or maintenance of the headset body 100. In some other embodiments, the connection between the side housing 103 and the main housing 101 may alternatively be a non-detachable connection (for example, an adhesive-bonded connection), to reduce a risk of accidental fall-off of the side housing 103, so that reliability of the headset body 100 is higher.

The side housing 103 is provided with at least one sound outlet 1031, so that a sound inside the housing 10 can be transmitted to an outside of the housing 10 through the sound outlet 1031. In this application. "at least one" includes "one" and "two or more". In some embodiments, the side housing 103 may further be provided with at least one detection hole 1032. Detection signals of some detection modules located inside the housing 10 may be transmitted to the outside of the housing 10 through the detection hole 1032, and feedback signals outside the housing 10 may also be received through the detection hole 1032. In some embodiments, a portion of the main housing 101 that is located in the connecting section 1003 of the ear handle portion 1001 is provided with at least one first sound inlet 1013, so that a sound outside the housing 10 can be transmitted to an inside of the housing 10 through the first sound inlet 1013. In some embodiments, the bottom housing 102 is provided with at least one second sound inlet 1021, so that a sound outside the housing 10 can be transmitted to the inside of the housing 10 through the second sound inlet 1021. In this embodiment of this application, shapes, locations, quantities, and the like of the sound outlet 1031, the detection hole 1032, the first sound inlet 1013, and the second sound inlet 1021 are not strictly limited.

Figure 4:
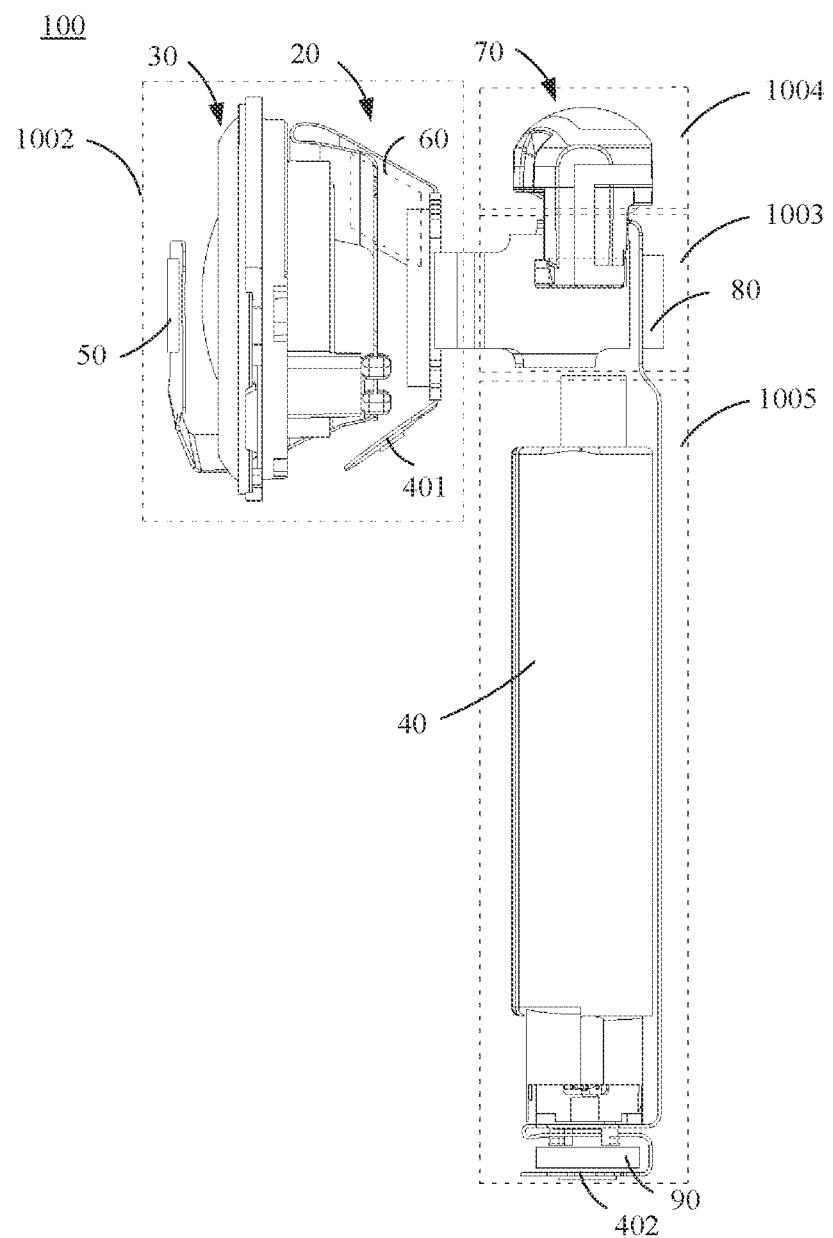
FIG. 4 is a schematic diagram of an internal structure of the headset body shown in FIG. 2.

Referring to FIG. 3 and FIG. 4, FIG. 4 is a schematic diagram of an internal structure of the headset body 100 shown in FIG. 2.

The headset body 100 includes a main control module 20. The main control module 20 is accommodated inside the housing 10. The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The rigid board portion 11 is located in the earbud portion 1002. The first flexible board portion 12 is located in the earbud portion 1002 and has one end connected to the rigid board portion 11. One end of the second flexible board portion 13 is connected to the rigid board portion 11 and the other end thereof extends to the ear handle portion 1001. The stack assembly 2 is fastened to the rigid board portion 11. A direction perpendicular to the rigid board portion 11 may be a direction in which the earbud portion 1002 has a larger size of inner-side space. A plurality of layers of components (not shown in the figure) are stacked in the stack assembly 2 in the direction perpendicular to the rigid board portion 11, so as to increase a component arrangement density. For example, the stack assembly 2 includes a plurality of chips (not shown in the figure) and a plurality of chip-matching components (not shown in the figure). The chip-matching components include one or more types of capacitors, resistors, or inductors. The stack assembly 2 may further include one or more of a substrate, an elevating pillar, an elevating plate, and a package layer. In this application, "a plurality of" is "two or above", and "above" includes a present number and a value greater than the present number.

The headset body 100 further includes a plurality of functional modules. At least one of the plurality of functional modules is located in the earbud portion 1002, and at least one of the plurality of functional modules is located in the ear handle portion 1001. Some components in the stack assembly 2 are electrically connected to the functional module located in the earbud portion 1002 by using the rigid board portion 11 and the first flexible board portion 12. Some components in the stack assembly 2 are electrically connected to the functional module located in the ear handle portion 1001 by using the rigid board portion 11 and the second flexible board portion 13.

In this embodiment, the components in the stack assembly 2 of the main control module 20 may be electrically connected to the plurality of functional modules of the headset body 100 by using the rigid-flexible circuit board 1, and a plurality of layers of components can be stacked in the stack assembly 2. Therefore, all or most of the chips and the chip-matching components of the headset body 100 can be integrated in the stack assembly 2, so that a control system of the headset body 100 is fully integrated in the stack assembly 2. In this way, a plurality of secondary circuit boards responsible for bearing control system components in a conventional wireless headset 1000 can be omitted, thereby increasing a component integration degree of the main control module 20 and the headset body 100.

In addition, the stack assembly 2 in which the plurality of layers of components are stacked has a relatively large thickness in the direction perpendicular to the rigid board portion 11. Because the stack assembly 2 is fastened to the rigid board portion 11, and the rigid board portion 11 is located in the earbud portion 1002, the stack assembly 2 is located in the earbud portion 1002. Therefore, mounting difficulty of the stack assembly 2 is relatively small, and the stack assembly 2 can fully utilize an inner cavity space of the earbud portion 1002, thereby improving space utilization of the headset body 100. In some embodiments, shapes of outer contours of the rigid board portion 11 and the stack assembly 2 may be adapted to a shape of the inner cavity space of the earbud portion 1002. For example, a circular or approximately circular outer contour is used, to further improve the space utilization of the headset body 100.

In some embodiments, as shown in FIG. 3 and FIG. 4, the functional modules of the headset body 100 include a receiver module 30 and a battery 40. The plurality of chips (not shown in the figure) of the stack assembly 2 include a micro control unit (micro control unit, MICU) chip, a power management chip, and an audio chip. The power management chip and the audio chip both are electrically connected to the micro control unit chip. The micro control unit chip is a processing and control center of the headset body 100 and the main control module 20.

The receiver module 30 is disposed in the earbud portion 1002, and the first flexible board portion 12 is connected to the receiver module 30. The receiver module 30 is electrically connected to the audio chip in the stack assembly 2 by using the first flexible board portion 12 and the rigid board portion 11. The audio chip is configured to encode audio data to form an electrical signal. The receiver module 30 is configured to convert the electrical signal into a sound signal. The sound signal may be transmitted to an outer side of the headset body 100 through the sound outlet 1031 of the side housing 103.

The battery 40 is disposed in the ear handle portion 1001, and the second flexible board portion 13 is connected to the battery 40. The battery 40 is electrically connected to the power management chip in the stack assembly 2 by using the second flexible board portion 13 and the rigid board portion 11. The battery 40 is configured to supply power to the headset body 100. The power management chip is configured to manage electric power input and electric power output of the battery 40.

The micro control unit chip is also referred to as a single-chip microcomputer or a single-chip micro-computer. For example, the micro control unit chip is a chip-level computer formed by properly reducing a frequency and a specification of a central processing unit (central process unit, CPU), and integrating units such as a memory (memory), a timer (timer), a universal serial bus (universal serial bus, USB), an analog to digital converter (analog to digital converter), a universal asynchronous receiver/transmitter (universal asynchronous receiver/transmitter, UART), a programmable logic controller (programmable logic controller, PLC), and a direct memory access (DMA) unit. In some other embodiments, the micro control unit chip may alternatively include fewer or more units.

The power management chip may include a charging circuit, a voltage drop regulation circuit, a protection circuit, an electric power measurement circuit, and the like. The charging circuit may receive external charging input. The voltage drop regulation circuit may transform an electrical signal input by the charging circuit and then output the electrical signal to the battery 40, to complete charging on the battery 40. Further, the voltage drop regulation circuit may transform an electrical signal input by the battery 40 and then output the electrical signal to the main control module 20 and other functional modules, to supply power to the components in the main control module 20 and the functional modules of the headset body 100. The protection circuit may be configured to prevent the battery 40 from overcharging, overdischarging, short circuit, overcurrent, or the like. In addition, the power management unit may be further configured to monitor parameters such as a battery capacity, a quantity of battery cycles, and a battery health status (a leakage and an impedance) of the battery 40. In some other embodiments, the power management chip may alternatively include fewer or more circuits.

In some embodiments, as shown in FIG. 3 and FIG. 4, the plurality of functional modules of the headset body 100 further include a positive electrode charging terminal 401 and a negative electrode charging terminal 402. The positive electrode charging terminal 401 is located in the earbud portion 1002. For example, a through hole (not shown in the figure) is disposed in a location that is of the main housing 101, that is located in the earbud portion 1002 and that faces the bottom section 1005 of the ear handle portion 1001. The positive electrode charging terminal 401 is exposed to an outer side of the ear handle portion 1001 through the through hole. The rigid-flexible circuit board 1 of the main control module 20 further includes a third flexible board portion 14 connected to the rigid board portion 11, and the third flexible board portion 14 is located in the earbud portion 1002. The positive electrode charging terminal 401 is connected to the third flexible board portion 14, and is connected to the power management chip in the stack assembly 2 by using the third flexible board portion 14 and the rigid board portion 11. The negative electrode charging terminal 402 is located in the bottom section 1005 of the ear handle portion 1001. For example, the bottom housing 102 uses a conductive material, and the negative electrode charging terminal 402 is in contact with the bottom housing 102. In some other embodiments, the bottom housing 102 may alternatively use a non-conductive material, and may be provided with a connecting hole. The negative electrode charging terminal 402 is fastened to the bottom housing 102 and is exposed to an outer side of an ear handle body through the connecting hole. The negative electrode charging terminal 402 is connected to the second flexible board portion 13, and is connected to the power management chip in the stack assembly 2 by using the second flexible board portion 13 and the rigid board portion 11. When the headset bodies 100 are accommodated in the battery case 200 (referring to FIG. 1), the positive electrode charging terminal 401 and the negative electrode charging terminal 402 are respectively connected to the two charging terminals in the battery case 200, so that the battery case 200 charges the headset bodies 100.

In some other embodiments, the positive electrode charging terminal 401 may alternatively be located in the bottom section 1005 of the ear handle portion 1001. In this case, the positive electrode charging terminal 401 is connected to the second flexible board portion 13, and is electrically connected to the power management chip in the stack assembly 2 by using the second flexible board portion 13 and the rigid board portion 11.

The positive electrode charging terminal 401 may be a pogo pin (pogo pin), an elastomer, a conductive block, a conductive patch, a conductive sheet, a pin, a connector, a contact pad, a jack, a socket, or the like. A specific type of the positive electrode charging terminal 401 is not strictly limited in this embodiment of this application. The negative electrode charging terminal 402 may be a pogo pin (pogo pin), an elastomer, a conductive block, a conductive patch, a conductive sheet, a pin, a connector, a contact pad, a jack, a socket, or the like. A specific type of the negative electrode charging terminal 402 is not strictly limited in this embodiment of this application. The type of the negative electrode charging terminal 402 may be the same as or similar to the type of the positive electrode charging terminal 401. The types of the positive electrode charging terminal 401 and the negative electrode charging terminal 402 adapt to the types of the charging terminals in the charging case.

In some embodiments, as shown in FIG. 3 and FIG. 4, the plurality of functional modules of the headset body 100 further include an optical sensor module 50. The optical sensor (optical sensor) module 50 may be used as a proximity detection module, and is configured to detect whether the headset body 100 is mounted to the user's ear. The optical sensor module 50 is located in the earbud portion 1002, for example, may be located in a location that is of the earbud portion 1002 and that is away from the ear handle portion 1001 and be placed close to the side housing 103. The optical sensor module 50 may transmit a detection signal and receive a feedback signal through the detection hole 1032 (referring to FIG. 2) of the side housing 103, to implement detection. The optical sensor module 50 is connected to the first flexible board portion 12, and is electrically connected to the plurality of chips in the stack assembly 2 by using the first flexible board portion 12 and the rigid board portion 11.

In some embodiments, as shown in FIG. 3 and FIG. 4, the plurality of functional modules of the headset body 100 further include a bone vibration sensor (bone vibration sensor) module 60. The bone vibration sensor module 60 is configured to implement functions such as voiceprint recognition, a speech interpretation and recognition interface (speech interpretation & recognition interface, SIRI), and startup of the headset body 100 by two taps. The bone vibration sensor module 60 is located in the earbud portion 1002, for example, may be located in a location that is of the earbud portion 1002 and that faces the bottom section 1005 of the ear handle portion 1001. A corresponding interaction through hole 1015 may be disposed on the main housing 101, and the bone vibration sensor module 60 interacts with the user through the interaction through hole 1015. The bone vibration sensor module 60 is connected to the first flexible board portion 12, and is connected to the chips in the stack assembly 2 by using the first flexible board portion 12 and the rigid board portion 11.

In some embodiments, as shown in FIG. 3 and FIG. 4, the plurality of functional modules of the headset body 100 further include an antenna module 70. The antenna module 70 includes an antenna support 701, an antenna 702, and a feeding member 703. The antenna 702 is fastened to the antenna support 701, and the antenna 702 and the antenna support 701 are located in the top section 1004 and the connecting section 1003 of the ear handle portion 1001. The feeding member 703 is located in the connecting section 1003 of the ear handle portion 1001, and is fastened to the second flexible board portion 13 and configured to feed the antenna 702. For example, the feeding member 703 may be an elastomer, and be welded to the second flexible board portion 13. In some embodiments, the plurality of chips of the stack assembly 2 further include a radio frequency chip, and the radio frequency chip is configured to modulate a radio frequency signal and demodulate a radio frequency signal. For example, the radio frequency signal operates in a Bluetooth frequency band. The radio frequency chip is electrically connected to the micro control unit chip. The antenna 702 is electrically connected to the radio frequency chip by using the feeding member 703, the second flexible board portion 13, and the rigid board portion 11. In some other embodiments, the radio frequency chip may be further integrated in the micro control unit chip.

It can be understood that, in some other embodiments, when the ear handle portion 1001 does not include the top section 1004, the antenna module 70 may be disposed in the earbud portion 1002 or the connecting section 1003 or the bottom section 1005 of the ear handle portion 1001.

In some embodiments, as shown in FIG. 3 and FIG. 4, the plurality of functional modules of the headset body 100 further include a first microphone module 80, and the first microphone module 80 is configured to convert a sound signal into an electrical signal. The first microphone module 80 is located in the connecting section 1003 of the ear handle portion 1001. A sound outside the headset body 100 can enter the headset body 100 through the first sound inlet 1013, and then be received by the first microphone module 80. The first microphone module 80 is connected to the second flexible board portion 13, and is connected to the chips in the stack assembly 2 by using the second flexible board portion 13 and the rigid board portion 11.

In some embodiments, as shown in FIG. 3 and FIG. 4, the plurality of functional modules of the headset body 100 further include a second microphone module 90, and the second microphone module 90 is configured to convert a sound signal into an electrical signal. The second microphone module 90 is located in the bottom section 1005 of the ear handle portion 1001. A sound outside the headset body 100 can enter the headset body 100 through the second sound inlet 1021, and then be received by the second microphone module 90. The second microphone module 90 is connected to the second flexible board portion 13, and is connected to the chips in the stack assembly 2 by using the second flexible board portion 13 and the rigid board portion 11. For example, the first microphone module 80 may be used as a primary microphone of the headset body 100, and the second microphone module 90 may be used as a secondary microphone of the headset body 100.

It can be understood that, the foregoing description is an example of describing the main functional modules, a housing structure, and the chips in the headset body 100. In some embodiments, the headset body 100 may alternatively include more or fewer functional modules, another housing structure, and more or fewer chips.

In this embodiment of this application, there are a plurality of flexible board portions on the rigid-flexible circuit board 1 of the main control module 20, for example, the first flexible board portion 12, the second flexible board portion 13, and the third flexible board portion 14 described above. The plurality of flexible board portions are all connected to the rigid board portion 11. The quantity of flexible board portions and locations thereof may be set based on locations of the plurality of functional modules of the headset body 100. This is not strictly limited in this application.

Figure 5:
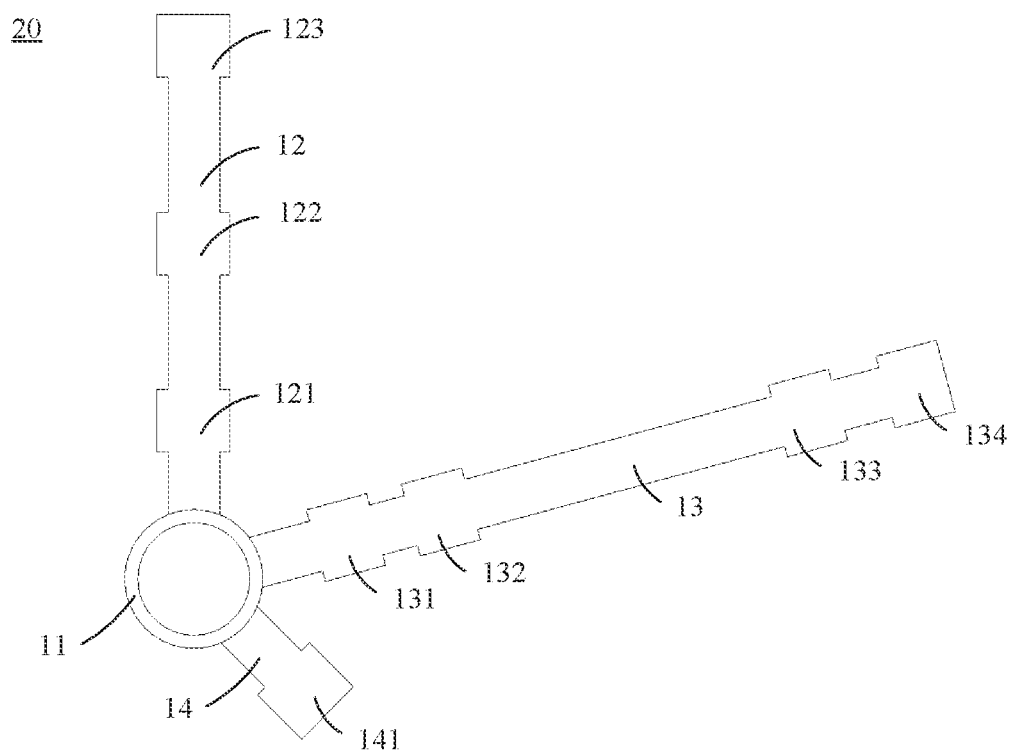
FIG. 5 is a schematic diagram of an expanded structure of a main control module shown in FIG. 3 in some embodiments.

In some example embodiments. FIG. 5 is a schematic diagram of an expanded structure of the main control module 20 shown in FIG. 3 in some embodiments. In the embodiments, connection relationships between the plurality of flexible board portions of the rigid-flexible circuit board 1 and the plurality of functional modules of the headset body 100 are corresponding to the foregoing description. Specifically, a first connecting region 121, a second connecting region 122, and a third connecting region 123 are sequentially arranged in the first flexible board portion 12 in a direction away from the rigid board portion 11. The first connecting region 121 is configured to connect to the bone vibration sensor module 60. The second connecting region 122 is configured to connect to the receiver module 30. The third connecting region 123 is configured to connect to the optical sensor module 50. A fourth connecting region 131, a fifth connecting region 132, a sixth connecting region 133, and a seventh connecting region 134 are sequentially arranged in the second flexible board portion 13 in a direction away from the rigid board portion 11. The fourth connecting region 131 is configured to connect to the antenna module 70. The fifth connecting region 132 is configured to connect to the first microphone module 80. The sixth connecting region 133 is configured to connect to the second microphone module 90. The seventh connecting region 134 is configured to connect to the negative electrode charging terminal 402. An eighth connecting region 141 is disposed in the third flexible board portion 14, and is configured to connect to the positive electrode charging terminal 401.

Figure 6:
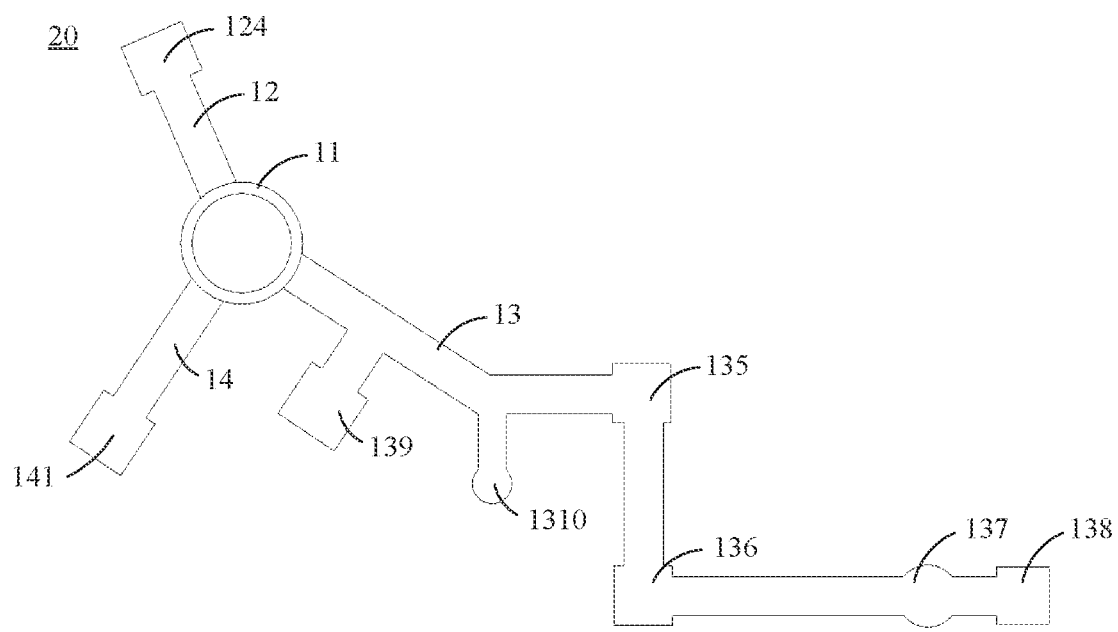
FIG. 6 is a schematic diagram of an expanded structure of the main control module shown in FIG. 3 in some other embodiments.

In sonic other example embodiments, FIG. 6 is a schematic diagram of an expanded structure of the main control module 20 shown in FIG. 3 in sonic other embodiments. Different from the foregoing embodiments, the connection relationships between the flexible board portions of the rigid-flexible circuit board 1 and the plurality of functional modules of the headset body 100 are changed in the embodiments. Specifically, a first fastening region 124 is disposed in the first flexible board portion 12, and is configured to connect to the receiver module 30. A second fastening region 135, a third fastening region 136, a fourth fastening region 137, and a fifth fastening region 138 are sequentially arranged in the second flexible board portion 13 in a direction away from the rigid board portion 11. A sixth fastening region 139 and a seventh fastening region 1310 are further disposed between the rigid board portion 11 and the second fastening region 135 in a branching manner. The second fastening region 135 is configured to connect to the antenna module 70. The third fastening region 136 is configured to connect to the first microphone module 80. The fourth fastening region 137 is configured to connect to the negative electrode charging terminal 402. The fifth fastening region 138 is configured to connect to the second microphone module 90. The sixth fastening region 139 is configured to connect to the bone vibration sensor module 60. The seventh fastening region 1310 is configured to connect to the positive electrode charging terminal 401.

Figure 7:
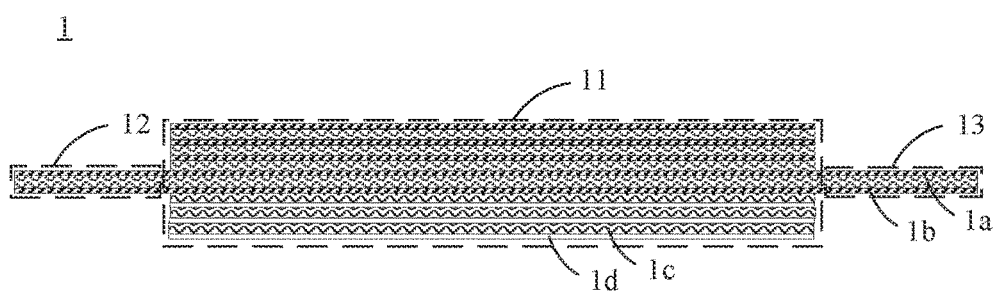
FIG. 7 is a schematic diagram of an internal structure of a rigid-flexible circuit board of the main control module shown in FIG. 3.

FIG. 7 is a schematic diagram of an internal structure of the rigid-flexible circuit board 1 of the main control module 20 shown in FIG. 3.

In some embodiments, the rigid-flexible circuit board 1 includes at least one flexible dielectric layer 1a and at least two first conductive layers 1b. The at least one flexible dielectric layer 1a and the at least two first conductive layers 1b are stacked, and one flexible dielectric layer 1a is disposed between two adjacent first conductive layers 1b. The at least one flexible dielectric layer 1a and the at least two first conductive layers 1b for the first flexible board portion 12, an intermediate layer of the rigid hoard portion 11, and the second flexible board portion 13. The first flexible board portion 12, the intermediate layer of the rigid board portion 11, and the second flexible board portion 13 are an integral and continuous structure. For example, the flexible dielectric layer 1a may use a material of polyimide (polyimide, PI), so that the first flexible board portion 12 and the second flexible board portion 13 have relatively good bending resistance. In some other embodiments, the at least one flexible dielectric layer 1a and the at least two first conductive layers 1b alternatively form another flexible board portion, such as the third flexible board portion 14.

As shown in FIG. 7, the rigid-flexible circuit board 1 further includes at least two rigid dielectric layers 1c and at least two second conductive layers 1d. The at least two rigid dielectric layers 1c and the at least two second conductive layers 1d are stacked. Some of the at least two rigid dielectric layers 1c are located on one side of the intermediate layer of the rigid board portion 11, and the other of the rigid dielectric layers 1c is located on the other side of the intermediate layer of the rigid board portion 11. Some of the at least two second conductive layers 1d are located on one side of the intermediate layer of the rigid board portion 11, and the other of the second conductive layers 1d is located on the other side of the intermediate layer of the rigid board portion 11. One rigid dielectric layer 1c is disposed between two adjacent second conductive layers 1d on a same side of the intermediate layer of the rigid board portion 11. One rigid dielectric layer 1c is disposed between the second conductive layer 1d adjacent to the intermediate layer of the rigid board portion 11 and the intermediate layer of the rigid board portion 11. The at least two rigid dielectric layers 1c and the at least two second conductive layers 1d form a two-sided layer structure of the rigid board portion 11. For example, the rigid dielectric layer 1c may use a material of polypropylene (polypropylene, PP), so that the rigid board portion 11 has sufficient structural strength.

The rigid-flexible circuit board 1 shown in FIG. 7 includes one flexible dielectric layer 1a, two first conductive layers 1b, six rigid dielectric layers 1c, and six second conductive layers 1d. The rigid-flexible circuit board 1 is an eight-layer board structure. In some other embodiments, the quantities of the flexible dielectric layers 1a, the first conductive layers 1b, the rigid dielectric layers 1c, and the second conductive layers 1d may be set to different values based on a requirement.

The following describes a structure of the main control module 20 by using an example, Embodiments in the following description may be combined with each other, provided that no conflict occurs.

Figure 8:
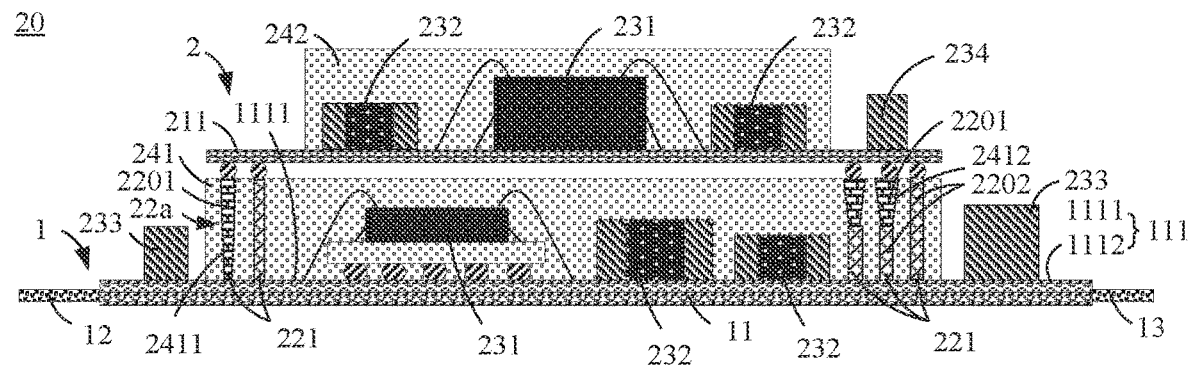
FIG. 8 is a schematic diagram of a structure of the main control module shown in FIG. 2 in a first embodiment.
Figure 9:
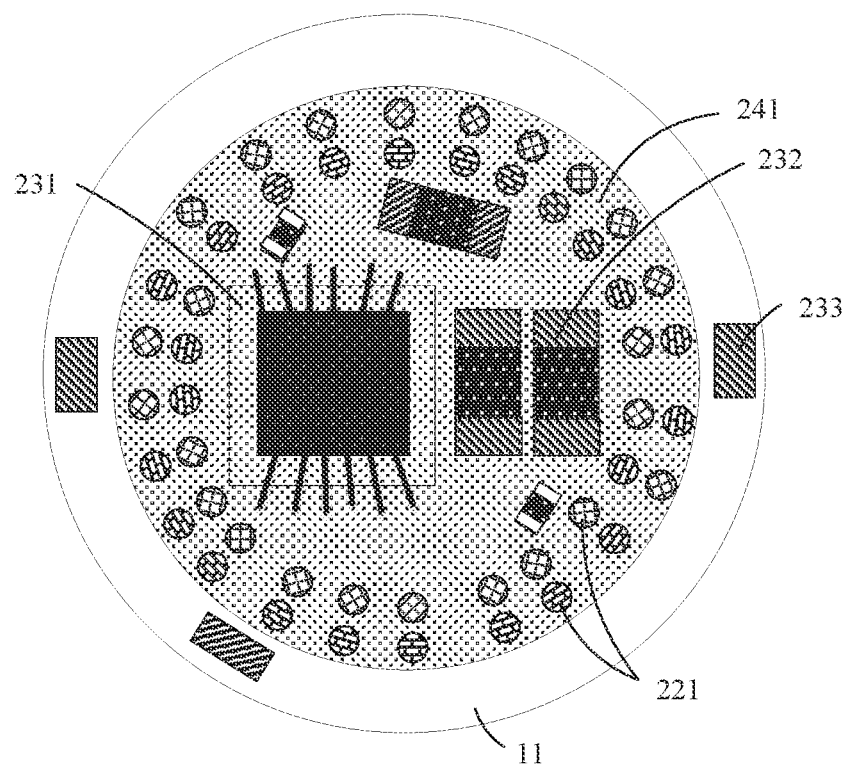
FIG. 9 is a top view of a partial structure of the main control module shown in FIG. 8.

FIG. 8 is a schematic diagram of a structure of the main control module 20 shown in FIG. 2 in a first embodiment. FIG. 9 is a top view of a partial structure of the main control module 20 shown in FIG. 8.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11.

The stack assembly 2 includes a first substrate 211, a first support member 22a, and a plurality of chips 231. The first substrate 211 and the rigid board portion 11 are stacked at a space from each other. The first substrate 211 uses a rigid circuit board. For example, a projection of the first substrate 211 on the rigid board portion 11 falls within a range of the rigid board portion 11. The first support member 22a is located between the first substrate 211 and the rigid board portion 11, and abuts against each of the first substrate 211 and the rigid board portion 11, In other words, the first support member 22a provides support between the first substrate 211 and the rigid board portion 11. One of the plurality of chips 231 is fastened to the first substrate 211. One of the plurality of chips 231 is fastened to the rigid board portion 11. The chip 231 fastened to the first substrate 211 is electrically connected to the rigid board portion 11 by using the first support member 22a. In some other embodiments, two or more of the plurality of chips 231 are fastened to the first substrate 211, and/or two or more of the plurality of chips 231 are fastened to the rigid board portion 11. In other words, in this application, at least one of the plurality of chips 231 is fastened to the first substrate 211, and at least one of the plurality of chips 231 is fastened to the rigid board portion 11. The plurality of chips 231 are arranged in diversified manners on the first substrate 211 and the rigid board portion 11. For example, a power management chip and a micro control unit chip may be fastened to the rigid board portion 11, and an audio chip may be fastened to the first substrate 211. Alternatively, a power management chip may be fastened to the rigid board portion 11, and a micro control unit chip and an audio chip may be fastened to the first substrate 211. FIG. 9 mainly illustrates a structure of the rigid board portion 11 of the rigid-flexible circuit board 1 and a structure with a single layer of components that is directly fastened to the rigid board portion 11.

In this embodiment, because the chip 231 fastened to the first substrate 211 can be electrically connected to the rigid board portion 11 by using the first support member 22a, a flexible circuit board for transmitting signals does not need to be disposed between the first substrate 211 and the rigid hoard portion 11. A signal transmission path between the chip 231 on the first substrate 211 and the rigid board portion 11 is implemented by the first support member 22a, and the signal transmission path is short. This makes signal transmission quality better. For example, a risk of distorting audio signals in transmission is relatively small. In addition, the main control module 20 in this embodiment is not provided with a flexible circuit board connected between the first substrate 211 and the rigid board portion 11. This can prevent a problem of a product failure or a low yield that is caused by the following case: the flexible circuit board is bent and a bending angle is relatively large, and a fracture and an open circuit are caused in a bending region.

An outer contour of the rigid board portion 11 of the rigid-flexible circuit board 1 is approximately circular or is circular, so as to meet a shape constraint of a human ear, and improve utilization of an internal space of the headset body 100, For example, a shape of an outer contour of the first substrate 211 is the same as or similar to a shape of the outer contour of the rigid board portion 11.

It can be understood that, in this embodiment of this application, the chip 231 may be fastened to a circuit board (for example, the rigid board portion 11, the first substrate 211, or a substrate structure described below) by surface-mounting, welding, bonding, and/or the like. For example, as shown in FIG. 8, the chip 231 located on the first substrate 211 is fastened to the first substrate 211 by bonding. The chip 231 located on the rigid board portion 11 is fastened to the circuit board by surface-mounting and bonding.

As shown in FIG. 8 and FIG. 9, in some embodiments, the stack assembly 2 of the main control module 20 further includes a plurality of chip-matching components 232. At least one of the plurality of chip-matching components 232 is fastened to the first substrate 211, and at least one of the plurality of chip-matching components 232 is fastened to the rigid board portion 11. Arrangement locations of the plurality of chip-matching components 232 may be arranged along with the corresponding chips 231.

As shown in FIG. 8, the first support member 22a includes a plurality of first elevating pillars 221, and the plurality of first elevating pillars 221 are located between the rigid board portion 11 and the first substrate 211 and are fastened to the rigid board portion 11. The plurality of first elevating pillars 221 may be disposed at any locations of the rigid board portion 11 based on an actual requirement, for example, disposed in a peripheral region of the rigid board portion 11, so that a middle region of the rigid board portion 11 has a complete and sufficient component arrangement area to arrange more components.

The stack assembly 2 of the main control module 20 further includes a first package layer 241. The first package layer 241 is located between the rigid board portion 11 and the first substrate 211. The first package layer 241 packages the plurality of first elevating pillars 221 and at least one chip 231 on the rigid board portion 11. In this case, an end face of one end that is of each of the plurality of first elevating pillars 221 and that is away from the rigid board portion 11 protrudes relative to the first package layer 241. The first substrate 211 may be connected to the end faces of the first elevating pillars 221. The first package layer 241 further packages at least one chip-matching component 232 on the rigid board portion 11. The first package layer 241 can protect components packaged by the first package layer 241, so that the main control module 20 has relatively high reliability and a relatively long service life.

In this embodiment, the first package layer 241 directly packages a plurality of components (for example, the chips 231 and the chip-matching components 232) on the rigid board portion 11. In this way, the plurality of components can be directly connected to the functional modules of the headset body 100 by using the rigid board portion 11 and the first flexible board portion 12 or the second flexible board portion 13. Compared with a manner in which in a conventional package layer, components need to be first packaged on a substrate and then the substrate is welded to a circuit board before being connected to an external module, the connection manner in this embodiment is more direct and has a simpler structure.

It can be understood that, in this embodiment of this application, a type of elevating pillar (for example, the first elevating pillars 221 or an elevating pillar structure described below) includes, but is not limited to, a filled-molded first pillar body 2201 and/or a pre-molded second pillar body 2202. In other words, in some embodiments, an elevating pillar includes the first pillar body 2201. In some other embodiments, an elevating pillar includes the second pillar body 2202. In still some other embodiments, an elevating pillar includes the first pillar body 2201 and the second pillar body 2202, and the first pillar body 2201 and the second pillar body 2202 may be stacked in a direction perpendicular to the rigid board portion 11.

A via is formed in a package layer (for example, the first package layer 241 or a package layer structure described below) formed on a circuit board (for example, the rigid board portion 11, the first substrate 211, or a substrate structure described below), and then the via is filled with a conductive material (for example, a metal material such as aluminum, copper, or silver) to form a solid first pillar body 2201, or a wall of the via is plated with a layer of conductive material (for example, a metal material such as aluminum, copper, or silver) to form a hollow first pillar body 2201. In this case, the first pillar body 2201 may be fastened to a circuit board during molding. Therefore, there is no need to provide a solder or adhesive layer for fastening between the first pillar body 2201 and the circuit board. When a signal is transmitted between the first pillar body 2201 and the circuit board, an impedance is relatively small, and a signal transmission effect is relatively good.

It can be understood that, when the plurality of elevating pillars are fastened to a circuit board, the plurality of elevating pillars may be spaced from each other, so that a subsequent packaging process can be smoothly performed, and a package layer with a uniform thickness can be formed at each location on the circuit board.

It can be understood that, the first pillar body 2201 can not only perform a supporting function, but also implement conduction. In some embodiments, if the first pillar body 2201 does not need to implement conduction, a material of the first pillar body 2201 may be replaced with a non-conductive material with relatively high hardness. Hardness of the material of the first pillar body 2201 is greater than hardness of a material of a package layer.

The second pillar body 2202 is a pillar structure prepared in advance. A molding operation of a package layer is performed after the second pillar body 2202 and a circuit board (for example, the rigid board portion 11, the first substrate 211, or a substrate structure described below) form an integral structure. In an example, the second pillar body 2202 is fastened to the circuit board by using an assembly process such as welding or adhesive bonding, and a solder or adhesive layer is provided between the second pillar body 2202 and the circuit board. In this example, the second pillar body 2202 may use a conductive material, to balance a supporting function and a conduction function. In this case, the adhesive layer uses a conductive adhesive material. In another example, the second pillar body 2202 and the circuit board connected to the second pillar body 2202 are integrally molded, for example, may be jointly completed in a circuit board preparation process. In this example, the second pillar body 2202 is an elevating plate that uses a circuit board structure, and the second pillar body 2202 may implement a conduction function by using an internal circuit structure thereof, to balance a supporting function and the conduction function. Because there is no need to provide a solder or adhesive layer between the second pillar body 2202 and the circuit board, an impedance of a signal transmitted between the second pillar body 2202 and the circuit board can be reduced, thereby obtaining a better signal transmission effect. In addition, a quantity of welding times is reduced, and product stability and a production yield are further increased.

In this embodiment of this application, the plurality of first elevating pillars 221 may be a same type of elevating pillars, or may be a combination of two or more types of elevating pillars.

For example, as shown in FIG. 8, at least one of the plurality of first elevating pillars 221 includes the first pillar body 2201. A first via 2411 is formed in the first package layer 241, and the first via 2411 is filled with a conductive material to form the first pillar body 2201. One end of the first pillar body 2201 is connected to the rigid board portion 11, and the other end thereof protrudes relative to the first package layer 241.

At least one of the plurality of first elevating pillars 221 includes the second pillar body 2202. One end of the second pillar body 2202 is connected to the rigid board portion 11, and the other end thereof protrudes relative to the first package layer 241.

At least one of the plurality of first elevating pillars 221 includes the first pillar body 2201 and the second pillar body 2202 that are stacked, and the second pillar body 2202 is located between the rigid board portion 11 and the first pillar body 2201. For an elevating pillar including the first pillar body 2201 and the second pillar body 2202, the second pillar body 2202 may be first fastened to the rigid board portion 11, and then the first package layer 241 and a second via 2412 may be formed. The second via 2412 is connected to the second pillar body 2202. Subsequently, the first pillar body 2201 is formed in the second via 2412, the first pillar body 2201 is connected to the second pillar body 2202, and an end that is of the first pillar body 2201 and that is away from the rigid board portion 11 protrudes relative to the first package layer 241.

As shown in FIG. 8 and FIG. 9, in some embodiments, the rigid board portion 11 includes a first surface 111 facing the first substrate 211. The first surface 111 includes a first package region 1111 and a first non-package region 1112. The first package layer 241 is located in the first package region 1111. The first non-package region 1112 is located around the first package region 1111. In other words, there is a specific spacing between an edge of the first package region 1111 and an edge of the rigid board portion 11. In this embodiment, the first non-package region 1112 can provide a support space for a mold in a molding operation of the first package layer 241, to avoid damage of the rigid-flexible circuit board 1 caused by the mold by abutting against the first flexible board portion 12 or the second flexible board portion 13, thereby ensuring a production yield of the main control module 20.

Figure 10:
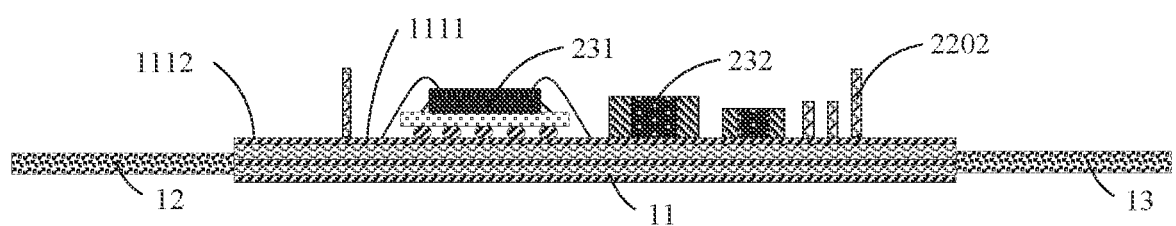
FIG. 10 is schematic diagram 1 of a structure of the main control module shown in FIG. 8 in a preparation process.
Figure 11:
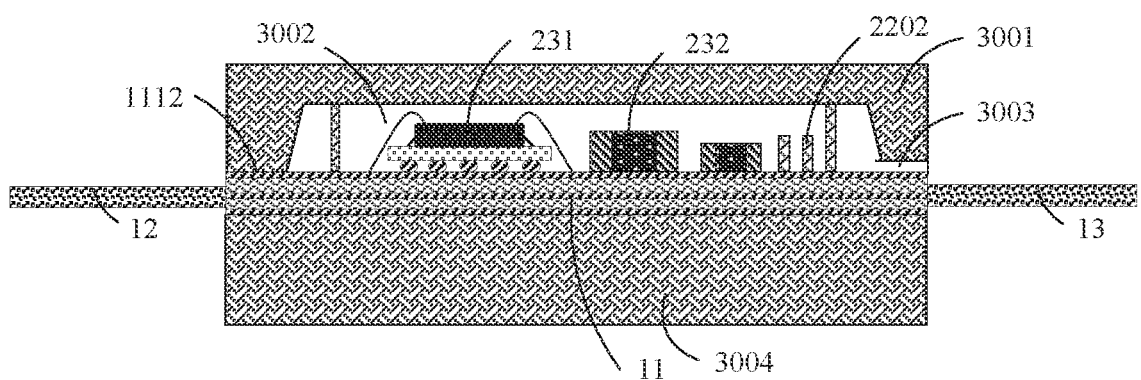
FIG. 11 is schematic diagram 2 of a structure of the main control module shown in FIG. 8 in a preparation process.
Figure 12:
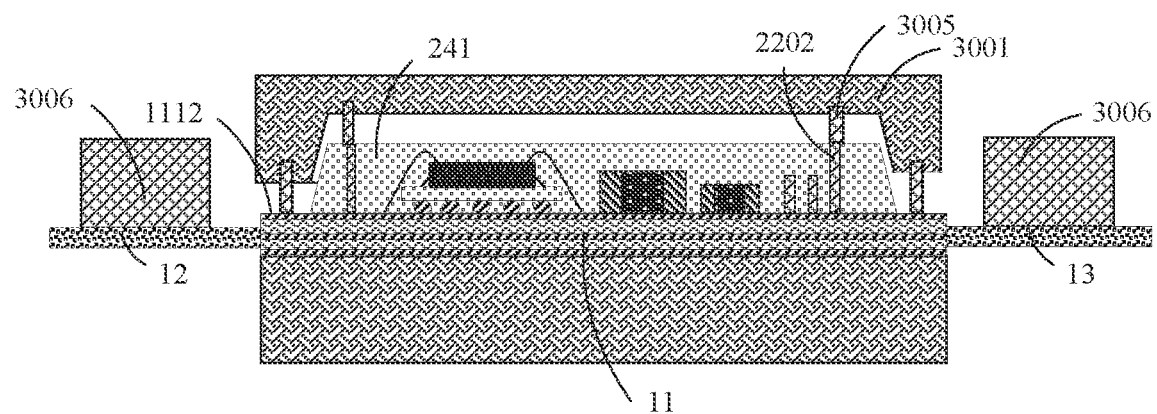
FIG. 12 is schematic diagram 3 of a structure of the main control module shown in FIG. 8 in a preparation process.

For example, FIG. 10 is schematic diagram 1 of a structure of the main control module 20 shown in FIG. 8 in a preparation process. FIG. 11 is schematic diagram 2 of a structure of the main control module 20 shown in FIG. 8 in a preparation process. FIG. 12 is schematic diagram 3 of a structure of the main control module 20 shown in FIG. 8 in a preparation process. FIG. 10 corresponds to a component fastening process. FIG. 11 corresponds to a molding (molding) process of the first package layer 241. FIG. 12 corresponds to a demolding process of the first package aver 241.

As shown in FIG. 10, a plurality of components (the chips 231 and the chip-matching components 232) and a plurality of second pillar bodies 2202 (some of the second pillar bodies 2202 separately form the first elevating pillars, and some of the second pillar bodies 2202 form portions of the first elevating pillars) are fastened to the first package region 1111 on the first surface 111 of the rigid hoard portion 11. Fixing manners of the plurality of components include but are not limited to surface-mounting, welding, bonding, adhesive-bonding, and the like.

As shown in FIG. 11, an upper mold 3001 of an injection device abuts against the first non-package region 1112 of the rigid board portion 11, and forms a package space 3002 with the rigid hoard portion 11. The second pillar bodies 2202 of the first elevating pillars, the chips 231, and the chip-matching components 232 are located inside the package space 3002. A side that is of the upper mold 3001 and that faces the rigid board portion 11 forms an adhesive injection port 3003. The adhesive injection port 3003 communicates with the package space 3002. A package material can be injected into the package space 3002 from the adhesive injection port 3003, to form the first package layer 241 (as shown in FIG. 12) in the package space 3002. A lower mold 3004 of the injection device is located on a side that is of the rigid board portion 11 and that is away from, the upper mold 3001, and abuts against the rigid board portion 11. A projection of the lower mold 3004 of the injection device on the rigid board portion 11 covers a projection of the upper mold 3001 on the rigid board portion 11, to fully support the upper mold 3001 by using the rigid board portion 11. The upper mold 3001 and the lower mold 3004 are not in contact with the first flexible board portion 12 and the second flexible board portion 13, to avoid damaging the first flexible board portion 12 and the second flexible board portion 13.

As shown in FIG. 12, after the first package layer 241 is completed, a plurality of ejector pins 3005 extend from the upper mold 3001. Some of the ejector pins 3005 push against the first non package region 1112 of the rigid board portion 11, and some of the ejector pins 3005 push against the first package layer 241, to separate the upper mold 3001 from the first package layer 241. The ejector pins 3005 pushing against the first package layer 241 may partially push against end faces of the second pillar bodies 2202, and the second pillar bodies 2202 provide a sufficient support force for the ejector pins 3005, to prevent the ejector pins 3005 from damaging the first package layer 241, so that a production yield of the main control module 20 is relatively high.

The injection device may be further provided with an auxiliary pushing block 3006. The auxiliary pushing block 3006 is configured to push against the first flexible board portion 12 and the second flexible board portion 13 to help in demolding. A contact area between the auxiliary pushing block 3006 and each of the first flexible board portion 12 and the second flexible board portion 13 is large, to prevent the first flexible board portion 12 or the second flexible board portion 13 from being damaged by an excessively large local stress.

Still referring to FIG. 8 and FIG. 9, in some embodiments, the stack assembly 2 of the main control module 20 further includes at least one first component 233, and the at least one first component 233 is fastened to the first non-package region 1112. In other words, the first package layer 241 selectively packages a component located on the rigid board portion 11, and does not package the first component 233. For example, the first component 233 is a component not suitable for plastic package, and includes but is not limited to a surface acoustic wave (surface acoustic wave, SAW) filter with a cavity, a crystal oscillator with a cavity, a pressure-sensitive component, and the like. The surface acoustic wave filter is mainly configured to filter and amplify a radio frequency signal. The crystal oscillator is mainly configured to filter main input and main output of the power management chip. The pressure-sensitive component includes but is not limited to a gyroscope, a triaxial accelerometer (triaxial accelerometer), and the like. The gyroscope is configured to detect an angular velocity. The triaxial accelerometer is configured to sense acceleration.

In this embodiment, the first non-package region 1112 of the rigid board portion 11 not only provides an abutting space for the mold in a molding process of the first package layer 241, but also is configured to arrange the first component 233 not suitable for package, so that the main control module 20 reuses a space of the first non-package region 1112, thereby improving space utilization.

In another embodiment, the first component 233 may not be disposed on the rigid board portion 11, and the first package layer 241 packages all components located on a side that is of the rigid board portion 11 and that faces the first substrate 211.

As shown in FIG. 8, in some embodiments, the first substrate 211 is welded to the plurality of first elevating pillars 221. The stack assembly 2 of the main control module 20 further includes a second package layer 242. The second package layer 242 is located on a side that is of the first substrate 211 and that is away from the rigid board portion 11. The second package layer 242 packages at least one chip 231 on the first substrate 211. The second package layer 242 may further package at least one chip-matching component 232 on the first substrate 211. The second package layer 242 can protect components packaged by the second package layer 242, so that the main control module 20 has relatively high reliability and a relatively long service life.

As shown in FIG. 8, in some embodiments, the stack assembly 2 of the main control module 20 further includes at least one second component 234. The at least one second component 234 is fastened to the side that is of the first substrate 211 and that is away from the rigid board portion 11, and is located on an outer side of the second package layer 242. The second component 234 is a component not suitable for plastic package, and includes but is not limited to a surface acoustic wave (surface acoustic wave, SAW) filter with a cavity; a crystal oscillator with a cavity, a pressure-sensitive component, and the like. In this embodiment, components in the main control module 20 that are not suitable for plastic package may be flexibly arranged on the rigid board portion 11 and; or the first substrate 211 based on function selections and arrangement locations of the chips 231, thereby improving flexibility and diversity of arrangement of the components in the main control module 20.

As shown in FIG. 8, in some embodiments, a projection of the first package layer 241 on the rigid board portion 11 covers a projection of the second package layer 242 on the rigid board portion 11. The first package layer 241 and the second package layer 242 form a roughly stepped shape with unequal upper and lower steps. In another embodiment, the first package layer 241 and the second package layer 242 may alternatively form another regular or irregular shape.

Figure 13:
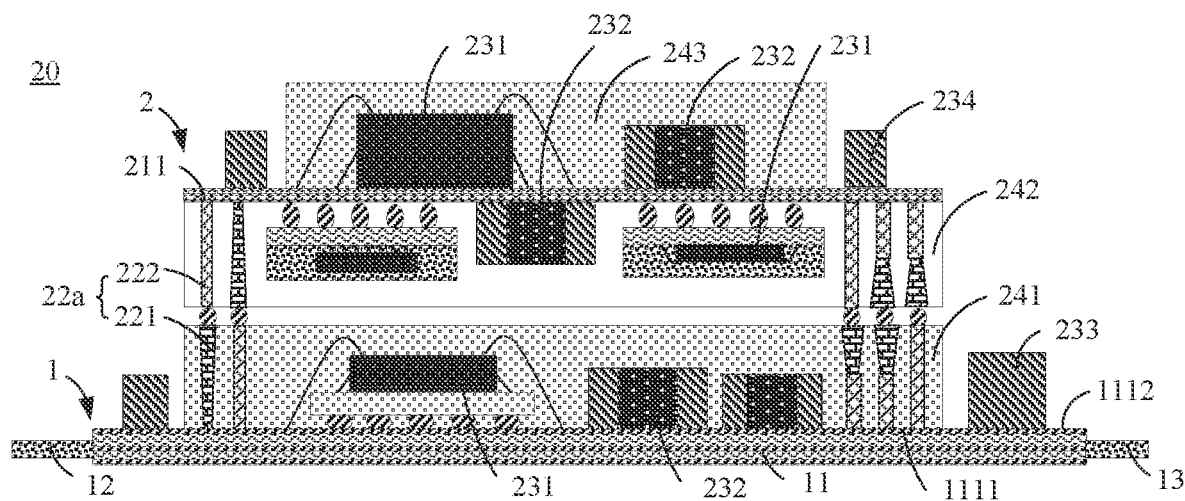
FIG. 13 is a schematic diagram of a structure of the main control module shown in FIG. 2 in a second embodiment.

FIG. 13 is a schematic diagram of a structure of the main control module 20 shown in FIG. 2 in a second embodiment. The following mainly describes a difference between the second embodiment and the first embodiment, and most content same as that in the first embodiment is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11.

The stack assembly 2 includes a first substrate 211, a first support member 22a, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11.

The first support member 22a includes a plurality of first elevating pillars 221 and a plurality of second elevating pillars 222. The plurality of first elevating pillars 221 are located between the rigid board portion 11 and the first substrate 211 and are fastened to the rigid board portion 11. The plurality of second elevating pillars 222 are fastened to a side that is of the first substrate 211 and that faces the rigid board portion 11, and the plurality of second elevating pillars 222 are welded to the plurality of first elevating pillars 221 in one-to-one correspondences. For a structure of the second elevating pillars 222, refer to the foregoing description of the elevating pillar structure. At least one of the plurality of chips 231 is fastened to the rigid board portion 11, and at least one of the plurality of chips 231 is fastened to the first substrate 211.

The stack assembly 2 of the main control module 20 further includes a first package layer 241, a second package layer 242, and a third package layer 243. The first package layer 241 is located between the rigid board portion 11 and the first substrate 211. The first package layer 241 packages the plurality of first elevating pillars 221 and at least one chip 231 on the rigid board portion 11. The first package layer 241 may further package a plurality of chip-matching components 232. The second package layer 242 is located on the side that is of the first substrate 211 and that faces the rigid board portion 11. The second package layer 242 packages at least one chip 231 on the first substrate 211. The second package layer 242 may further package a plurality of chip-matching components 232. The third package layer 243 is located on a side that is of the first substrate 211 and that is away from the rigid board portion 11. The third package layer 243 packages the plurality of second elevating pillars 222 and at least one chip 231 on the first substrate 211. The third package layer 243 may further package a plurality of chip-matching components 232. The third package layer 243 can protect components packaged by the third package layer 243, so that the main control module 20 has relatively high reliability and a relatively long service life.

In this embodiment, because the first support member 22a includes the first elevating pillars 221 and the second elevating pillars 222, and the first elevating pillars 221 and the second elevating pillars 222 are stacked, the first support member 22a has a sufficient height, so that a spacing between the first substrate 211 and the rigid board portion 11 is relatively large. Two layers of components can be arranged between the first substrate 211 and the rigid board portion 11. In this way, the main control module 20 integrates three layers of components in a direction perpendicular to the rigid board portion 11, and the main control module 20 and the headset body 100 have a higher component arrangement density and a higher component integration degree. In addition, arrangement solutions of the plurality of chips 231 and the three layers of components of the main control module 20 are also more flexible and diversified. For example, the first package layer 241 may package a power management chip, the second package layer 242 may package a micro control unit chip, and the third package layer 243 may package an audio chip.

In some embodiments, as shown in FIG. 13, the first package layer 241 is located in a first package region 1111 of the rigid board portion 11. At least one first component 233 may be fastened to a first non-package region 1112 of the rigid board portion 11. The first component 233 is a component not suitable for plastic package.

In some embodiments, as shown in FIG. 13, the second package layer 242 may perform full-size package on components on the side that is of the first substrate 211 and that faces the rigid board portion 11, and the third package layer 243 may perform partial package on components on the side that is of the first substrate 211 and that is away from the rigid board portion 11. In this embodiment of this application, a package layer performs full-size package on components on the substrate, that is, the package layer fully covers a board surface on one side of the substrate. A package layer performs partial package on components on the substrate, that is, the package layer partially covers a board surface on one side of the substrate. At least one second component 234 may be further fastened to the side that is of the first substrate 211 and that is away from the rigid board. The second component 234 is a component not suitable for plastic package. The at least one second component 234 is located on an outer side of the third package layer 243. In some other embodiments, the second component 234 may not be disposed on the first substrate 211, and the third package layer 243 performs full-size package on components on the side that is of the first substrate 211 and that is away from the rigid board portion 11.

Figure 14:
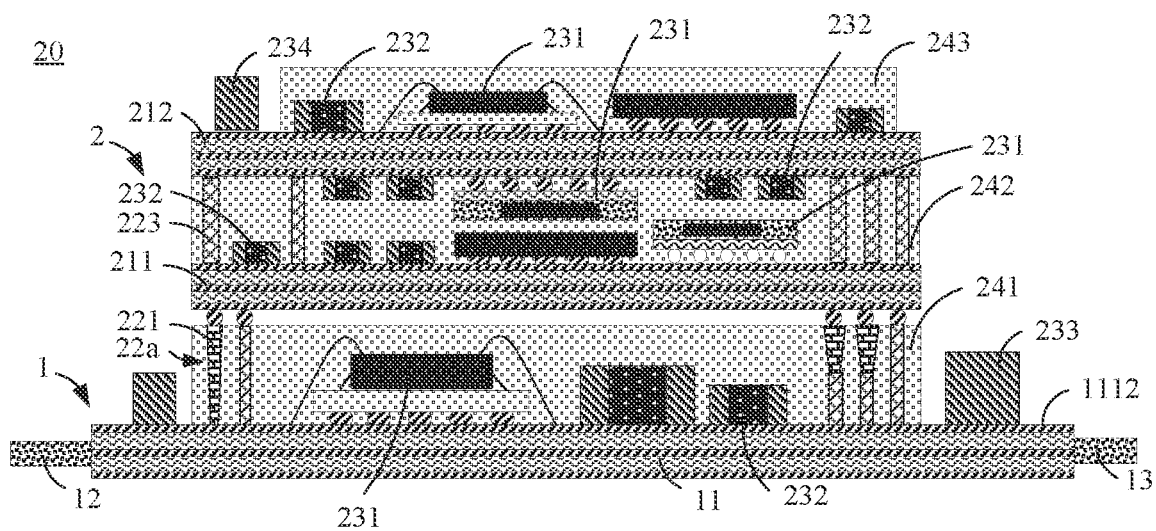
FIG. 14 is a schematic diagram of a structure of the main control module shown in FIG. 2 in a third embodiment.

FIG. 14 is a schematic diagram of a structure of the main control module 20 shown in FIG. 2 in a third embodiment. The following mainly describes a difference between the third embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11.

The stack assembly 2 includes a first substrate 211, a second substrate 212, a first support member 22a a plurality of third elevating pillars 223, a first package layer 241, a second package layer 242, a third package layer 243, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11. At least one of the plurality of chips 231 is fastened to the rigid board portion 11, at least one of the plurality of chips 231 is fastened to the first substrate 211, and at least one of the plurality of chips 231 is fastened to the second substrate 212.

The first support member 22a includes a plurality of first elevating pillars 221. The plurality of first elevating pillars 221 are located between the rigid board portion 11 and the first substrate 211 and are fastened to the rigid board portion 11. The first package layer 241 is located between the rigid board portion 11 and the first substrate 211. The first package layer 241 packages the plurality of first elevating pillars 221 and at least one chip 231 on the rigid board portion 11. The first package layer 241 may further package at least one chip-matching component 232. At least one first component 233 may be further fastened to a first non-package region 1112 of the rigid board portion 11. The first component 233 is a component not suitable for plastic package.

The first substrate 211 is welded to the plurality of first elevating pillars 221, and the chip 231 fastened to the first substrate 211 is located on a side that is of the first substrate 211 and that is away from the rigid board portion 11. The second substrate 212 is located on the side that is of the first substrate 211 and that is away from the rigid board portion 11. The second substrate 212 and the first substrate 211 are stacked at a space from each other. The plurality of third elevating pillars 223 are located between the second substrate 212 and the first substrate 211, and abut against each of the second substrate 212 and the first substrate 211. For a structure of the third elevating pillars 223, refer to the related description of the foregoing elevating pillar structure. The second package layer 242 is located between the second substrate 212 and the first substrate 211, and the plurality of third elevating pillars 223 and the chip 231 fastened to the first substrate 211 are packaged in the second package layer 242. The second package layer 242 may further package at least one chip-matching component 232 on the first substrate 211.

At least one of the plurality of chips 231 is packaged in the second package layer 242 and is fastened to the second substrate 212. The second package layer 242 may further package at least one chip-matching component 232 on the second substrate 212.

The third package layer 243 is located on a side that is of the second substrate 212 and that is away from the first substrate 211. At least one of the plurality of chips 231 is packaged in the third package layer 243, and is fastened to the second substrate 212. That is, some of the chips 231 fastened to the second substrate 212 are located on a side that is of the second substrate 212 and that faces the first substrate 211, and some are located on the side that is of the second substrate 212 and that is away from the first substrate 211. The chip 231 fastened to the second substrate 212 is electrically connected to the rigid board portion 11 by using the plurality of third elevating pillars 223, the first substrate 211, and the plurality of first elevating pillars 221. The third package layer 243 may further package at least one Chip-matching component 232 on the second substrate 212.

In this embodiment, the main control module 20 has components arranged on all of a side that is of the rigid board portion 11 and that faces the first substrate 211, the side that is of the first substrate 211 and that is away from the rigid board portion 11, the side that is of the second substrate 212 and that faces the first substrate 211, and the side that is of the second substrate 212 and that is away from the first substrate 211. In this way, four layers of components are stacked in a direction perpendicular to the rigid board portion 11, thereby increasing a component arrangement density and a component integration degree.

In some embodiments, as shown in FIG. 14, the second package layer 242 performs full-size package on components on the first substrate 211, and performs full-size package on components located on the side that is of the second substrate 212 and that faces the first substrate 211. The third package layer 243 performs partial package on components located on the side that is of the second substrate 212 and that is away from the first substrate 211. At least one second component 234 may be further fastened to the side that is of the second substrate 212 and that is away from the first substrate 211. The second component 234 is a component not suitable for plastic package. The at least one second component 234 is located on an outer side of the third package layer 243. It can be understood that, in some other embodiments, the second component 234 is not disposed on the second substrate 212, and the third package layer 243 performs full-size package on components located on the side that is of the second substrate 212 and that is away from the first substrate 211.

Figure 15:
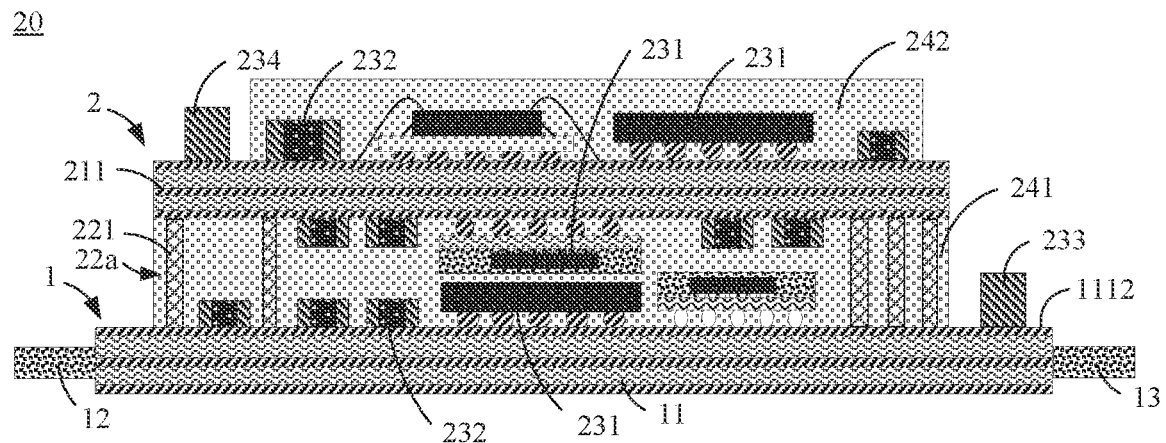
FIG. 15 is a schematic diagram of a structure of the main control module shown in FIG. 2 in a fourth embodiment.

FIG. 15 is a schematic diagram of a structure of the main control module 20 shown in FIG. 2 in a fourth embodiment. The following mainly describes a difference between the fourth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11.

The stack assembly 2 includes a first substrate 211, a first support member 22a, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11.

The first support member 22a includes a plurality of first elevating pillars 221. The plurality of first elevating pillars 221 are located between the rigid board portion 11 and the first substrate 211 and are fastened to the rigid board portion 11. For a structure of the first elevating pillars 221, refer to the structure of the foregoing second pillar body 2202 (shown in FIG. 8).

The stack assembly 2 of the main control module 20 further includes a first package layer 241 and a second package layer 242. The first package layer 241 is located between the rigid board portion 11 and the first substrate 211. The first package layer 241 packages the plurality of first elevating pillars 221 and at least one chip 231 on the rigid board portion 11. The first package layer 241 is in contact with the first substrate 211. In this case, the first package layer 241 packages components located between the rigid board portion 11 and the first substrate 211. When the main control module 20 is prepared, the first substrate 211 may be fastened (for example, welded or bonded by using adhesive) to the plurality of first elevating pillars 221, and then a package material may be filled between the first substrate 211 and the rigid board portion 11 to form the first package layer 241. The first package layer 241 may further package at least one chip-matching component 232 on the rigid board portion 11. At least one first component 233 may be further disposed in a first non-package region 1112 of the rigid board portion 11. The first component 233 is a component not suitable for plastic package.

The second package layer 242 is fastened to a side that is of the first substrate 211 and that is away from the rigid board portion 11. Some of the chips 231 fastened to the first substrate 211 are packaged in the first package layer 241, and some are packaged in the second package layer 242. In other words, sonic of the chips 231 fastened to the first substrate 211 are fastened to a side that is of the first substrate 211 and that faces the rigid board portion 11, and some are fastened to the side that is of the first substrate 211 and that is away from the rigid board portion 11. The first package layer 241 may further package at least one chip-matching component 232 on the first substrate 211. The second package layer 242 may further package at least one chip-matching component 232 on the side that is of the first substrate 211 and that is away from the rigid hoard portion 11.

In this embodiment, the main control module 20 has components arranged on all of a side that is of the rigid board portion 11 and that faces the first substrate 211, the side that is of the first substrate 211 and that faces the rigid board portion 11, and the side that is of the first substrate 211 and that is away from the rigid board portion 11. In this way, three layers of components are stacked in a direction perpendicular to the rigid board portion 11. Therefore, the main control module 20 and the headset body 100 have a relatively high component arrangement density and a relatively high component integration degree.

In some embodiments, as shown in FIG. 15, the first package layer 241 may perform full-size package on components fastened to the side that is of the first substrate 211 and that faces the rigid board portion 11, and the second package layer 242 may perform partial package on components fastened to the side that is of the first substrate 211 and that is away from the rigid board portion 11. At least one second component 234 may be further disposed on the side that is of the first substrate 211 and that is away from the rigid board portion 11. The second component 234 is a component not suitable for plastic package. The at least one second component 234 is located on an outer side of the second package layer 242. In some other embodiments, the second component 234 may not be disposed on the first substrate 211, and the second package layer 242 performs full-size package on components fastened to the side that is of the first substrate 211 and that is away from the rigid board portion 11.

It can be understood that, in the foregoing embodiments, the stack assembly 2 is located on a same side of the rigid board portion 11. The following embodiments describe a solution in which the stack assembly 2 is partially located on one side of the rigid board portion 11 and partially located on the other side of the rigid board portion 11. A portion of the stack assembly 2 that is located on the side that is of the rigid board portion 11 and that faces the first substrate 211 is referred to as an upper stack portion for short, and a portion of the stack assembly 2 that is located on the side that is of the rigid board portion 11 and that is away from the first substrate 211 is referred to as a lower stack portion for short.

Figure 16:
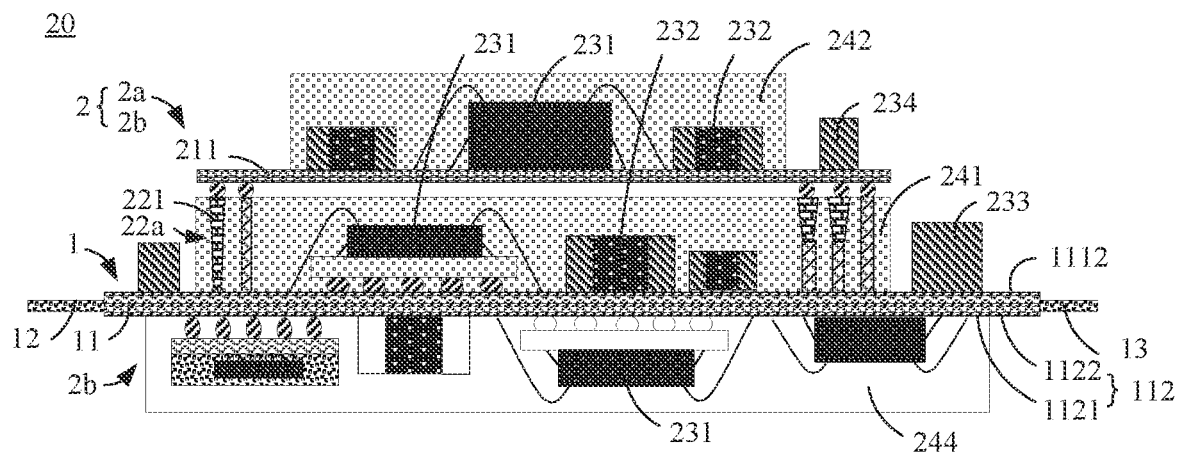
FIG. 16 is a schematic diagram of a structure of the main control module shown in FIG. 2 in a fifth embodiment.

FIG. 16 is a schematic diagram of a structure of the main control module 20 shown in FIG. 2 in a fifth embodiment. The following mainly describes a difference between the fifth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211, a first support member 22a, a first package layer 241, a second package layer 242, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11. At least two of the plurality of chips 231 are fastened to the rigid board portion 11, and at least one of the plurality of chips 231 is fastened to the first substrate 211.

The first support member 22a includes a plurality of first elevating pillars 221. The plurality of first elevating pillars 221 are located between the rigid board portion 11 and the first substrate 211 and are fastened to the rigid board portion 11. For a structure of the first elevating pillars 221, refer to the related description of the foregoing elevating pillar structure. The first package layer 241 is located between the rigid board portion 11 and the first substrate 211. The first package layer 241 packages the plurality of first elevating pillars 221 and at least one chip 231 on the rigid board portion 11. The first package layer 241 further packages at least one chip-matching component 232. The first substrate 211 is welded to the plurality of first elevating pillars 221. The second package layer 242 is located on a side that is of the first substrate 211 and that is away from the rigid board portion 11. The second package layer 242 packages at least one chip 231 on the first substrate 211. The second package layer 242 further packages at least one chip-matching component 232.

The lower stack portion 2b may include a fourth package layer 244. The fourth package layer 244 is fastened to a side that is of the rigid board portion 11 and that is away from the first substrate 211. At least one of the chip 231 fastened to the rigid board portion 11 is packaged in the fourth package layer 244. In other words, sonic of the chips 231 fastened to the rigid board portion 11 are located on a side that is of the rigid board portion 11 and that faces the first substrate 211, and some are located on the side that is of the rigid board portion 11 and that is away from the first substrate 211.

In this embodiment, the main control module 20 has components arranged on all of the side that is of the rigid board portion 11 and that is away from the first substrate 211, the side that is of the rigid board portion 11 and that faces the first substrate 211, and the side that is of the first substrate 211 and that is away from the rigid board portion 11. In this way, three layers of components are stacked in a direction perpendicular to the rigid board portion 11. Therefore, the main control module 20 and the headset body 100 have a relatively high component arrangement density and a relatively high component integration degree.

In some embodiments, as shown in FIG. 16, at least one first component 233 may be fastened to a first non-package region 1112 of the rigid board portion 11. The first component 233 is a component not suitable for plastic package. The second package layer 242 performs partial package on components fastened to the side that is of the first substrate 211 and that is away from the rigid board portion 11. At least one second component 234 may be further disposed on the side that is of the first substrate 211 and that is away from the rigid board portion 11. The second component 234 is a component not suitable for plastic package. The at least one second component 234 is located on an outer side of the second package layer 242. In some other embodiments, the second component 234 may not be disposed on the first substrate 211, and the second package layer 242 performs full-size package on components fastened to the side that is of the first substrate 211 and that is away from the rigid board portion 11.

In some embodiments, as shown in FIG. 16, the rigid board portion 11 further includes a second surface 112 away from the first substrate 211, and the second surface 112 is disposed opposite to a first surface 111. The second surface 112 includes a second package region 1121 and a second non-package region 1122 located around the second package region 1121. Areas and locations of the second package region 1121 and a first package region 1111 may be the same or different. In this embodiment, an example in which the second package region 1121 covers the first package region 1111 and the area of the second package region 1121 is greater than that of the first package region 1111 is used for description. The fourth package layer 244 is fastened to the second package region 1121, and a spacing is formed between an edge of the fourth package layer 244 and an edge of the rigid hoard portion 11. For example, the fourth package layer 244 may package all components fastened to the side that is of the rigid board portion 11 and that is away from the first substrate 211.

In this embodiment, components may be mounted on the first surface 111 of the rigid board portion 11 to form the first package layer 241, and then components may be mounted on the second surface 112 of the rigid board portion 11 to form the second package layer 242. Subsequently, a package structure including the first substrate 211 and components mounted thereto is fastened above the first package layer 241, to form the main control module 20.

Figure 17:
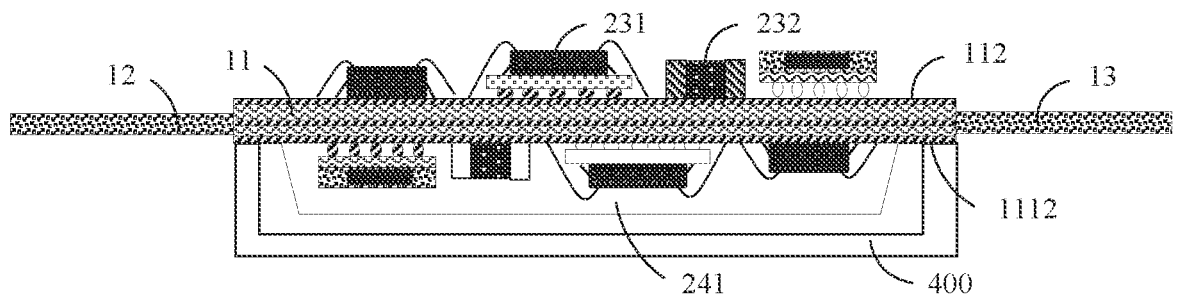
FIG. 17 is schematic diagram 1 of a structure of the main control module shown in FIG. 16 in a preparation process.
Figure 18:
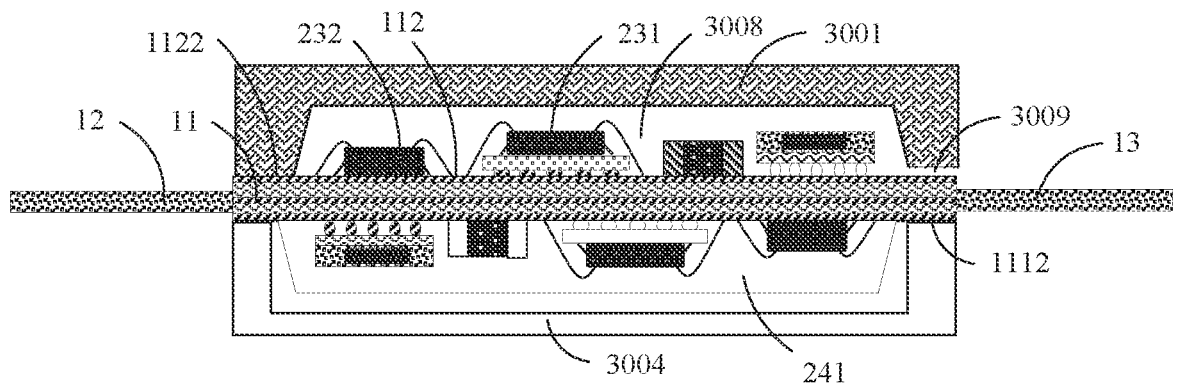
FIG. 18 is schematic diagram 2 of a structure of the main control module shown in FIG. 16 in a preparation process.
Figure 19:
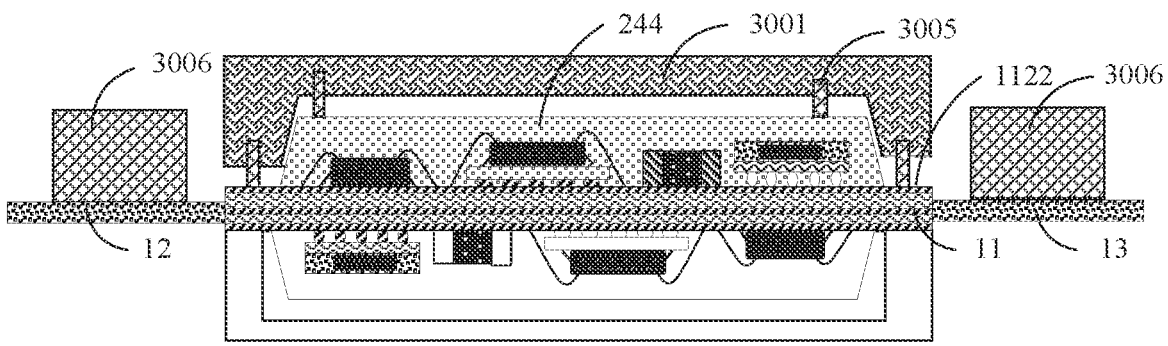
FIG. 19 is schematic diagram 3 of a structure of the main control module shown in FIG. 16 in a preparation process.

FIG. 17 is schematic diagram 1 of a structure of the main control module 20 shown in FIG. 16 in a preparation process. FIG. 18 is schematic diagram 2 of a structure of the main control module 20 shown in FIG. 16 in a preparation process. FIG. 19 is schematic diagram 3 of a structure of the main control module 20 shown in FIG. 16 in a preparation process. FIG. 17 corresponds to a process of fastening components to the second surface 112. FIG. 18 corresponds to a molding process of the fourth package layer 244. FIG. 19 corresponds to a demolding process of the fourth package layer 244.

For a process of fastening components to the first surface 111 of the rigid board portion 11 and a process of preparing the first package layer 241, refer to the related descriptions in FIG. 10 to FIG. 12 above.

As shown in FIG. 17, in a process of fastening a plurality of components (including the chips 231 and the chip-matching components 232) to the second surface 112, a support frame 400 abuts against the first non-package region 1112 to support the rigid board portion 11, so that the plurality of components can be well fastened to the second surface 112. In this case, a middle portion of the support frame 400 is recessed to avoid the completed first package layer 241. The support frame 400 is not in contact with the first flexible board portion 12 and the second flexible board portion 13, to avoid damaging the first flexible board portion 12 and the second flexible board portion 13. In some embodiments, the support frame 400 may further abut against the first package layer 241 at the same time to further support the rigid board portion 11 by using the first package layer 241, so that the rigid board portion 11 can obtain more balanced support. Fixing manners of the plurality of components include but are not limited to surface-mounting, welding, bonding, adhesive-bonding, and the like.

As shown in FIG. 18, in the molding process of the fourth package layer 244, an upper mold 3001 of an injection device abuts against the second non-package region 1122 of the rigid board portion 11, and forms a package space 3008 with the second surface 112 of the rigid board portion 11. A chip 231 and a chip-matching component 232 that are fastened to the second surface 112 are located inside the package space 3008. A side that is of the upper mold 3001 and that faces the second surface 112 of the rigid board portion 11 forms an adhesive injection port 3009. The adhesive injection port 3009 communicates with the package space 3008. A package material can be injected into the package space 3008 from the adhesive injection port 3009, to form the fourth package layer 244 in the package space 3008. A lower mold 3004 of the injection device is located on a side that is of the rigid board portion 11 and that is away from the upper mold 3001, and abuts against the first non-package region 1112. The upper mold 3001 and the lower mold 3004 are not in contact with the first flexible board portion 12 and the second flexible board portion 13, to avoid damaging the first flexible board portion 12 and the second flexible board portion 13.

As shown in FIG. 19, after the fourth package layer 244 is completed, a plurality of ejector pins 3005 extend from the upper mold 3001. Some of the ejector pins 3005 push against the second non-package region 1122 of the rigid board portion 11, and some of the ejector pins 3005 push against the fourth package layer 244, to separate the upper mold 3001 from the fourth package layer 244. The injection device may be further provided with an auxiliary pushing block 3006. The auxiliary pushing block 3006 is configured to push against the first flexible board portion 12 and the second flexible board portion 13, to help in demolding. A contact area between the auxiliary pushing block 3006 and each of the first flexible board portion 12 and the second flexible board portion 13 is large, to prevent the first flexible board portion 12 or the second flexible board portion 13 from being damaged by an excessively large local stress.

It can be understood that, the structure of the upper stack portion 2a of the stack assembly 2 in the fifth embodiment shown in FIG. 16 is the same as or similar to the structure of the stack assembly 2 in the first embodiment shown in FIG. 8. In some other embodiments, the upper stack portion 2a in the fifth embodiment may be provided with a structure same as or similar to that of the stack assembly 2 in the second to the fourth embodiments, so as to form a main control module 20 having a structure different from that in the foregoing embodiments. In some other embodiments, the upper stack portion 2a of the stack assembly 2 may be provided with a structure same as or similar to that of the stack assembly 2 in the first to the fourth embodiments, and the lower stack portion 2b of the stack assembly 2 may also be provided with a structure same as or similar to that of the stack assembly 2 in the first to the fourth embodiments, so as to form a plurality of types of main control modules 20 having a structure different from that in the foregoing embodiments. The following provides an example for description.

Figure 20:
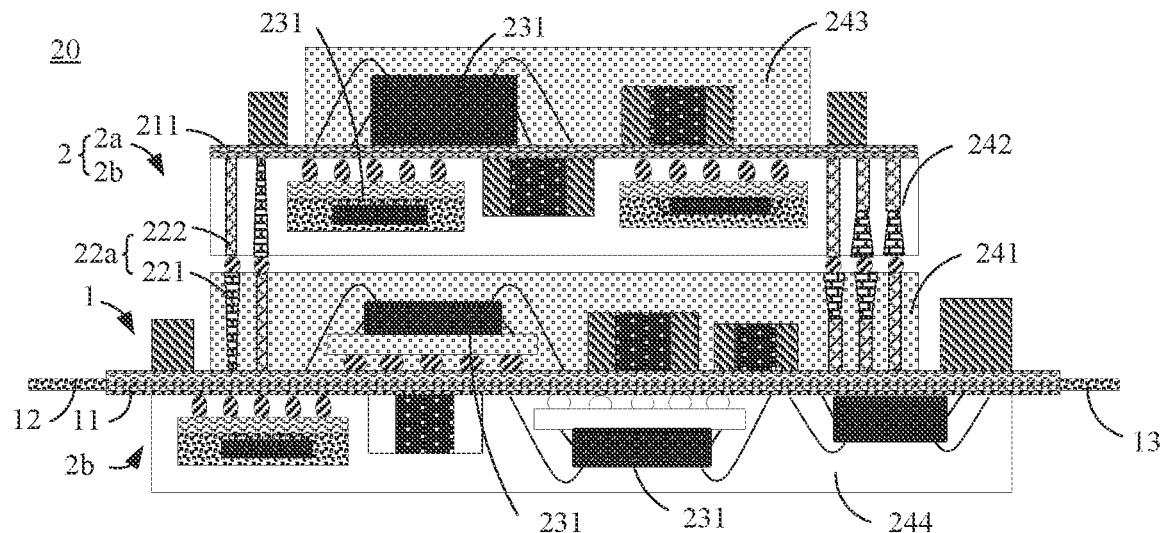
FIG. 20 is a schematic diagram of a structure of the main control module shown in FIG. 2 in a sixth embodiment.

FIG. 20 is a schematic diagram of a structure of the main control module 20 shown in FIG. 2 in a sixth embodiment. The following mainly describes a difference between the sixth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211, a first support member 22a, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11. At least one of the plurality of chips 231 is fastened to the rigid board portion 11, and at least one of the plurality of chips 231 is fastened to the first substrate 211.

The first support member 22a includes a plurality of first elevating pillars 221 and a plurality of second elevating pillars 222. The first elevating pillars 221 and the second elevating pillars 222 are stacked. The plurality of first elevating pillars 221 are fastened to the rigid board portion 11. The plurality of second elevating pillars 222 are fastened to the first substrate 211. The plurality of second elevating pillars 222 are welded to the plurality of first elevating pillars 221 in one-to-one correspondences.

The upper stack portion 2a further includes a first package layer 241, a second package layer 242, and a third package layer 243. The first package layer 241 is located between the rigid board portion 11 and the first substrate 211. The first package layer 241 packages the plurality of first elevating pillars 221 and at least one chip 231 on the rigid board portion 11. The second package layer 242 is located on a side that is of the first substrate 211 and that faces the rigid board portion 11. The second package layer 242 packages the plurality of second elevating pillars 222 and at least one chip 231 on the first substrate 211. The third package layer 243 is located on a side that is of the first substrate 211 and that is away from the rigid board portion 11. The third package layer 243 packages at least one chip 231 on the first substrate 211.

The lower stack portion 2b includes a fourth package layer 244 and at least one chip 231. The fourth package layer 244 is located on a side that is of the rigid board portion 11 and that is away from the first substrate 211. The fourth package layer 244 packages at least one chip 231 on the rigid board portion 11.

In this embodiment, the main control module 20 has components arranged on all of both sides of the rigid board portion 11 and both sides of the first substrate 211. In this way, four layers of components are stacked in a direction perpendicular to the rigid board portion 11. Therefore, the main control module 20 and the headset body 100 have a relatively high component arrangement density and a relatively high component integration degree.

Figure 21:
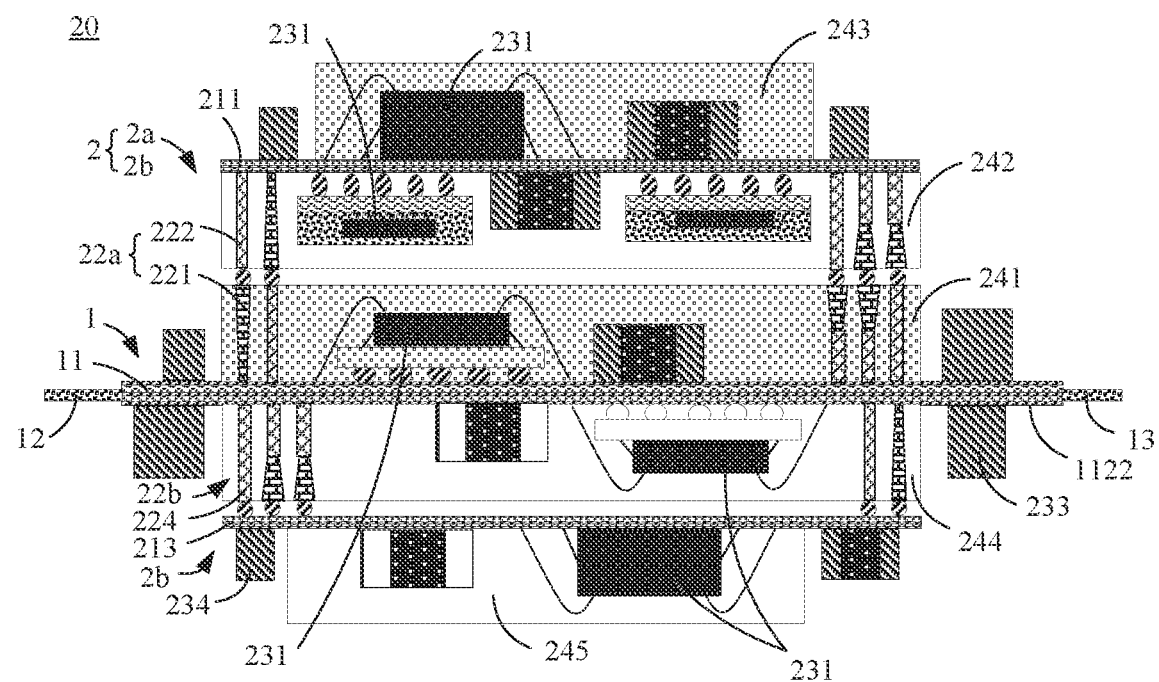
FIG. 21 is a schematic diagram of a structure of the main control module shown in FIG. 2 in a seventh embodiment.

FIG. 21 is a schematic diagram of a structure of the main control module 20 shown in FIG. 2 in a seventh embodiment. The following mainly describes a difference between the seventh embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211 and a first support member 22a. The first substrate 211 and the rigid board portion 11 are stacked at a space from each other. The first support member 22a is located between the first substrate 211 and the rigid board portion 11, and abuts against each of the first substrate 211 and the rigid board portion 11. The lower stack portion 2b includes a third substrate 213 and a second support member 22b. The third substrate 213 is located on a side that is of the rigid board portion 11 and that is away from the first substrate 211. The third substrate 213 and the rigid board portion 11 are stacked at a space from each other. The second support member 22b is located between the third substrate 213 and the rigid board portion 11, and abuts against each of the third substrate 213 and the rigid board portion 11.

The stack assembly 2 includes a plurality of chips 231. At least one of the plurality of chips 231 is fastened to the rigid board portion 11, at least one of the plurality of chips 231 is fastened to the first substrate 211, and at least one of the plurality of chips 231 is fastened to the third substrate 213. The chip 231 fastened to the first substrate 211 is electrically connected to the rigid board portion 11 by using the first support member 22a. The chip 231 fastened to the third substrate 213 is electrically connected to the rigid board portion 11 by using the second support member 22b.

The first support member 22a includes a plurality of first elevating pillars 221 and a plurality of second elevating pillars 222. The first elevating pillars 221 and the second elevating pillars 222 are stacked. The plurality of first elevating pillars 221 are fastened to the rigid board portion 11. The plurality of second elevating pillars 222 are fastened to the first substrate 211. The plurality of second elevating pillars 222 are welded to the plurality of first elevating pillars 221 in one-to-one correspondences. The second support member 22b includes a plurality of fourth elevating pillars 224, and the plurality of fourth elevating pillars 224 are fastened to the rigid board portion 11. The third substrate 213 is welded to the plurality of fourth elevating pillars 224, and the chip 231 fastened to the third substrate 213 is located on a side that is of the third substrate 213 and that is away from the rigid board portion 11.

The upper stack portion 2a further includes a first package layer 241, a second package layer 242, and a third package layer 243. The first package layer 241 is located between the rigid board portion 11 and the first substrate 211. The first package layer 241 packages the plurality of first elevating pillars 221 and at least one chip 231 on the rigid board portion 11. The second package layer 242 is located on a side that is of the first substrate 211 and that faces the rigid board portion 11. The second package layer 242 packages the plurality of second elevating pillars 222 and at least one chip 231 on the first substrate 211. The third package layer 243 is located on a side that is of the first substrate 211 and that is away from the rigid board portion 11. The third package layer 243 packages at least one chip 231 on the first substrate 211.

The lower stack portion 2b further includes a fourth package layer 244 and a fifth package layer 245. The fourth package layer 244 is located on the side that is of the rigid board portion 11 and that is away from the first substrate 211. The fourth package layer 244 packages the plurality of fourth elevating pillars 224 and at least one chip 231 on the rigid board portion 11. The fifth package layer 245 is located on the side that is of the third substrate 213 and that is away from the rigid board portion 11. The fifth package layer 245 packages at least one chip 231 on the third substrate 213.

At least one first component 233 may be fastened to a first non-package region 1112 of the rigid hoard portion 11. The first component 233 is a component not suitable for plastic package. At least one first component 233 may be further fastened to a second non-package region 1122 of the rigid board portion 11. At least one second component 234 may be fastened to the side that is of the first substrate 211 and that is away from the rigid board portion 11. The second component 234 is a component not suitable for plastic package. The second component 234 is located on an outer side of the third package layer 243. At least one second component 234 may be fastened to the side that is of the third substrate 213 and that is away from the rigid board portion 11. The second component 234 is located on an outer side of the fifth package layer 245.

In this embodiment, the main control module 20 has components arranged on all of both sides of the rigid board portion 11, both sides of the first substrate 211, and the side that is of the third substrate 213 and that is away from the rigid board portion 11. In this way, five layers of components are stacked in a direction perpendicular to the rigid board portion 11. Therefore, the main control module 20 and the headset body 100 have a relatively high component arrangement density and a relatively high component integration degree.

Figure 22:
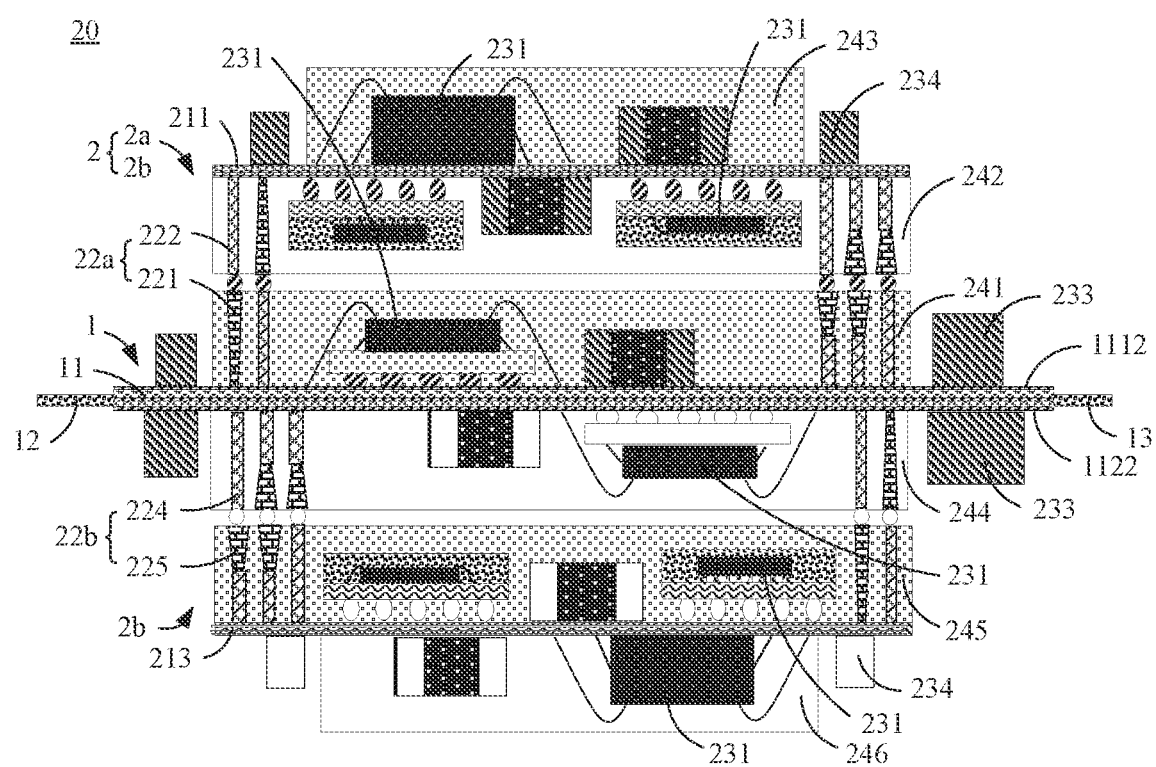
FIG. 22 is a schematic diagram of a structure of the main control module shown in FIG. 2 in an eighth embodiment.

FIG. 22 is a schematic diagram of a structure of the main control module 20 shown in FIG. 2 in an eighth embodiment. The following mainly describes a difference between the eighth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211 and a first support member 22a. The first substrate 211 and the rigid board portion 11 are stacked at a space from each other. The first support member 22a is located between the first substrate 211 and the rigid board portion 11, and abuts against each of the first substrate 211 and the rigid board portion 11. The lower stack portion 2b includes a third substrate 213 and a second support member 22b. The third substrate 213 is located on a side that is of the rigid board portion 11 and that is away from the first substrate 211. The third substrate 213 and the rigid board portion 11 are stacked at a space from each other. The second support member 22b is located between the third substrate 213 and the rigid board portion 11, and abuts against each of the third substrate 213 and the rigid board portion 11.

The stack assembly 2 includes a plurality of chips 231. At least one of the plurality of chips 231 is fastened to the rigid board portion 11, at least one of the plurality of chips 231 is fastened to the first substrate 211, and at least one of the plurality of chips 231 is fastened to the third substrate 213. The chip 231 fastened to the first substrate 211 is electrically connected to the rigid board portion 11 by using the first support member 22a. The chip 231 fastened to the third substrate 213 is electrically connected to the rigid board portion 11 by using the second support member 22b.

The first support member 22a includes a plurality of first elevating pillars 221 and a plurality of second elevating pillars 222. The first elevating pillars 221 and the second elevating pillars 222 are stacked. The plurality of first elevating pillars 221 are fastened to the rigid board portion 11. The plurality of second elevating pillars 222 are fastened to the first substrate 211. The plurality of second elevating pillars 222 are welded to the plurality of first elevating pillars 221 in one-to-one correspondences. The second support member 22b includes a plurality of fourth elevating pillars 224 and a plurality of fifth elevating pillars 225. The fourth elevating pillars 224 and the fifth elevating pillars 225 are stacked. The plurality of fourth elevating pillars 224 are fastened to the rigid board portion 11. The plurality of fifth elevating pillars 225 are fastened to the third substrate 213. The plurality of fifth elevating pillars 225 are welded to the plurality of fourth elevating pillars 224 in one-to-one correspondences.

The upper stack portion 2a further includes a first package layer 241, a second package layer 242, and a third package layer 243. The first package layer 241 is located between the rigid board portion 11 and the first substrate 211. The first package layer 241 packages the plurality of first elevating pillars 221 and at least one chip 231 on the rigid board portion 11. The second package layer 242 is located on a side that is of the first substrate 211 and that faces the rigid board portion 11. The second package layer 242 packages the plurality of second elevating pillars 222 and at least one chip 231 on the first substrate 211. The third package layer 243 is located on a side that is of the first substrate 211 and that is away from the rigid board portion 11. The third package layer 243 packages at least one chip 231 on the first substrate 211.

The lower stack portion 211 further includes a fourth package layer 244, a fifth package layer 245, and a sixth package layer 246. The fourth package layer 244 is located on the side that is of the rigid board portion 11 and that is away from the first substrate 211. The fourth package layer 244 packages the plurality of fourth elevating pillars 224 and at least one chip 231 on the rigid board portion 11. The fifth package layer 245 is located on a side that is of the third substrate 213 and that faces the rigid board portion 11. The fifth package layer 245 packages the plurality of fifth elevating pillars 225 and at least one chip 231 on the third substrate 213. The sixth package layer 246 is located on the side that is of the third substrate 213 and that is away from the rigid board portion 11. The sixth package layer 246 packages at least one chip 231 on the third substrate 213.

At least one first component 233 may be fastened to a first non-package region 1112 of the rigid board portion 11. The first component 233 is a component not suitable for plastic package. At least one first component 233 may be further fastened to a second non-package region 1122 of the rigid board portion 11. At least one second component 234 may be fastened to the side that is of the first substrate 211 and that is away from the rigid board portion 11. The second component 234 is a component not suitable for plastic package. The second component 234 is located on an outer side of the third package layer 243. At least one second component 234 may be fastened to the side that is of the third substrate 213 and that is away from the rigid board portion 11. The second component 234 is located on an outer side of the sixth package layer 246.

In this embodiment, the main control module 20 has components arranged on all of both sides of the rigid board portion 11, both sides of the first substrate 211, and both sides of the third substrate 213. In this way, six layers of components are stacked in a direction perpendicular to the rigid board portion 11. Therefore, the main control module 20 and the headset body 100 have a relatively high component arrangement density and a relatively high component integration degree.

In this embodiment, the upper stack portion 2a and the lower stack portion 2b respectively located on both sides of the rigid board portion 11 are roughly symmetrically disposed, and the main control module 20 integrates more layers of components. Therefore, the component arrangement density is high.

Figure 23:
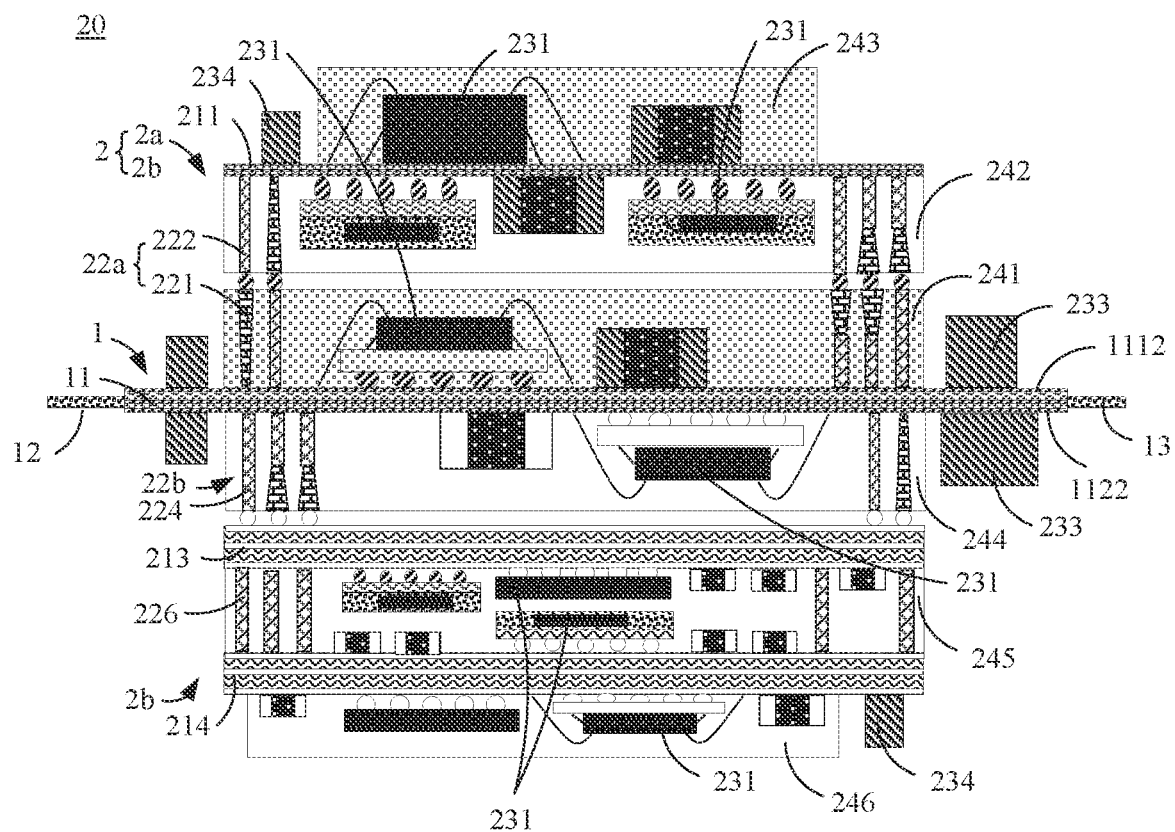
FIG. 23 is a schematic diagram of a structure of the main control module shown in FIG. 2 in a ninth embodiment.

FIG. 23 is a schematic diagram of a structure of the main control module 20 shown in FIG. 2 in a ninth embodiment. The following mainly describes a difference between the ninth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211 and a first support member 22a. The first substrate 211 and the rigid board portion 11 are stacked at a space from each other. The first support member 22a is located between the first substrate 211 and the rigid board portion 11, and abuts against each of the first substrate 211 and the rigid board portion 11. The lower stack portion 2b includes a third substrate 213, a fourth substrate 214, and a plurality of sixth elevating pillars 226. The third substrate 213 is located on a side that is of the rigid board portion 11 and that is away from the first substrate 211. The third substrate 213 and the rigid board portion 11 are stacked at a space from each other. The second support member 22b is located between the third substrate 213 and the rigid board portion 11, and abuts against each of the third substrate 213 and the rigid board portion 11. The fourth substrate 214 is located on a side that is of the third substrate 213 and that is away from the rigid board portion 11. The fourth substrate 214 and the third substrate 213 are stacked at a space from each other. The plurality of sixth elevating pillars 226 are located between the fourth substrate 214 and the third substrate 213, and abut against each of the fourth substrate 214 and the third substrate 213.

The stack assembly 2 includes a plurality of chips 231. At least one of the plurality of chips 231 is fastened to the rigid board portion 11, at least one of the plurality of chips 231 is fastened to the first substrate 211, at least one of the plurality of chips 231 is fastened to the third substrate 213, and at least one of the plurality of chips 231 is fastened to the fourth substrate 214. The chip 231 fastened to the first substrate 211 is electrically connected to the rigid board portion 11 by using the first support member 22a. The chip 231 fastened to the third substrate 213 is electrically connected to the rigid board portion 11 by using the second support member 22b. The chip 231 fastened to the fourth substrate 214 is electrically connected to the rigid board portion 11 by using the sixth elevating pillars 226, the third substrate 213, and the second support member 22b.

The first support member 22a includes a plurality of first elevating pillars 221 and a plurality of second elevating pillars 222. The first elevating pillars 221 and the second elevating pillars 222 are stacked. The plurality of first elevating pillars 221 are fastened to the rigid board portion 11. The plurality of second elevating pillars 222 are fastened to the first substrate 211. The plurality of second elevating pillars 222 are welded to the plurality of first elevating pillars 221 in one-to-one correspondences. The second support member 22b includes a plurality of fourth elevating pillars 224 that are stacked, and the plurality of fourth elevating pillars 224 are fastened to the rigid board portion 11. The third substrate 213 is welded to the plurality of fourth elevating pillars 224.

The upper stack portion 2a further includes a first package layer 241, a second package layer 242, and a third package layer 243. The first package layer 241 is located between the rigid board portion 11 and the first substrate 211. The first package layer 241 packages the plurality of first elevating pillars 221 and at least one chip 231 on the rigid board portion 11. The second package layer 242 is located on a side that is of the first substrate 211 and that faces the rigid board portion 11. The second package layer 242 packages the plurality of second elevating pillars 222 and at least one chip 231 on the first substrate 211. The third package layer 243 is located on a side that is of the first substrate 211 and that is away from the rigid board portion 11. The third package layer 243 packages at least one chip 231 on the first substrate 211.

The lower stack portion 2b further includes a fourth package layer 244, a fifth package layer 245, and a sixth package layer 246. The fourth package layer 244 is located on the side that is of the rigid board portion 11 and that is away from the first substrate 211. The fourth package layer 244 packages the plurality of fourth elevating pillars 224 and at least one chip 231 on the rigid board portion 11. The fifth package layer 245 is located between the third substrate 213 and the fourth substrate 214. The fifth package layer 245 packages the plurality of sixth elevating pillars 226 and at least one chip 231 on the third substrate 213, and packages at least one chip 231 on the fourth substrate 214. The sixth package layer 246 is located on a side that is of the fourth substrate 214 and that is away from the third substrate 213. The sixth package layer 246 packages at least one chip 231 on the fourth substrate 214.

At least one first component 233 may be fastened to a first non-package region 1112 of the rigid board portion 11. The first component 233 is a component not suitable for plastic package. At least one first component 233 may be further fastened to a second non-package region 1122 of the rigid board portion 11. At least one second component 234 may be fastened to the side that is of the first substrate 211 and that is away from the rigid board portion 11. The second component 234 is a component not suitable for plastic package. The second component 234 is located on an outer side of the third package layer 243. At least one second component 234 may be fastened to the side that is of the fourth substrate 214 and that is away from the third substrate 213. The second component 234 is located on an outer side of the sixth package layer 246.

In this embodiment, the main control module 20 has components arranged on all of both sides of the rigid board portion 11, both sides of the first substrate 211, the side that is of the third substrate 213 and that is away from the rigid board portion 11, and both sides of the fourth substrate 214. In this way, seven layers of components are stacked in a direction perpendicular to the rigid board portion 11. Therefore, the main control module 20 and the headset body 100 have a relatively high component arrangement density and a relatively high component integration degree.

Figure 24:
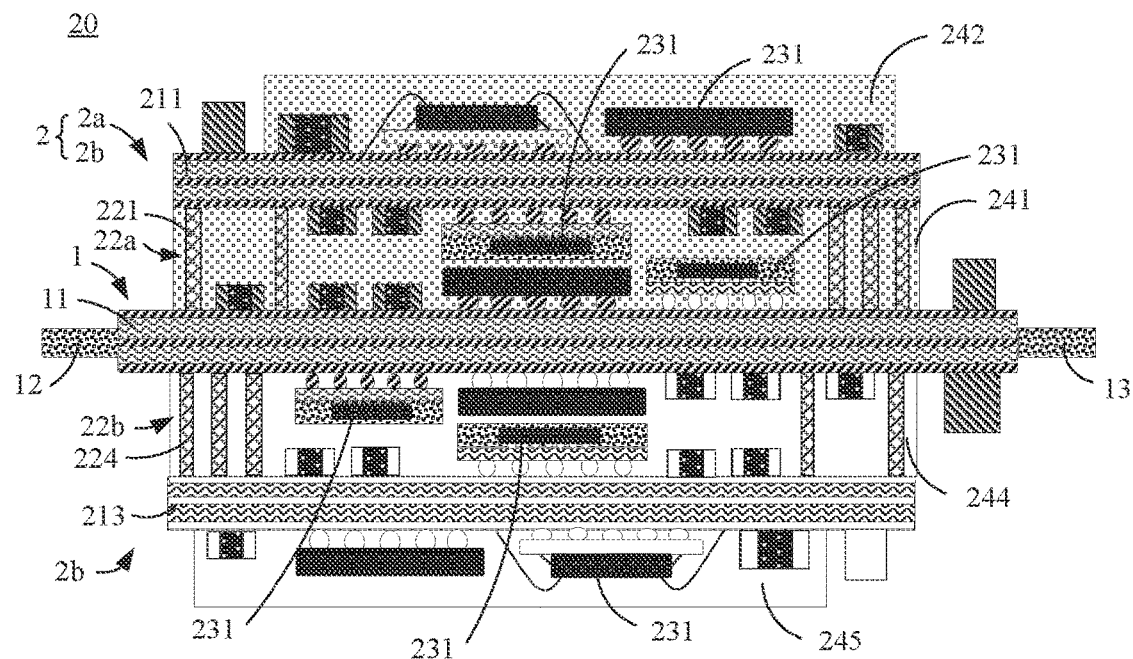
FIG. 24 is a schematic diagram of a structure of the main control module shown in FIG. 2 in a tenth embodiment.

FIG. 24 is a schematic diagram of a structure of the main control module 20 shown in FIG. 2 in a tenth embodiment. The following mainly describes a difference between the tenth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211 and a first support member 22a. The first substrate 211 and the rigid board portion 11 are stacked at a space from each other. The first support member 22a is located between the first substrate 211 and the rigid board portion 11, and abuts against each of the first substrate 211 and the rigid board portion 11. The lower stack portion 2b includes a third substrate 213 and a second support member 22b. The third substrate 213 is located on a side that is of the rigid board portion 11 and that is away from the first substrate 211, and the third substrate 213 and the rigid board portion 11 are stacked at a space from each other. The second support member 22b is located between the third substrate 213 and the rigid board portion 11, and abuts against each of the third substrate 213 and the rigid board portion 11. The first support member 22a includes a plurality of first elevating pillars 221, and the second support member 22b includes a plurality of fourth elevating pillars 224. For a structure of the first elevating pillars 221 and for the fourth elevating pillars 224, refer to the related description of the foregoing second pillar body 2202 (shown in FIG. 8).

The upper stack portion 2a further includes a first package layer 241 and a second package layer 242. The first package layer 241 is located between the rigid board portion 11 and the first substrate 211. The first package layer 241 packages the plurality of first elevating pillars 221 and at least one chip 231 on the rigid board portion 11, and packages at least one chip 231 on the first substrate 211. In this case, the first package layer 241 packages components located between the rigid board portion 11 and the first substrate 211. When the main control module 20 is prepared, the first substrate 211 may be fastened (for example, welded or bonded by using adhesive) to the plurality of first elevating pillars 221, and then a package material may be filled between the first substrate 211 and the rigid board portion 11 to form the first package layer 241, The second package layer 242 is fastened to a side that is of the first substrate 211 and that is away from the rigid board portion 11. The second package layer 242 packages at least one chip 231 on the first substrate 211.

The lower stack portion 2b further includes a fourth package layer 244 and a fifth package layer 245. The fourth package layer 244 is located between the rigid board portion 11 and the third substrate 213. The fourth package layer 244 packages the plurality of fourth elevating pillars 224 and at least one chip 231 on the rigid board portion 11, and packages at least one chip 231 on the third substrate 213. In this case, the fourth package layer 244 packages components located between the rigid board portion 11 and the third substrate 213. When the main control module 20 is prepared, the third substrate 213 may be fastened (for example, welded or bonded by using adhesive) to the plurality of fourth elevating pillars 224, and then a package material may be filled between the third substrate 213 and the rigid board portion 11 to form the fourth package layer 244. The fifth package layer 245 is fastened to a side that is of the third substrate 213 and that is away from the rigid board portion 11. The fifth package layer 245 packages at least one chip 231 on the third substrate 213.

In this embodiment, the main control module 20 has components arranged on all of both sides of the rigid board portion 11, both sides of the first substrate 211, and both sides of the third substrate 213. In this way, six layers of components are stacked in a direction perpendicular to the rigid board portion 11. Therefore, the main control module 20 and the headset body 100 have a relatively high component arrangement density and a relatively high component integration degree.

Figure 25:
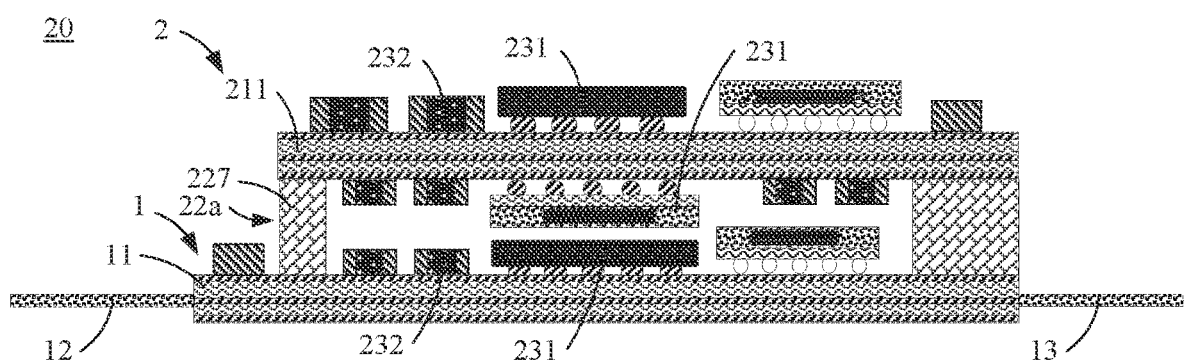
FIG. 25 is a schematic diagram of a structure of the main control module shown in FIG. 2 in an eleventh embodiment.

FIG. 25 is a schematic diagram of a structure of the main control module 20 shown in FIG. 2 in an eleventh embodiment. The following mainly describes a difference between the eleventh embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11.

The stack assembly 2 includes a first substrate 211, a first support member 22a, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11. At least one of the plurality of chips 231 is fastened to the rigid board portion 11, and at least one of the plurality of chips 231 is fastened to the first substrate 211. The first support member 22a is a first elevating plate 227, the first elevating plate 227 is a hollow structure, and at least one chip 231 is located on an inner side of the first elevating plate 227. The chip 231 fastened to the first substrate 211 is electrically connected to the rigid board portion 11 by using the first elevating plate 227. The first elevating plate 227 is a circuit board structure, and the first elevating plate 227 may be fastened to the rigid board portion 11 by assembly, or may be integrally molded with the rigid board portion 11.

In this embodiment, the main control module 20 supports a component arrangement space between the first substrate 211 and the rigid board portion 11 by using the first elevating plate 227, so that the main control module 20 can integrate at least two layers of components. In this way, a component arrangement density is increased, and the main control module 20 and the headset body 100 have a relatively high component integration degree.

The main control module 20 further includes a plurality of chip-matching components 232. At least one of the plurality of chip-matching components 232 is fastened to the rigid board portion 11, and at least one of the plurality of chip-matching components 232 is fastened to the first substrate 211.

In some embodiments, as shown in FIG. 25, components fastened to the rigid board portion 11 are all located on a side that is of the rigid board portion 11 and that faces the first substrate 211. Some of the components are located on an inner side of the first elevating plate 227, and some of the components are located on an outer side of the first elevating plate 227. In some other embodiments, components fastened to the rigid board portion 11 are all located on a side that is of the rigid board portion 11 and that faces the first substrate 211, and are located on an inner side of the first elevating plate 227. In still some embodiments, some of components fastened to the rigid board portion 11 are located on a side that is of the rigid board portion 11 and that faces the first substrate 211, and some are located on a side that is of the rigid board portion 11 and that is away from the first substrate 211.

In some embodiments, as shown in FIG. 25, some of components fastened to the first substrate 211 are located between the first substrate 211 and the rigid board portion 11, and some are located on a side that is of the first substrate 211 and that is away from the rigid board portion 11. The first elevating plate 227 is connected to a periphery of the first substrate 211, and components fastened to a side that is of the first substrate 211 and that faces the rigid board portion 11 are located on the inner side of the first elevating plate 227. In some other embodiments, components fastened to the first substrate 211 are located between the first substrate 211 and the rigid board portion 11 or on a side that is of the first substrate 211 and that is away from the rigid board portion 11.

Figure 26:
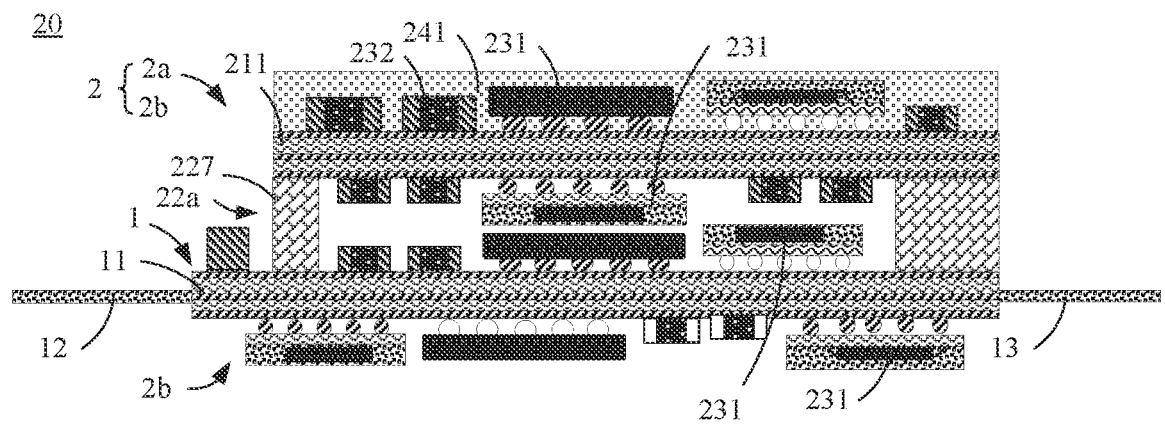
FIG. 26 is a schematic diagram of a structure of the main control module shown in FIG. 2 in a twelfth embodiment.

FIG. 26 is a schematic diagram of a structure of the main control module 20 shown in FIG. 2 in a twelfth embodiment. The following mainly describes a difference between the twelfth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion. 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211, a first support member 22a, and a plurality of chips 231. The first substrate 211 and the rigid hoard portion 11 are stacked at a space from each other. The first support member 22a is located between the first substrate 211 and the rigid board portion 11, and abuts against each of the first substrate 211 and the rigid board portion 11. At least one of the plurality of chips 231 is fastened to the rigid board portion 11, and at least one of the plurality of chips 231 is fastened to the first substrate 211. The first support member 22a is a first elevating plate 227, the first elevating plate 227 is a hollow structure, and at least one chip 231 is located on an inner side of the first elevating plate 227. The lower stack portion 2b includes at least one chip 231 fastened to a side that is of the rigid board portion 11 and that is away from the first substrate 211.

In this embodiment, at least one of the plurality of chips 231 is fastened to the side that is of the rigid board portion 11 and that is away from the first substrate 211, at least one of the plurality of chips 231 is fastened to a side that is of the rigid board portion 11 and that faces the first substrate 211, at least one of the plurality of chips 231 is fastened to a side that is of the first substrate 211 and that faces the rigid board portion 11, and at least one of the plurality of chips 231 is fastened to a side that is of the first substrate 211 and that is away from the rigid board portion 11. That is, components are arranged on both sides of the rigid board portion 11 and both sides of the first substrate 211. Therefore, the main control module 20 integrates four layers of components. A component arrangement density is high, and the main control module 20 and the headset body 100 have a high component integration degree.

The upper stack portion 2a further includes a first package layer 241. The first package layer 241 is located on the side that is of the first substrate 211 and that is away from the rigid board portion 11, and packages at least one chip 231. The first package layer 241 may further package at least one chip-matching component 232. The first package layer 241 may perform hill-size package (shown in FIG. 26) or partial package on components fastened to the side that is of the first substrate 211 and that is away from the rigid board portion 11.

Figure 27:
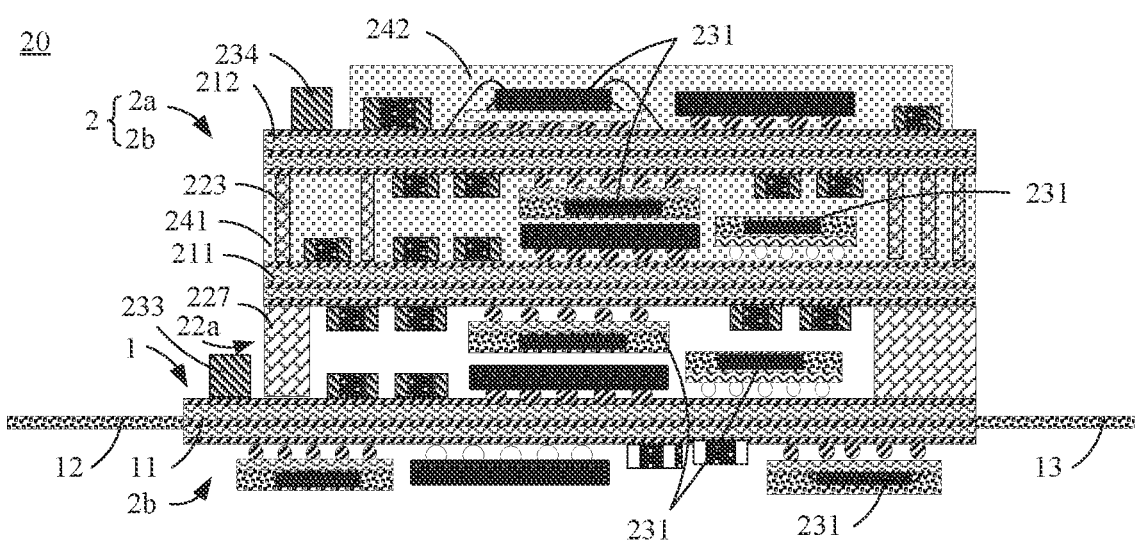
FIG. 27 is a schematic diagram of a structure of the main control module shown in FIG. 2 in a thirteenth embodiment.

FIG. 27 is a schematic diagram of a structure of the main control module 20 shown in FIG. 2 in a thirteenth embodiment. The following mainly describes a difference between the thirteenth embodiment and the foregoing embodiments, and most content same as that in the foregoing embodiments is not described again.

The main control module 20 includes a rigid-flexible circuit board 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211, a second substrate 212, a first support member 22a, a plurality of third elevating pillars 223, and a plurality of chips 231. The first substrate 211 and the rigid board portion 11 are stacked at a space from each other. The first support member 22a is located between the first substrate 211 and the rigid board portion 11, and abuts against each of the first substrate 211 and the rigid board portion 11. The second substrate 212 is located on a side that is of the first substrate 211 and that is away from the rigid board portion 11. The second substrate 212 and the first substrate 211 are stacked at a space from each other. The plurality of third elevating pillars 223 are located between the second substrate 212 and the first substrate 211, and abut against each of the second substrate 212 and the first substrate 211. At least one of the plurality of chips 231 is fastened to the rigid board portion 11, at least one of the plurality of chips 231 is fastened to the first substrate 211, and at least one of the plurality of chips 231 is fastened to the second substrate 212. The chip 231 fastened to the first substrate 211 is electrically connected to the rigid board portion 11 by using the first support member 22a. The chip 231 fastened to the second substrate 212 is electrically connected to the rigid board portion 11 by using the plurality of third elevating pillars 223, the first substrate 211, and the first support member 22a. The lower stack portion 2b includes at least one chip 231 fastened to a side that is of the rigid board portion 11 and that is away from the first substrate 211.

The first support member 22a is a first elevating plate 227, the first elevating plate 227 is a hollow structure, and at least one chip 231 is located on an inner side of the first elevating plate 227. The first elevating plate 227 is a circuit board structure, and the first elevating plate 227 may be fastened to the rigid board portion 11 by assembly, or may be integrally molded with the rigid board portion 11. The third elevating pillars 223 may use the structure of the second pillar body 2202 described above.

The upper stack portion 2a further includes a first package layer 241 and a second package layer 242. The first package layer 241 is located between the first substrate 211 and the second substrate 212, and is configured to package components between the first substrate 211 and the second substrate 212. The second package layer 242 is located on a side that is of the second substrate 212 and that is away from the first substrate 211. The second package layer 242 may perform partial package (shown in FIG. 27) or full-size package on components fastened to the side that is of the second substrate 212 and that is away from the first substrate 211.

In this embodiment, components are arranged on all of both sides of the rigid board portion 11, both sides of the first substrate 211, and both sides of the second substrate 212. The main control module 20 integrates six layers of components. A component arrangement density is high, and the main control module 20 and the headset body 100 have a high component integration degree. In another embodiment, components may be arranged on a single side of one or more of the rigid board portion 11, the first substrate 211, or the second substrate 212.

At least one second component 234 may be fastened to the side that is of the second substrate 212 and that is away from the first substrate 211. The second component 234 is a component not suitable for plastic package. The second component 234 is located on an outer side of the second package layer 242. At least one first component 233 may be fastened to the rigid board portion 11. The first component 233 is a component not suitable for plastic package. The first component 233 is located on an outer side of the first elevating plate 227.

Figure 28:
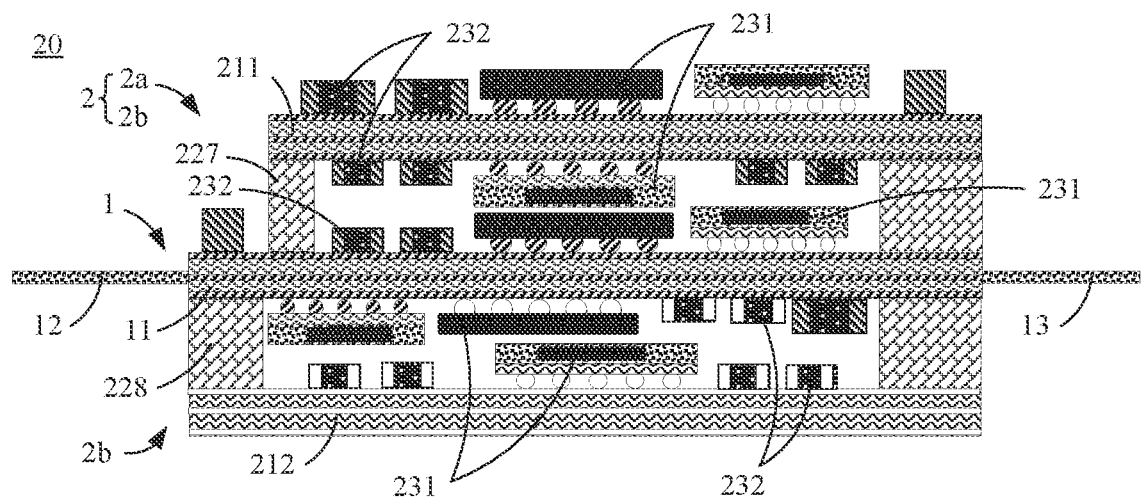
FIG. 28 is a schematic diagram of a structure of the main control module shown in FIG. 2 in a fourteenth embodiment.

FIG. 28 is a schematic diagram of a structure of the main control module 20 shown in FIG. 2 in a fourteenth embodiment. The following mainly describes a difference between the fourteenth embodiment and the foregoing embodiments, and most content same as that in the foregoing embodiments is not described again.

The main control module 20 includes a rigid-flexible circuit hoard 1 and a stack assembly 2. The rigid-flexible circuit board 1 includes a rigid board portion 11 and a first flexible board portion 12 and a second flexible board portion 13 that are connected to the rigid board portion 11. The stack assembly 2 is stacked on the rigid board portion 11. The stack assembly 2 includes an upper stack portion 2a and a lower stack portion 2b that are respectively located on both sides of the rigid board portion 11.

The upper stack portion 2a includes a first substrate 211 and a first elevating plate 227. The first substrate 211 and the rigid board portion 11 are stacked at a space from each other. The first elevating plate 227 is located between the first substrate 211 and the rigid board portion 11, and abuts against each of the first substrate 211 and the rigid board portion 11. The lower stack portion 2b includes a second substrate 212 and a second elevating plate 228. The second substrate 212 is located on a side that is of the rigid board portion 11 and that is away from the first substrate 211, and the second substrate 212 and the rigid board portion 11 are stacked at a space from each other. The second elevating plate 228 is located between the second substrate 212 and the rigid board portion 11, and abuts against each of the second substrate 212 and the rigid board portion 11.

The stack assembly 2 includes a plurality of chips 231. At least one of the plurality of chips 231 is fastened to the rigid board portion 11, at least one of the plurality of chips 231 is fastened to the first substrate 211, and at least one of the plurality of chips 231 is fastened to the second substrate 212. The first elevating plate 227 is a hollow structure, and at least one chip 231 is located on an inner side of the first elevating plate 227. The chip 231 fastened to the first substrate 211 is electrically connected to the rigid board portion 11 by using the first elevating plate 227. The second elevating plate 228 is a hollow structure, and at least one chip 231 is located on an inner side of the second elevating plate 228. The chip 231 fastened to the second substrate 212 is electrically connected to the rigid board portion 11 by using the second elevating plate 228.

In this embodiment, the main control module 20 has the first substrate 211 fastened to one side of the rigid board portion 11 by using the first elevating plate 227, and has the second substrate 212 fastened to the other side of the rigid board portion 11 by using the second elevating plate 228. In this way, a stack structure with three layers of circuit boards is formed, and components may be flexibly arranged on one side or both sides of each of the three layers of circuit boards to form a stack structure with at least three layers of components. Therefore, the main control module 20 has a high component arrangement density and a high component integration degree.

For example, as shown in FIG. 28, at least one chip 231 and at least one chip-matching component 232 are fastened to each of two sides of the rigid board portion 11, at least one chip 231 and at least one chip-matching component 232 are fastened to each of two sides of the first substrate 211, and at least one chip 231 and at least one chip-matching component 232 are fastened to a side that is of the second substrate 212 and that faces the rigid board portion 11, so that the main control module 20 forms a stack structure with five layers of components.

Figure 29:
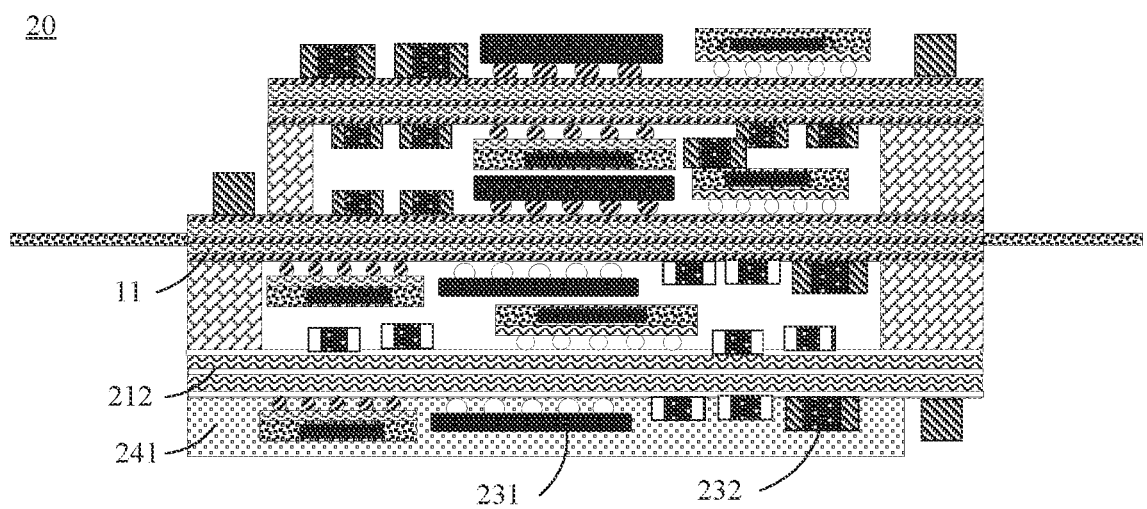
FIG. 29 is a schematic diagram of a structure of the main control module shown in FIG. 2 in a fifteenth embodiment.

FIG. 29 is a schematic diagram of a structure of the main control module 20 shown in FIG. 2 in a fifteenth embodiment. The following mainly describes a difference between the fifteenth embodiment and the foregoing embodiments, and most content same as that in the foregoing embodiments is not described again.

In this embodiment, at least one chip 231 and at least one chip-matching component 232 may be fastened to a side that is of the second substrate 212 and that is away from the rigid board portion 11, so that the main control module 20 forts a stack structure with six lavers of components. The main control module 20 further includes a first package layer 241. The first package layer 241 is located on the side that is of the second substrate 212 and that is away from the rigid board portion 11. The first package layer 241 may perform partial package (shown in FIG. 29) or full-size package on components fastened to the side that is of the second substrate 212 and that is away from the rigid board portion 11.

Figure 30:
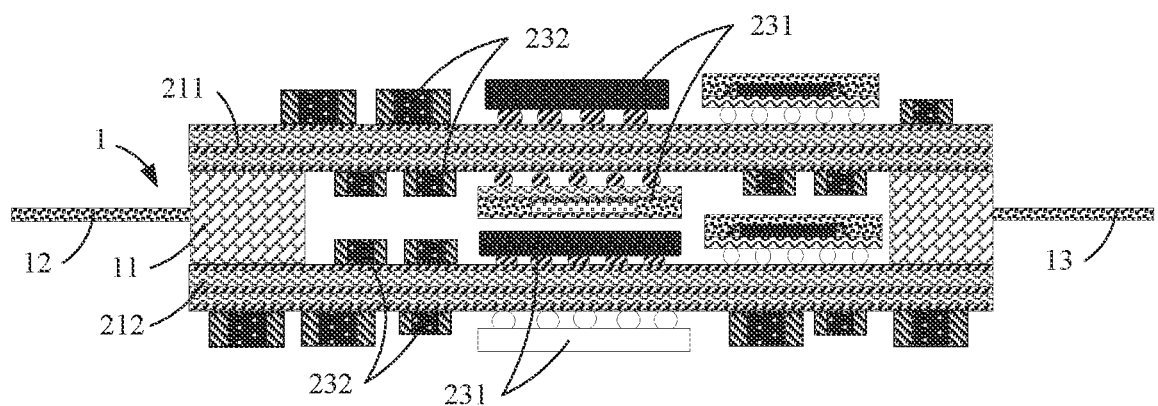
FIG. 30 is a schematic diagram of a structure of the main control module shown in FIG. 2 in a sixteenth embodiment.

FIG. 30 is a schematic diagram of a structure of the main control module 20 shown in FIG. 2 in a sixteenth embodiment. The following mainly describes a difference between the sixteenth embodiment and the foregoing embodiments, and most content same as that in the foregoing embodiments is not described again.

The main control module 20 includes a first substrate 211, a second substrate 212, a circuit board 1, and a plurality of chips 231. The rigid-flexible circuit board 1 includes a rigid board portion 11 and a first flexible board portion 12 and a second flexible board portion 13 that are connected to the rigid board portion 11. The rigid board portion 11 is a hollow structure. The rigid board portion 11 is located in the earbud portion 1002 (referring to FIG. 4). The first flexible board portion 12 is located in the earbud portion 1002 and has one end connected to the rigid board portion 11. One end of the second flexible board portion 13 is connected to the rigid board portion 11 and the other end thereof extends to the ear handle portion 1001 (referring to FIG. 4).

The first substrate 211 and the second substrate 212 are stacked at a space from each other. The rigid board portion 11 is fastened between the first substrate 211 and the second substrate 212. At least one of the plurality of chips 231 is fastened to the first substrate 211. At least one of the plurality of chips 231 is fastened to the second substrate 212. At least one chip 231 is located on an inner side of the rigid board portion 11. The chip 231 fastened to the first substrate 211 and the chip 231 fastened to the second substrate 212 are electrically connected to the rigid board portion 11.

In this embodiment, the rigid board portion 11 of the rigid-flexible circuit board 1 serves as an elevating structure between the first substrate 211 and the second substrate 212, so that a spacing is formed between the first substrate 211 and the second substrate 212. Components may be arranged on one side or both sides of the first substrate 211 and one side or both sides of the second substrate 212. Therefore, the main control module 20 integrates at least two layers of components that are stacked. In this way, a component arrangement density is relatively high, and the main control module 20 and the headset body 100 have a high component integration degree.

For example, in the embodiment shown in FIG. 30, at least one chip 231 and at least one chip-matching component 232 are arranged on each of two sides of the first substrate 211, and at least one chip 231 and at least one chip-matching component 232 are arranged on each of two sides of the second substrate 212. A component not suitable for plastic package may be further arranged on the first substrate 211 andlor the second substrate 212.

Figure 31:
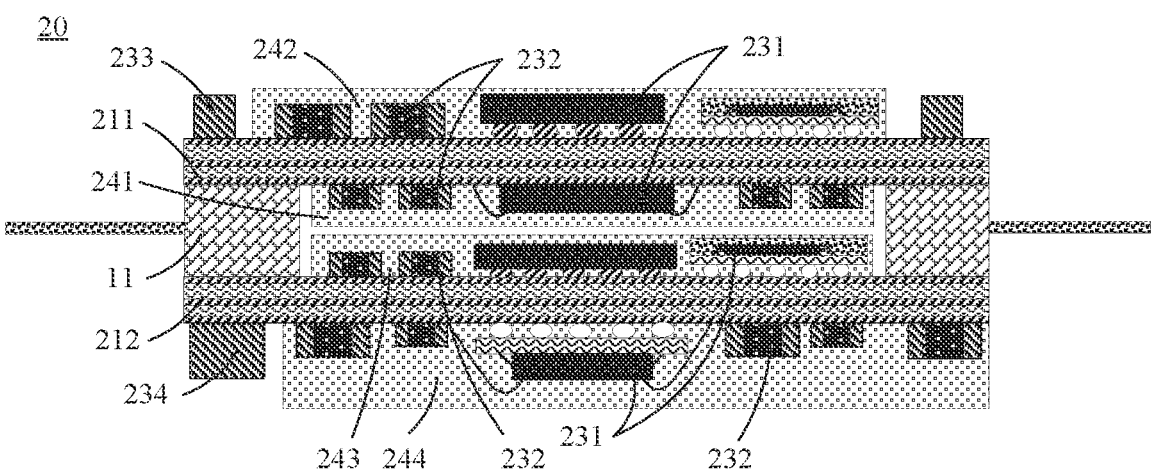
FIG. 31 is a schematic diagram of a structure of the main control module shown in FIG. 2 in a seventeenth embodiment.

FIG. 31 is a schematic diagram of a structure of the main control module 20 shown in FIG. 2 in a seventeenth embodiment. The following mainly describes a difference between the seventeenth embodiment and the foregoing embodiments, and most content same as that in the foregoing embodiments is not described again.

In this embodiment, the main control module 20 further includes a first package layer 241, a second package layer 242, a third package layer 243, and a fourth package layer 244. The first package layer 241 is located on a side that is of the first substrate 211 and that faces the second substrate 212. The first package layer 241 is located on an inner side of the rigid board portion 11. The first package layer 241 packages at least one chip 231, and may further package at least one chip-snatching component 232. The second package layer 242 is located on a side that is of the first substrate 211 and that is away from the second substrate 212. The second package layer 242 packages at least one chip 231, and may further package at least one chip-matching component 232. At least one first component 233 may be further fastened to the side that is of the first substrate 211 and that is away from the second substrate 212. The first component 233 is a component not suitable for plastic package. The first component 233 is located on an outer side of the second package layer 242.

The third package layer 243 is located on a side that is of the second substrate 212 and that faces the first substrate 211. The third package layer 243 is located on an inner side of the rigid board portion 11. The third package layer 243 packages at least one chip 231, and may further package at least one chip-matching component 231. The fourth package layer 244 is located on a side that is of the second substrate 212 and that is away from the first substrate 211. The fourth package layer 244 packages at least one chip 231, and may further package at least one chip-matching component 232. At least one second component 234 may be further fastened to the side that is of the second substrate 212 and that is away from the first substrate 211. The second component 234 is a component not suitable tar plastic package. The second component 234 is located on an outer side of the fourth package layer 244.

Figure 32:
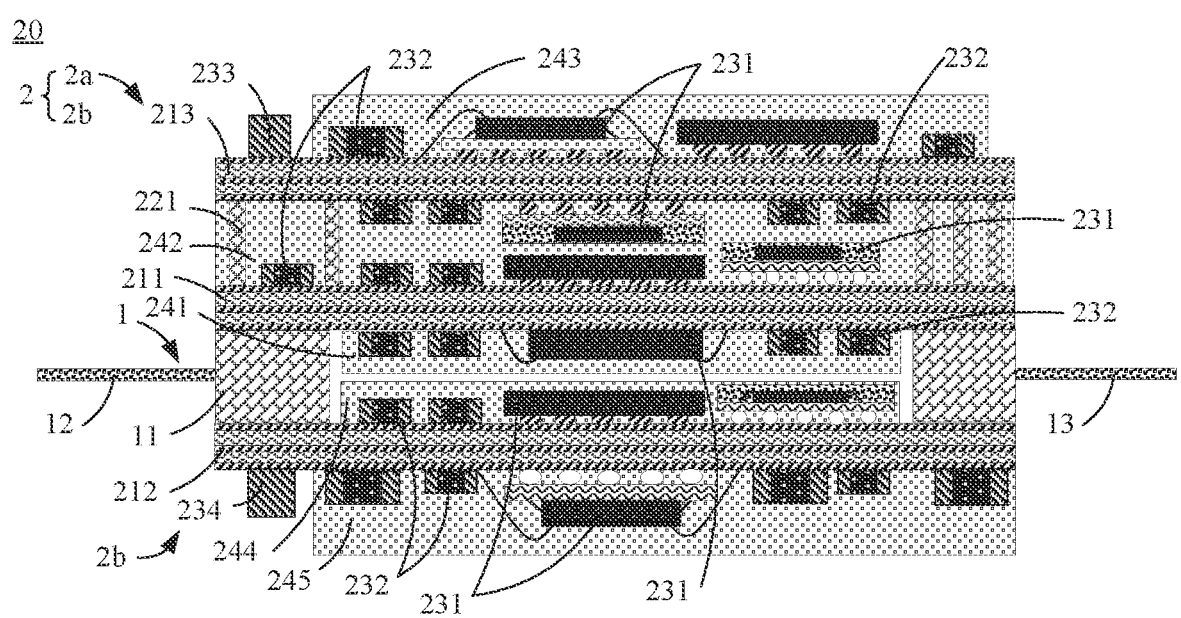
FIG. 32 is a schematic diagram of a structure of the main control module shown in FIG. 2 in an eighteenth embodiment.

FIG. 32 is a schematic diagram of a structure of the main control module 20 shown in FIG. 2 in an eighteenth embodiment. The following mainly describes a difference between the eighteenth embodiment and the foregoing embodiments, and most content same as that in the foregoing embodiments is not described again.

The main control module 20 includes a first substrate 211, a second substrate 212, a third substrate 213, a rigid-flexible circuit board 1, a plurality of first elevating pillars 221, and a plurality of chips 231. The rigid-flexible circuit board 1 includes a rigid board portion 11 and a first flexible board portion 12 and a second flexible board portion 13 that are connected to the rigid board portion 11. The rigid board portion 11 is a hollow structure. The first substrate 211 and the second substrate 212 are stacked at a space from each other. The rigid board portion 11 is fastened between the first substrate 211 and the second substrate 212. The third substrate 213 is located on a side that is of the first substrate 211 and that is away from the second substrate 212. The third substrate 213 and the first substrate 211 are stacked at a space from each other. The plurality of first elevating pillars 221 are fastened between the third substrate 213 and the first substrate 211. For the first elevating pillars 221, refer to the related description of the second pillar body 2202 (referring to FIG. 8).

At least one chip 231 and at least one chip-matching component 232 are distributed on each of both sides of the first substrate 211, both sides of the second substrate 212, and both sides of the third substrate 213. Components fastened to the third substrate 213 are electrically connected to the rigid board portion 11 by using the plurality of first elevating pillars 221 and the first substrate 211.

The main control module 20 further includes a first package layer 241, a second package layer 242, a third package layer 243, a fourth package layer 244, and a fifth package layer 245. The first package layer 241 is located on a side that is of the first substrate 211 and that faces the second substrate 212. The first package layer 241 is located on an inner side of the rigid board portion 11. The first package layer 241 packages at least two components. The second package layer 242 is located between the first substrate 211 and the third substrate 213. The second package layer 242 packages the plurality of first elevating pillars 221 and components located between the first substrate 211 and the third substrate 213. The third package layer 243 is located on a side that is of the third substrate 213 and that is away from the first substrate 211. The third package layer 243 packages at least two components. At least one first component 233 may be further fastened to the side that is of the third substrate 213 and that is away from the first substrate 211. The first component 233 is a component not suitable for plastic package. The first component 233 is located on an outer side of the third package layer 243.

The fourth package layer 244 is located on a side that is of the second substrate 212 and that faces the first substrate 211. The fourth package layer 244 is located on an inner side of the rigid board portion 11. The third package layer 243 packages at least two components. The fifth package layer 245 is located on a side that is of the second substrate 212 and that is away from the first substrate 211. The fifth package layer 245 packages at least two components. At least one second component 234 may be further fastened to the side that is of the second substrate 212 and that is away from the first substrate 211. The second component 234 is a component not suitable for plastic package. The second component 234 is located on an outer side of the fifth package lager 245.

In this embodiment, the main control module 20 includes three layers of circuit boards (the first substrate 211, the second substrate 212, and the third substrate 213) that are stacked. Components can be arranged on both sides of each circuit board, so that six layers of components are integrated. A component arrangement density is high, and the main control module 20 and the headset body 100 have a high component integration degree.

The foregoing descriptions are merely specific implementations of this application, but are not intended to limit the protection scope of this application. Any variation or replacement readily figured out by a person skilled in the art within the technical scope disclosed in this application shall fall within the protection scope of this application. When no conflict occurs, embodiments of this application and the features in embodiments may be combined with each other. Therefore, the protection scope of this application shall be subject to the protection scope of the claims.

What is claimed is:

1. A wireless headset comprising:
an ear handle portion;
an earbud portion coupled to the ear handle portion; and a main control comprising:
  a rigid-flexible circuit board-comprising:
    a rigid board portion located in the earbud portion;
    a first flexible board portion located in the earbud portion and comprising a first end coupled to the rigid board portion; and
    a second flexible board portion comprising:
      a second end coupled to the rigid board portion; and
      a third end configured to extend to the ear handle portion;
  a first substrate, wherein the first substrate and the rigid board portion are stacked at a first space from each other;
  a first support member located between the first substrate and the rigid board portion and configured to abut against each of the first substrate and the rigid board portion, wherein the first support member comprises a plurality of first elevating pillars located between the rigid board portion and the first substrate and fastened to the rigid board portion; and
  a first package layer located between the rigid board portion and the first substrate, wherein the first package layer is configured to package the first elevating pillars; and
  a plurality of chips comprising:
    a first chip fastened to the rigid board portion and packaged in the first package layer; and
    a second chip fastened to the first substrate and electrically coupled to the rigid board portion using the first support member.

2. The wireless headset of claim 1, wherein the rigid board portion comprises a first surface facing the first substrate, wherein the first surface comprises a first package region and a first non-package region located around the first package region, and wherein the first package layer is located in the first package region.

3. The wireless headset of claim 2, wherein the main control further comprises at least one first component fastened to the first non-package region.

4. The wireless headset of claim 1, wherein the first substrate is welded to the first elevating pillars, wherein the main control further comprises a second package layer located on a first side of the first substrate facing away from the rigid board portion, and wherein the second package layer is configured to package the second chip.

5. The wireless headset of claim 1, wherein the first support member further comprises a plurality of second elevating pillars fastened to a second side of the first substrate facing the rigid board portion, wherein the second elevating pillars are welded to the first elevating pillars in one-to-one correspondences, and wherein the main control further comprises:
  a second package layer located on a first side of the first substrate facing away from the rigid board portion and configured to package the second chip; and
  a third package layer located on the second side and configured to package the second elevating pillars and the second chip.

6. The wireless headset of claim 4, wherein the main control further comprises at least one second component fastened to the first side and located on an outer side of the second package layer.

7. The wireless headset of claim 5, wherein the main control further comprises at least one second component fastened to the first side and located on an outer side of the second package layer.

8. The wireless headset of claim 1, wherein the first substrate is welded to the first elevating pillars, wherein the second chip is located on a first side of the first substrate facing away from the rigid board portion, and wherein the main control further comprises:
  a second substrate located on the first side, wherein the second substrate and the first substrate are stacked at a second space from each other;
  a plurality of third elevating pillars located between the second substrate and the first substrate and configured to abut against each of the second substrate and the first substrate;
  a second package layer located between the second substrate and the first substrate, wherein the third elevating pillars and the second chip are packaged in the second package layer, and wherein a third chip of the chips is packaged in the second package layer and fastened to the second substrate; and
  a third package layer located on a second side of the second substrate facing away from the first substrate, wherein a fourth chip of the chips is packaged in the third package layer and fastened to the second substrate, and
  wherein each of the third chip and the fourth chip is electrically coupled to the rigid board portion using the third elevating pillars, the first substrate, and the first elevating pillars.

9. The wireless headset of claim 1, wherein the first package layer is in contact with the first substrate, wherein the main control further comprises a second package layer fastened to a first side of the first substrate facing away from the rigid board portion, wherein a first portion of the chips fastened to the first substrate are packaged in the first package layer, and wherein a second portion of the chips fastened to the first substrate are packaged in the second package layer.

10. The wireless headset of claim 2, wherein the first package layer is in contact with the first substrate, wherein the main control further comprises a second package layer fastened to a first side of the first substrate facing away from the rigid board portion, wherein a first portion of the chips fastened to the first substrate are packaged in the first package layer, and wherein a second portion of the chips fastened to the first substrate are packaged in the second package layer.

11. The wireless headset of claim 1, wherein the main control further comprises a fourth package layer fastened to a first side of the rigid board portion facing away from the first substrate, and wherein the first chip is packaged in the fourth package layer.

12. The wireless headset of claim 1, wherein the main control further comprises:
  a third substrate located on a first side of the rigid board portion facing away from the first substrate, wherein the third substrate and the rigid board portion are stacked at a third space from each other; and
  a second support member located between the third substrate and the rigid board portion and configured to abut against each of the third substrate and the rigid board portion, wherein a third chip of the chips is fastened to the third substrate and electrically coupled to the rigid board portion using the second support member.

13. The wireless headset of claim 1, wherein the first support member is a first elevating plate, wherein the first elevating plate is a first hollow structure comprising a first inner side, and wherein a third chip of the chips is located on the first inner side.

14. The wireless headset of claim 13, wherein the main control further comprises:
a second substrate located on a first side of the rigid board portion facing away from the first substrate, wherein the second substrate and the rigid board portion are stacked at a fourth space from each other; and
a second elevating plate located between the second substrate and the rigid board portion and configured to abut against each of the second substrate and the rigid board portion, wherein a fourth chip of the chips is fastened to the second substrate and electrically coupled to the rigid board portion using the second elevating plate, wherein the second elevating plate is a second hollow structure comprising a second inner side, and wherein a fifth chip of the chips is located on the second inner side.

15. The wireless headset of claim 1, wherein the earbud portion comprises a receiver coupled to the first flexible board portion, wherein the ear handle portion is comprises a battery coupled to the second flexible board portion, and wherein the chips comprise:
a micro control unit chip;
a power management chip electrically coupled to the micro control unit chip and further electrically coupled to the battery using the second flexible board portion and the rigid board portion; and
an audio chip electrically coupled to the micro control unit chip and further electrically coupled to the receiver using the first flexible board portion and the rigid board portion.

16. The wireless headset of claim 1, wherein the rigid-flexible circuit board further comprises:
at least one flexible dielectric layer; and
at least two first conductive layers, wherein the at least one flexible dielectric layer and the at least two first conductive layers are stacked and form the first flexible board portion, an intermediate layer of the rigid board portion, and the second flexible board portion, wherein the intermediate layer comprises a first side and a second side, and wherein one flexible dielectric layer is disposed between two adjacent first conductive layers;
at least two rigid dielectric layers, wherein a first portion of the at least two rigid dielectric layers are located on the first side, and wherein a second portion of the at least two rigid dielectric layers are located on the second side; and
at least two second conductive layers, wherein the at least two rigid dielectric layers and the at least two second conductive layers are stacked, wherein a third portion of the at least two second conductive layers are located on the first side, wherein a fourth portion of the at least two second conductive layers is located on the second side, wherein a first rigid dielectric layer of the at least two rigid dielectric layers is disposed between two adjacent second conductive layers on a same side of the intermediate layer, and wherein a second rigid dielectric layer of the at least two rigid dielectric layers is disposed between a second conductive layer adjacent to the intermediate layer and the intermediate layer.

17. A wireless headset comprising:
an ear handle portion;
an earbud portion coupled to the ear handle portion; and
a main control comprising:
a first substrate located in the earbud portion;
a second substrate located in the earbud portion, wherein the first substrate and the second substrate are stacked at a space from each other;
a rigid-flexible circuit board comprising:
a rigid board portion fastened between the first substrate and the second substrate, wherein the rigid board portion is a hollow structure comprising an inner side;
a first flexible board portion located in the earbud portion and comprising a first end coupled to the rigid board portion; and
a second flexible board portion comprising:
a second end coupled to the rigid board portion; and
a third end configured to extend to the ear handle portion;
a first support member located between the first substrate and the rigid board portion and configured to abut against each of the first substrate and the rigid board portion, wherein the first support member comprises a plurality of first elevating pillars located between the rigid board portion and the first substrate and fastened to the rigid board portion; and
a first package layer located between the rigid board portion and the first substrate, wherein the first package layer is configured to package the first elevating pillars; and
a plurality of chips comprising:
a first chip fastened to the first substrate and electrically coupled to the rigid board portion, wherein the first chip is packaged in the first package layer;
a second chip fastened to the second substrate and electrically coupled to the rigid board portion; and
a third chip located on the inner side.

18. The wireless headset of claim 17, wherein the earbud portion comprises a receiver coupled to the first flexible board portion, wherein the ear handle portion comprises a battery coupled to the second flexible board portion, and wherein the chips further comprise:
a micro control unit chip;
a power management chip electrically coupled to the micro control unit chip and further electrically coupled to the battery using the second flexible board portion and the rigid board portion; and
an audio chip electrically coupled to the micro control unit chip and further electrically coupled to the receiver using the first flexible board portion and the rigid board portion.

19. A main control applied to an electronic device, wherein the main control comprises:
a rigid-flexible circuit board comprising:
a rigid board portion;
a first flexible board portion comprising a first end coupled to the rigid board portion; and
a second flexible board portion comprising a second end coupled to the rigid board portion;
a first substrate, wherein the first substrate and the rigid board portion are stacked at a space from each other;
a first support member located between the first substrate and the rigid board portion and configured to abut against each of the first substrate and the rigid board portion, wherein the first support member comprises a plurality of first elevating pillars located between the rigid board portion and the first substrate and fastened to the rigid board portion;

a first package layer located between the rigid board portion and the first substrate, wherein the first package layer is configured to package the first elevating pillars; and a plurality of chips comprising:
- a first chip fastened to the rigid board portion and packaged in the first package layer; and
- a second chip fastened to the first substrate and electrically coupled to the rigid board portion using the first support member.

20. The main control of claim 19, wherein the rigid board portion comprises a first surface facing the first substrate, wherein the first surface comprises a first package region and a first non-package region located around the first package region, and wherein the first package layer is located in the first package region.

* * * * *